United States Patent
Choi et al.

(10) Patent No.: US 10,405,446 B2
(45) Date of Patent: Sep. 3, 2019

(54) ELECTRONIC DEVICE INCLUDING WATERPROOF STRUCTURE

(71) Applicant: Samsung Electronics Co., Ltd., Suwon-si, Gyeonggi-do (KR)

(72) Inventors: Jong-Min Choi, Seongnam-si (KR); Woong-Chan Kim, Suwon-si (KR); Daehyeong Park, Seongnam-si (KR); Sung-Gun Cho, Hwaseong-si (KR); Sung-Joo Cho, Bucheon-si (KR); Young-Sik Choi, Hwaseong-si (KR); Kwang-Hwan Kim, Suwon-si (KR); Soonwoong Yang, Suwon-si (KR); Min-Sung Lee, Suwon-si (KR); Seungjoon Lee, Seoul (KR); Yuchul Chang, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 15/966,728

(22) Filed: Apr. 30, 2018

(65) Prior Publication Data

US 2018/0249588 A1  Aug. 30, 2018

Related U.S. Application Data

(63) Continuation of application No. 15/833,572, filed on Dec. 6, 2017, now Pat. No. 9,992,893, which is a (Continued)

(30) Foreign Application Priority Data

Dec. 23, 2015 (KR) .................... 10-2015-0184750
Jul. 18, 2016 (KR) .................... 10-2016-0090761

(51) Int. Cl.
*H05K 5/06* (2006.01)
*H04M 1/18* (2006.01)
(Continued)

(52) U.S. Cl.
CPC ............ *H05K 5/069* (2013.01); *G06F 1/1637* (2013.01); *G06F 1/1656* (2013.01); *H04M 1/18* (2013.01);
(Continued)

(58) Field of Classification Search
CPC ........ H05K 5/069; H05K 5/0217; H05K 5/03; H05K 5/0017
(Continued)

(56) References Cited

U.S. PATENT DOCUMENTS

| 2006/0160585 A1 | 7/2006 | Miyagawa et al. |
| 2008/0081679 A1* | 4/2008 | Kawasaki ............ H04B 1/3888 |
| | | 455/575.8 |

(Continued)

FOREIGN PATENT DOCUMENTS

| CN | 2919207 Y | 7/2007 |
| CN | 101155202 A | 4/2008 |

(Continued)

OTHER PUBLICATIONS

Extended European Search Report dated Sep. 28, 2018, issued in European Application No. 18182244.6.
(Continued)

*Primary Examiner* — Sherman Ng
(74) *Attorney, Agent, or Firm* — Jefferson IP Law, LLP

(57) ABSTRACT

An electronic device including a waterproof structure is provided. The electronic device includes a housing that includes a first face, a second face that faces in a direction substantially opposite to the first face, and a side surface that at least partially encloses a space between the first face and the second face, a middle plate arranged between the first face and the second face inside the housing to be substantially parallel to the first face, extending from the side surface, and including at least one opening, a printed circuit
(Continued)

board arranged between the middle plate and the second face, a display arranged between the middle plate and the first face, and including a face directed toward the second face, and a seal member configured to hermetically seal the at least one opening of the middle plate, and arranged between the face of the display and the middle plate.

20 Claims, 64 Drawing Sheets

Related U.S. Application Data continuation of application No. 15/273,072, filed on Sep. 22, 2016, now Pat. No. 9,872,408.

(60) Provisional application No. 62/236,504, filed on Oct. 2, 2015.

(51) Int. Cl.
| | |
|---|---|
| *H05K 5/00* | (2006.01) |
| *H05K 5/02* | (2006.01) |
| *H05K 5/03* | (2006.01) |
| *G06F 1/16* | (2006.01) |
| *H04M 1/02* | (2006.01) |

(52) U.S. Cl.
CPC ......... *H05K 5/0017* (2013.01); *H05K 5/0217* (2013.01); *H05K 5/03* (2013.01); *H04M 1/0266* (2013.01)

(58) Field of Classification Search
USPC .......................................... 361/752
See application file for complete search history.

(56) References Cited

U.S. PATENT DOCUMENTS

| | | | |
|---|---|---|---|
| 2009/0054115 | A1 | 2/2009 | Horrdin et al. |
| 2009/0291709 | A1 | 11/2009 | Lee et al. |
| 2011/0051330 | A1* | 3/2011 | Lee .................. H04M 1/0235 361/679.01 |
| 2011/0209890 | A1* | 9/2011 | Yamaguchi ............ H05K 5/069 174/50.5 |
| 2012/0040723 | A1 | 2/2012 | Kurihara et al. |
| 2012/0058314 | A1 | 3/2012 | Mikami et al. |
| 2012/0081865 | A1 | 4/2012 | Chang |
| 2012/0113012 | A1 | 5/2012 | Cho et al. |
| 2013/0342970 | A1 | 12/2013 | Franklin et al. |
| 2014/0078679 | A1* | 3/2014 | Tsunoda .................. G06F 1/203 361/720 |
| 2014/0162557 | A1 | 6/2014 | Clayson |
| 2014/0210675 | A1 | 7/2014 | Hwang et al. |
| 2014/0345899 | A1* | 11/2014 | Takahashi ............ G06F 1/1656 174/50.51 |
| 2015/0109170 | A1 | 4/2015 | Kang et al. |
| 2015/0245513 | A1 | 8/2015 | Moon |
| 2015/0253819 | A1 | 9/2015 | Choi et al. |
| 2015/0282364 | A1* | 10/2015 | Moon .................... H04M 1/18 174/50.51 |

FOREIGN PATENT DOCUMENTS

| | | |
|---|---|---|
| CN | 102196701 A | 9/2011 |
| CN | 104582379 A | 4/2015 |
| JP | 2010-096316 A | 4/2010 |
| JP | 5218652 B2 | 6/2013 |
| JP | 2014-230171 A | 12/2014 |
| JP | 2015-011194 A | 1/2015 |
| KR | 10-2014-0016052 A | 2/2014 |
| KR | 10-1434578 B1 | 8/2014 |
| WO | 2009/098844 A1 | 8/2009 |

OTHER PUBLICATIONS

Chinese Office Action dated Jul. 23, 2018, issued in Chinese Application No. 201610852348.2.

* cited by examiner

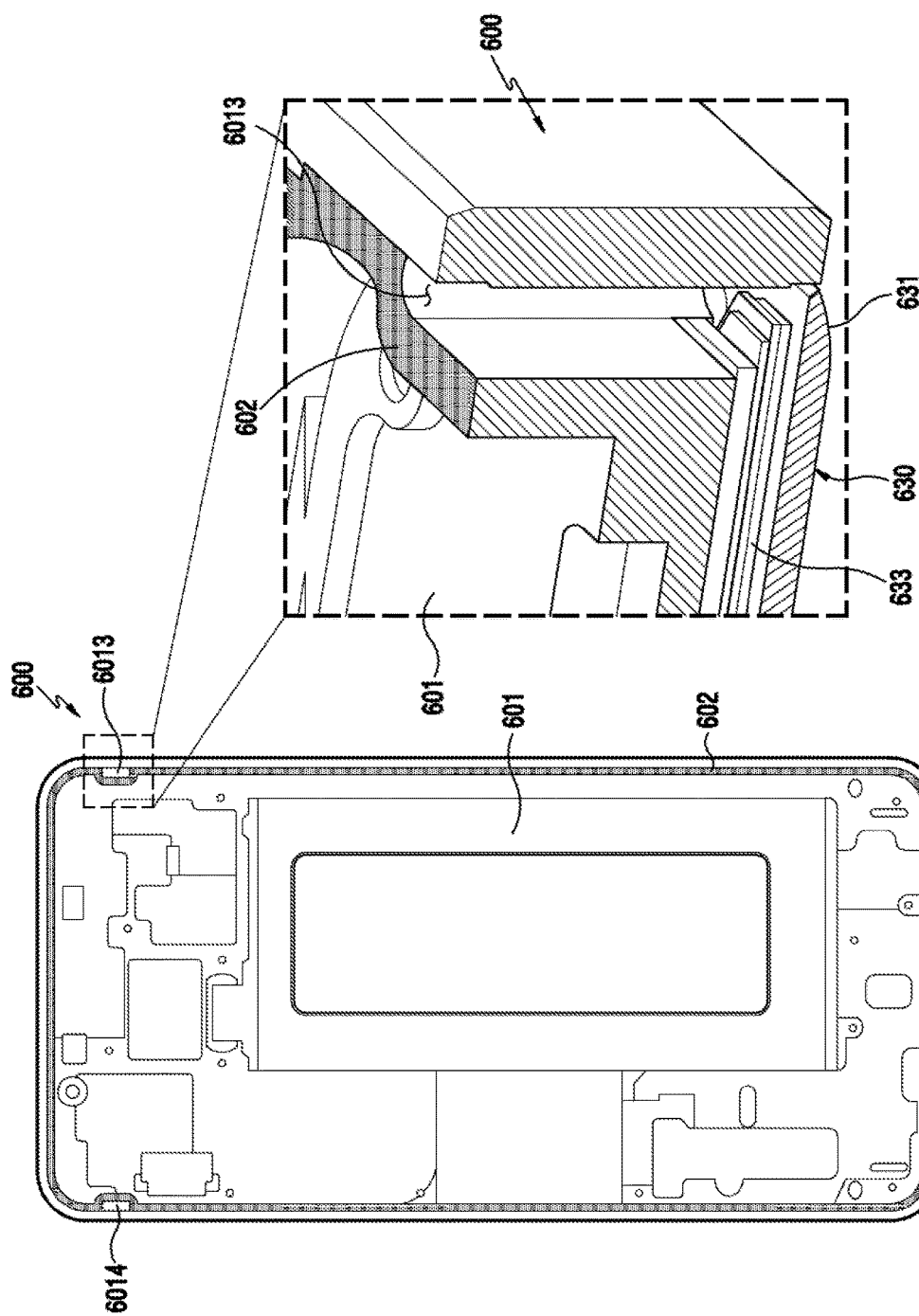

ELECTRONIC DEVICE INCLUDING WATERPROOF STRUCTURE

CROSS-REFERENCE TO RELATED APPLICATION(S)

This application is a continuation application of prior application Ser. No. 15/833,572, filed on Dec. 6, 2017, which is a continuation application of prior application Ser. No. 15/273,072, filed on Sep. 22, 2016, which is based on and claims priority under 35 U.S.C. § 119(e) of a U.S. Provisional application Ser. No. 62/236,504, filed on Oct. 2, 2015 in the U.S. Patent and Trademark Office, and under 35 U.S.C. § 119(a) of a Korean patent application number 10-2015-0184750, filed on Dec. 23, 2015 in the Korean Intellectual Property Office and a Korean patent application number 10-2016-0090761, filed on Jul. 18, 2016 in the Korean Intellectual Property Office, the disclosure of which is incorporated by reference herein in its entirety.

TECHNICAL FIELD

The present disclosure relates to an electronic device. More particularly, the present disclosure relates to an electronic device that includes a waterproof structure.

BACKGROUND

As functional differences have been considerably reduced among electronic devices of respective manufacturers, the electronic devices are being gradually slimmed in size, and are being developed to increase the rigidity of electronic devices and to strengthen the design aspects of the electronic devices, as well as to differentiate functional elements thereof.

According to an embodiment, among the differentiated functional elements, a waterproof function is very important, particularly for an electronic device that is miniaturized and universally carried by a user. According to an embodiment of the present disclosure, the electronic device may include a seal member disposed therein for a waterproof function. According to another embodiment of the present disclosure, the seal member is designed in consideration of an effective arrangement relationship with other components within the electronic device.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an electronic device.

In accordance with an aspect of the present disclosure, an electronic device is provided. The electronic device includes at least one seal member disposed therein for a waterproof function. According to an embodiment, the seal member may be interposed between at least two housings (e.g., a bracket, a housing, and a window), and when the corresponding housings are coupled to each other, the seal member may implement the waterproof function in a manner of sealing an inner space of the electronic device.

According to an embodiment, in a case where the housing is a display that includes a window and a display module disposed on the rear face of the window, the seal member may be arranged along the rim of the window other than the display module, and the seal member arranged along the rim of the window may be attached to the rim of another housing. When the seal member is arranged in this manner, it is necessary to separately provide a region in which the seal member is disposed in addition to a region in which the display module is disposed, which may enlarge a black matrix (BM) region (such as a bezel region) of the display, or may hinder the reduction of the BM region.

According to various embodiments, an electronic device including a waterproof structure may be provided.

According to various embodiments, an electronic device including a waterproof structure may be provided which may reduce or exclude a BM region of a display of the electronic device.

In accordance with another aspect of the present disclosure, an electronic device is provided. The electronic device includes a housing including a first face, a second face that faces in a direction substantially opposite to the first face, and a side surface that at least partially encloses a space between the first face and the second face, a middle plate arranged between the first face and the second face inside the housing to be substantially parallel to the first face, extending from the side surface, and including at least one opening, a printed circuit board arranged between the middle plate and the second face, a display arranged between the middle plate and the first face, and including a face directed toward the second face, and a seal member configured to hermetically seal the at least one opening of the middle plate, and arranged between the face of the display and the middle plate.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 6I is a view illustrating a configuration of a housing to which a waterproofing filling member is applied according to various embodiments of the present disclosure;

Throughout the drawings, like reference numerals will be understood to refer to like parts, components, and structures.

DETAILED DESCRIPTION

Figure 1:
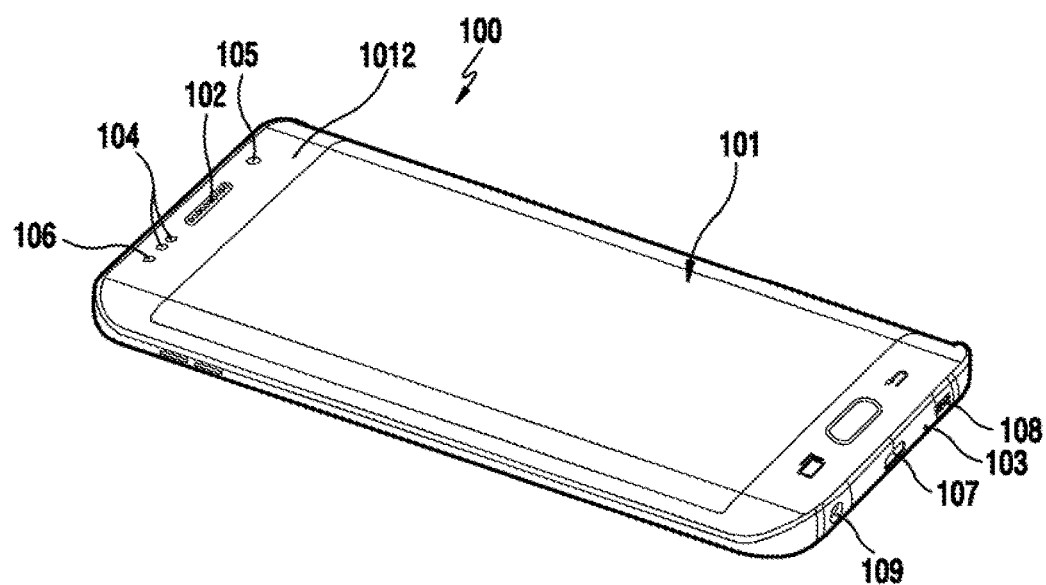
FIG. 1 is a perspective view illustrating a front side of an electronic device according to various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In the present disclosure, the expression "have", "may have", "include" or "may include" refers to existence of a corresponding feature (e.g., numerical value, function, operation, or components such as elements), and does not exclude existence of additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including all of at least one A and at least one B.

The expression "a first", "a second", "the first", or "the second" used in various embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

As used herein, the expression "configured to" may be interchangeably used with the expression "suitable for", "having the capability to", "designed to", "adapted to", "made to", or "capable of" The term "configured to" may not necessarily imply "specifically designed to" in hardware Alternatively, in some situations, the expression "device configured to" may mean that the device, together with other devices or components, "is able to" For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

Unless defined otherwise, all terms used herein, including technical and scientific terms, have the same meaning as those commonly understood by a person skilled in the art to which the present disclosure pertains Such terms as those defined in a generally used dictionary may be interpreted to have the meanings equal to the contextual meanings in the relevant field of art, and are not to be interpreted to have ideal or excessively formal meanings unless clearly defined in the present disclosure In some cases, even the term defined in the present disclosure should not be interpreted to exclude embodiments of the present disclosure.

An electronic device according to various embodiments of the present disclosure may include at least one of, for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a Moving Picture Experts Group phase 1 (MPEG-1) audio layer-3 (MP3) player, a mobile medical device, a camera, and a wearable device. According to various embodiments, the wearable device may include at least one of an accessory type (e.g., a watch, a ring, a bracelet, an anklet, a necklace, a glasses, a contact lens, or a head-mounted device (HMD)), a fabric or clothing integrated type (e.g., an electronic clothing), a body-mounted type (e.g., a skin pad, or tattoo), and a bio-implantable type (e.g., an implantable circuit).

According to some embodiments, the electronic device may be a home appliance. The home appliance may include at least one of, for example, a television (TV), a digital versatile disc (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to an embodiment, the electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.).

According to some embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device according to various embodiments of the present disclosure may be a combination of one or more of the aforementioned various devices. The electronic device according to some embodiments of the present disclosure may be a flexible device. Further, the electronic device according to an embodiment of the present disclosure is not limited to the aforementioned devices, and may include a new electronic device according to the development of technology.

Hereinafter, an electronic device according to various embodiments will be described with reference to the accompanying drawings. In the present disclosure, the term "user" may indicate a person using an electronic device or a device (e.g., an artificial intelligence electronic device) using an electronic device.

Figure 2:
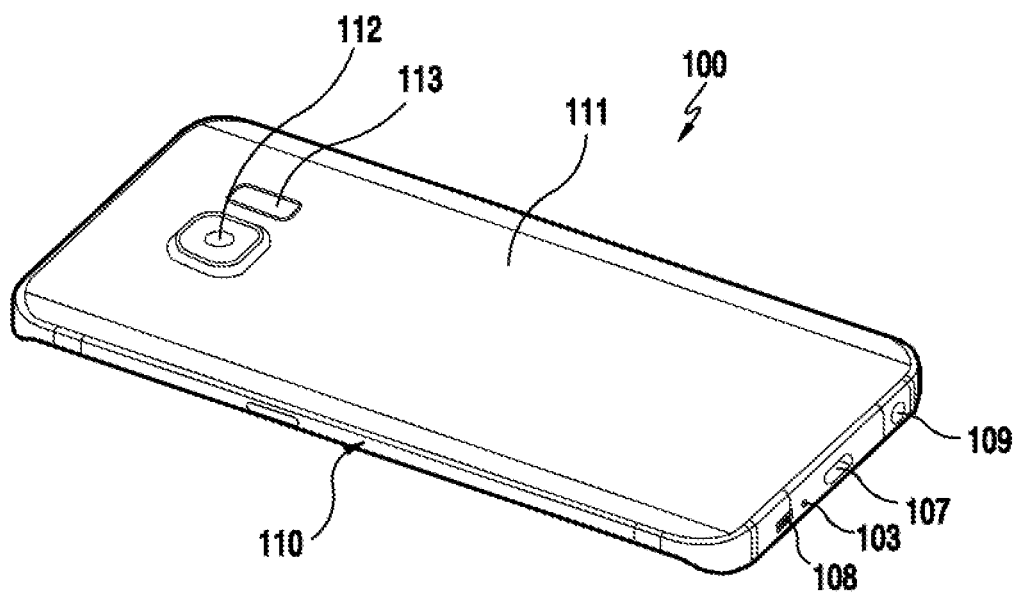
FIG. 2 is a perspective view illustrating a rear side of an electronic device according to various embodiments of the present disclosure.

FIG. 1 is a perspective view illustrating a front side of an electronic device according to various embodiments of the present disclosure. FIG. 2 is a perspective view illustrating a rear side of the electronic device according to various embodiments of the present disclosure.

Referring to FIGS. 1 and 2, a display 101 may be disposed on the front face of an electronic device 100. According to an embodiment, a receiver 102 may be disposed at one side of the display 101 so as to output the voice of a counterpart. According to an embodiment, a microphone device 103 may be disposed at the other side of the display 101 to transmit the voice of the user to the counterpart.

According to an embodiment, components for conducting various functions of the electronic device 100 may be arranged around the receiver 102. The components may include one or more sensor modules 104. The sensor module 104 may include at least one of, for example, an illuminance sensor (e.g., an optical sensor), a proximity sensor (e.g., an optical sensor), an infrared sensor, and an ultrasonic sensor. According to an embodiment, the components may include a front camera device 105. According to an embodiment, the components may include an indicator 106 (e.g., a light emitting diode (LED) device) configured to allow a user to recognize status information of the electronic device.

According to various embodiments, a speaker 108 may be disposed at one side of the microphone device 103. According to an embodiment, at the other side of the microphone device 103, an interface connector port 107 may be disposed in order to perform a transmission/reception function of an external device as well as to charge the electronic device 100 by receive external power. According to an embodiment, an ear jack hole 109 may be disposed at one side of the interface connector port 107.

According to various embodiments, the electronic device 100 may include a metallic member 110 as a housing. According to an embodiment, the metallic member 110 may be arranged along the rim of the electronic device 100, and may be disposed to expand to at least a partial region of the rear face of the electronic device 100 that extends from the rim. According to an embodiment, the metallic member 110 defines at least a portion of the thickness of the electronic device 100 along the rim of the electronic device 100, and may be formed in a closed loop shape. Without being limited thereto, however, the metallic member 110 may be formed to serve as at least a portion of the thickness of the electronic device 100. In addition, the metallic member 110 may be at least partially embedded in the inside of the electronic device 100.

According to various embodiments, a rear window 111 may be disposed on the rear face of the electronic device 100. According to an embodiment, a rear camera device 112 may be disposed on the rear window 111 of the electronic device 100, and one or more electronic components 113 may be disposed at one side of the rear camera device 112. According to an embodiment, the electronic components 113 may include at least one of, for example, an illuminance sensor (e.g., an optical sensor), a proximity sensor (e.g., an optical sensor), an infrared sensor, an ultrasonic sensor, a heart rate sensor, and a flash device.

According to various embodiments, the display 101 may include a window 1012 disposed to be exposed to the front face of the electronic device 100 and a display module (not illustrated) disposed inside the electronic device and behind the window 1012. According to an embodiment, an image displayed on the display module may be provided to the user through the window 1012 that is made of a transparent material. According to an embodiment, the window 1012 may be made using various materials, such as transparent glass and acryl.

According to various embodiments, the electronic device 100 may include a waterproof structure. According to an embodiment, the electronic device 100 may include at least one seal member (not illustrated) disposed therein for waterproofing. According to an embodiment, at least one seal member may be disposed between the display module and the housing in at least the display region of the display 101. According to an embodiment, since a seal arrangement space is excluded between the window and the housing by the arrangement structure of at least one seal member between the display module and the housing, a black mask (BM) region may be reduced in, or excluded from, the display region in the electronic device.

Hereinafter, a detailed structure for arranging at least one seal member in an electronic device will be described.

Figure 3:
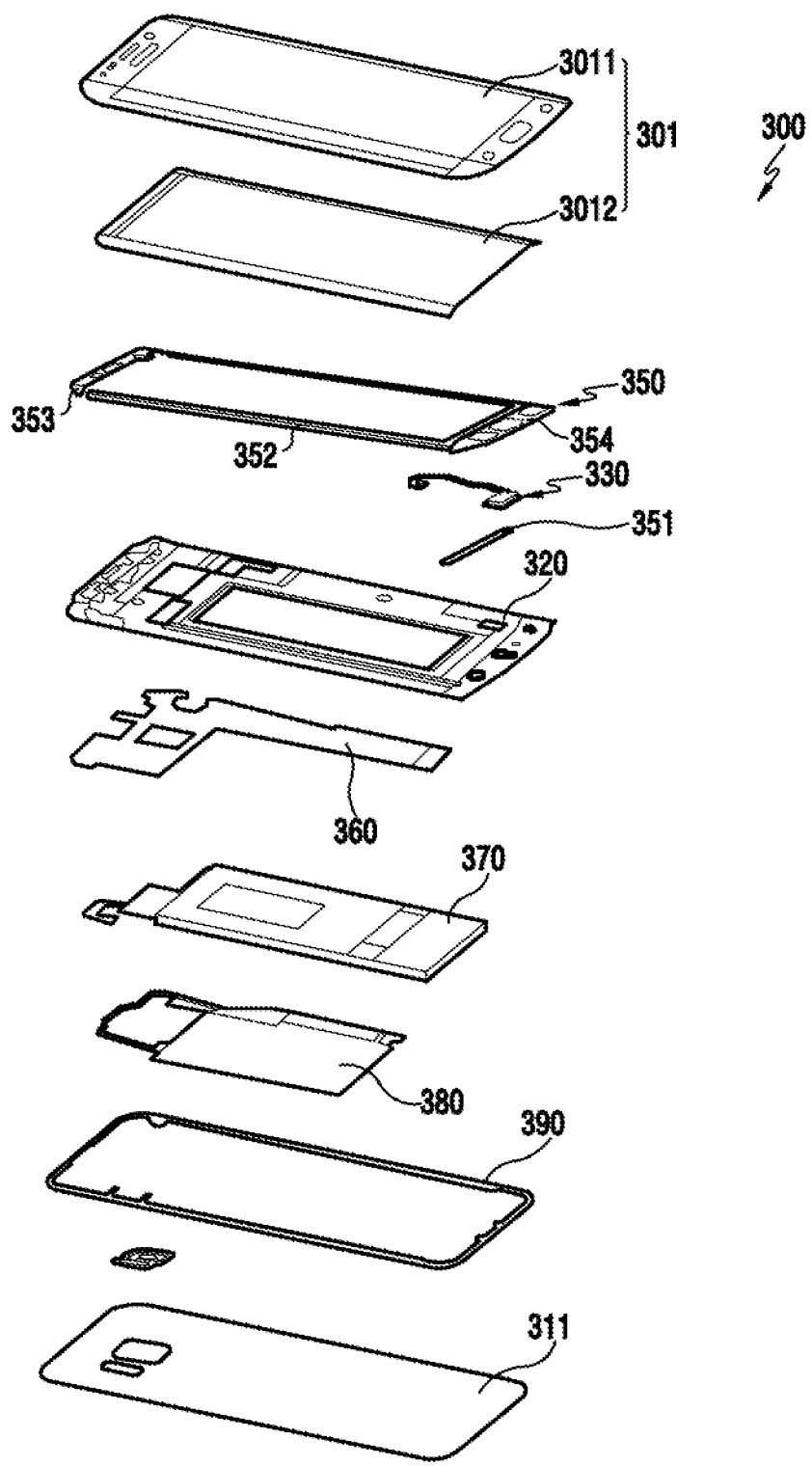
FIG. 3 is an exploded perspective view illustrating an electronic device according to various embodiments of the present disclosure.

FIG. 3 is an exploded perspective view illustrating an electronic device according to various embodiments of the present disclosure.

The electronic device 300 of FIG. 3 may be an embodiment of an electronic device that is similar to, or different from, the electronic device 100 of FIGS. 1 and 2.

Referring to FIG. 3, the electronic device 300 may include a key input device 330, at least one seal member 350, and a display 301 including a display module 301 and a window 3011, in which the key input device 330, the seal member 350, and the display 301 are arranged in this order at the upper side with reference to the housing 320. According to an embodiment, the electronic device 300 may include a printed circuit board (PCB) 360 (e.g., a PCB or a flexible PCB (FPCB)), a battery pack 370, a wireless power transmission/reception member 380, a rear seal member 390, and a rear window 311, which are disposed in this order at the lower side with reference to the housing 320. According to an embodiment, the battery pack 370 may be accommodated in an accommodation space formed in the housing 320 for the battery pack 370, avoiding the printed circuit board 360. According to an embodiment, the battery pack 370 and the printed circuit board 360 may be disposed in parallel to each other without overlapping with each other.

According to various embodiments, while the housing is used alone in an embodiment of the present disclosure, at least one middle plate, which is coupled to the housing, may be used together with the housing. According to an embodiment, the display 301 may be applied to the housing 320 after the display module 3012 is attached to the rear face of the window 3011. According to an embodiment, the display module 3012 may include a touch sensor. According to an embodiment, the display module may include a touch sensor and/or a pressure sensor. According to an embodiment, the seal member 350 may be disposed between the housing 320 and the display 401. According to an embodiment, the seal member 350 may include a plurality of seal members 351, 352, 353, and 354, and the plurality of seal members 351, 352, 353, and 354 may be formed in a shape that corresponds to the rims of the window 3011 and the housing 320. Accordingly, when the housing 320 and the display 301 are coupled to each other via the seal member 350, water infiltration into the inside of the electronic device may be prevented by the seal member 350.

According to various embodiments, in a display module arrangement position of the electronic device 300, the seal member 350 is attached between the rear face of the display module 3012 and the housing 320, and in the other regions, the seal member may be attached between the rear face of the window 3011 and the housing 320. According to an embodiment, because at least a portion of the seal member 350 is arranged on the rear face of the display module 3012, the BM region may be reduced in, or excluded from, the display arrangement region in the electronic device 300 by the arrangement of the seal member 350.

According to various embodiments, between the rear surface of the housing 320 and the rear window 311, a rear seal member 390 may be arranged along the rims of the housing 320 and the rear window 311. According to an embodiment, a single seal member having a closed loop shape may be used as the rear seal member 390. Without being limited thereto, however, at least two seal members may be arranged in a manner of being connected to each other. Accordingly, when the housing 320 and the display 311 are coupled to each other via the rear seal member 390, water infiltration into the inside of the electronic device may be prevented by the rear seal member 390. According to an embodiment, the rear window 311 may be formed of at least one of glass, plastic, composite resin, and metal.

According to various embodiments, the seal member 350 and the rear seal member 390 may include at least one of tape, adhesive, waterproof dispensing, silicon, waterproof rubber, and urethane.

FIGS. 4A, 4B, 4C, 4D, 4E, 4F, 4G, 4H, 4I, 4J, 4K, 4L, and 4M are views sequentially illustrating a process of arranging the seal member 350 that is arranged in the electronic device 300 of FIG. 3 according to various embodiments of the present disclosure.

Figure 4A:
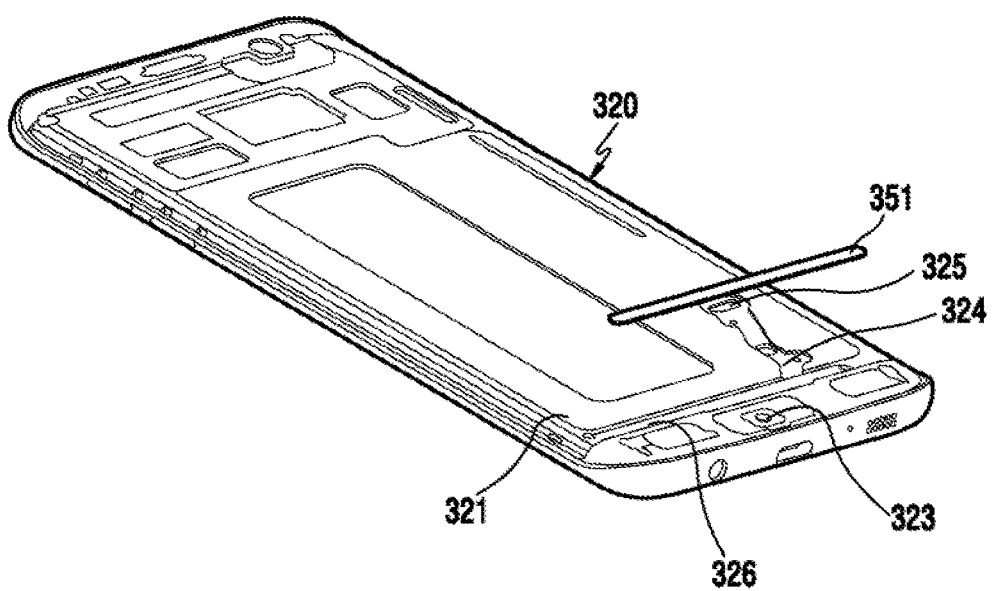
FIGS. 4A and 4B are views illustrating a state in which a first seal member is arranged in a housing of an electronic device according to various embodiments of the present disclosure.
Figure 4B:
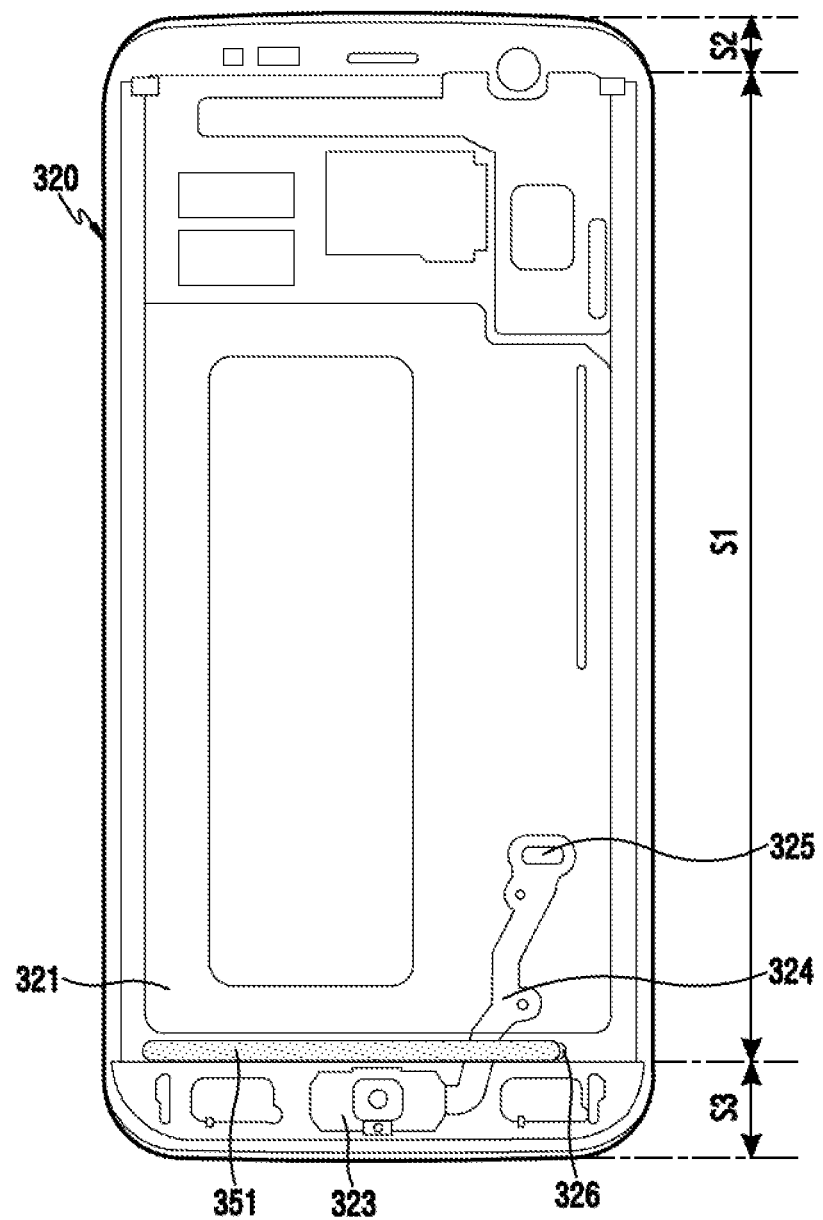

FIGS. 4A and 4B are views illustrating a state in which a first seal member 351 is arranged in the housing 320 of an electronic device according to various embodiments of the present disclosure.

Referring to FIGS. 4A and 4B, the housing 320 may include a first seal member receiving portion 326 formed on the front face 321 thereof. According to an embodiment, the first seal member receiving portion 326 may be formed in a widthwise direction along the lower rim of the display module arrangement region of the housing 320 (the region S1 in FIG. 4B).

According to various embodiments, the housing 320 may include a key input device mounting portion 323 that is provided in a region S3 (see FIG. 4B) other than the display module arrangement region of the housing 320 so as to arrange a key input device 330 (see FIG. 4C) (e.g., a home button) therein. According to an embodiment, the front face 321 of the housing 320 may include a printed circuit receiving portion 324 formed to guide a printed circuit (e.g., an FPCB) that is drawn out from the key input device. According to an embodiment, the printed circuit receiving portion 324 may include a through-hole 325 through which the printed circuit of the key input device is penetrated to be electrically connected to a print circuit board that is arranged to face the rear face of the housing 320.

According to various embodiments, the printed circuit receiving portion 324 may be arranged across the first seal member receiving portion 326. This is due to fact that the first seal member 351 is arranged in the display module arrangement region S1, and the key input device is arranged in the other region (the region S3). Accordingly, a waterproof structure may be required by the printed circuit of the key input device. According to an embodiment, the key input device may be arranged in the region S2 other than the display module arrangement region S1 of the housing.

According to various embodiments, the first seal member 351 may be fixed to the housing 320 in the manner of being received in the first seal member receiving portion 326 before the key input device is arranged. According to an embodiment, the first seal member 351 may include at least one of tape, adhesive, waterproof dispensing, silicon, waterproof rubber, and urethane.

Figure 4C:
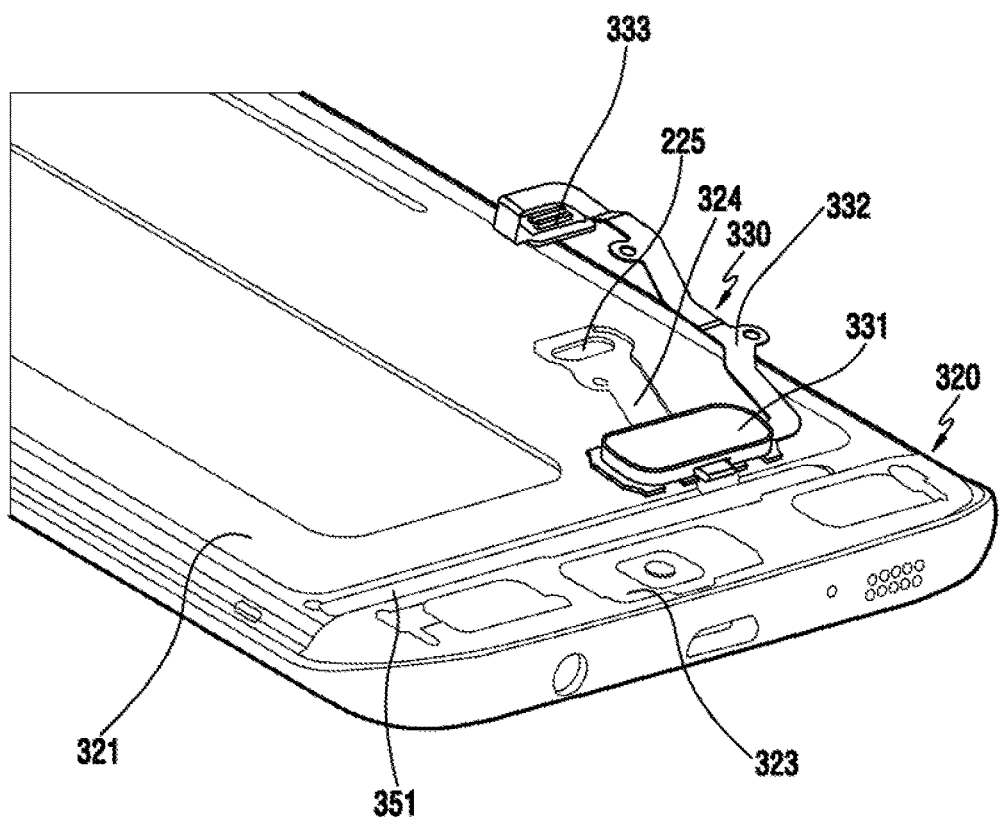
FIG. 4C is a view illustrating a state in which a key input device is arranged in a housing of an electronic device according to various embodiments of the present disclosure.

FIG. 4C is a view illustrating a state in which the key input device 330 is arranged in the housing 320 of an electronic device according to various embodiments of the present disclosure.

Referring to FIG. 4C, the key input device 330 may be arranged on the front face 321 of the housing 320 such that, in a state where the first seal member 351 is fixed in the first seal member receiving portion 326, at least a portion of the printed circuit 332 overlaps with the first seal member 351 in a manner of crossing with the upper side of the first seal member 351. According to an embodiment, the key button 331 of the key input device 330 is fixed in a manner of being received in the key input device receiving portion 323, and the printed circuit 332 drawn out from the key button 331 may be arranged in a manner of being guided by the printed circuit receiving portion 324 of the housing 320 and being penetrated into the inside housing through the through-hole 325. According to an embodiment, an end of the printed circuit 332 may include a connector 333 that is penetrated through the through-hole 325 and is then electrically connected to a print circuit board that is arranged on the rear face of the housing 320.

Figure 4D:
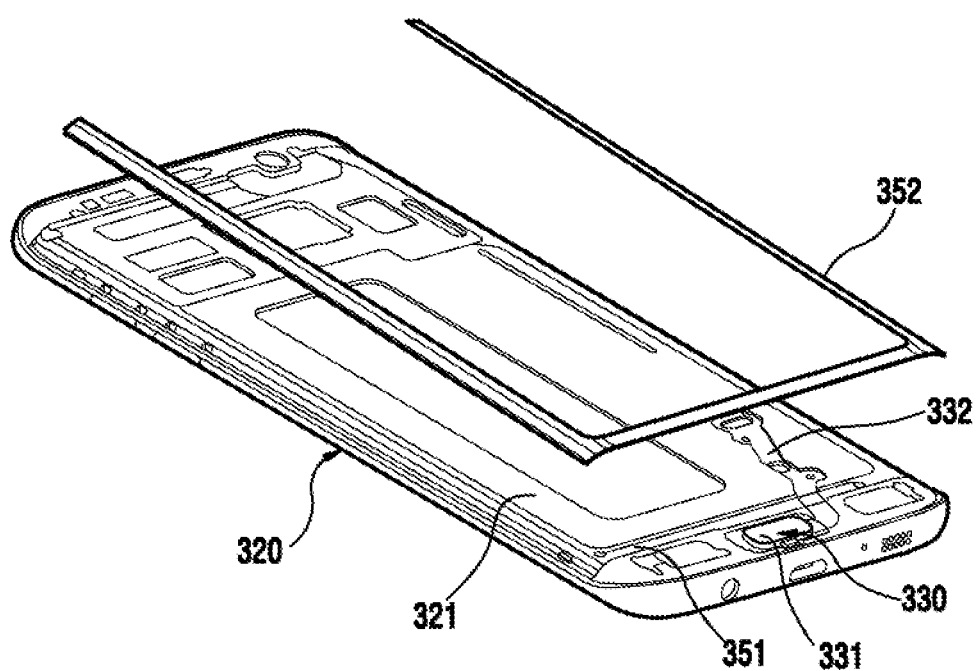
FIGS. 4D, 4E, and 4F are views illustrating a state in which a second seal member is disposed in a housing of an electronic device according to various embodiments of the present disclosure.
Figure 4E:
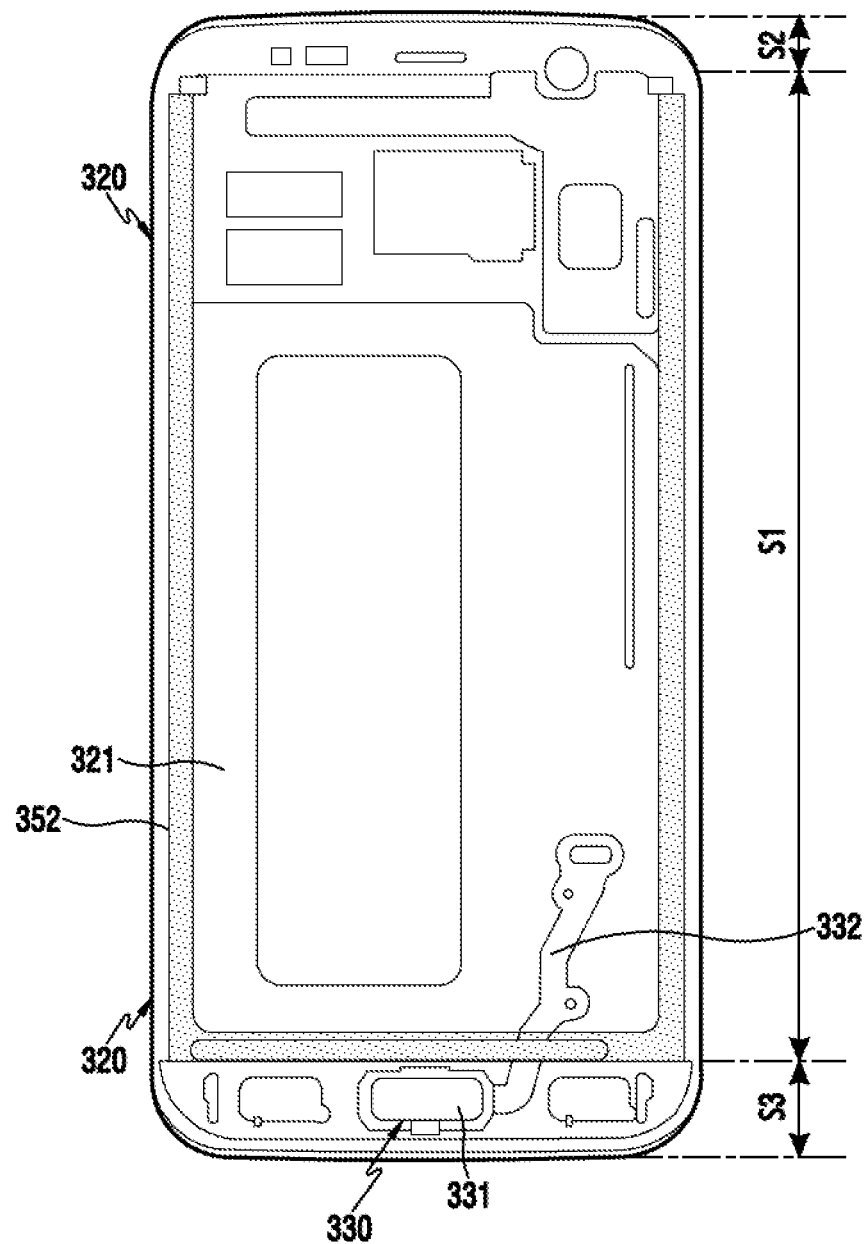
Figure 4F:
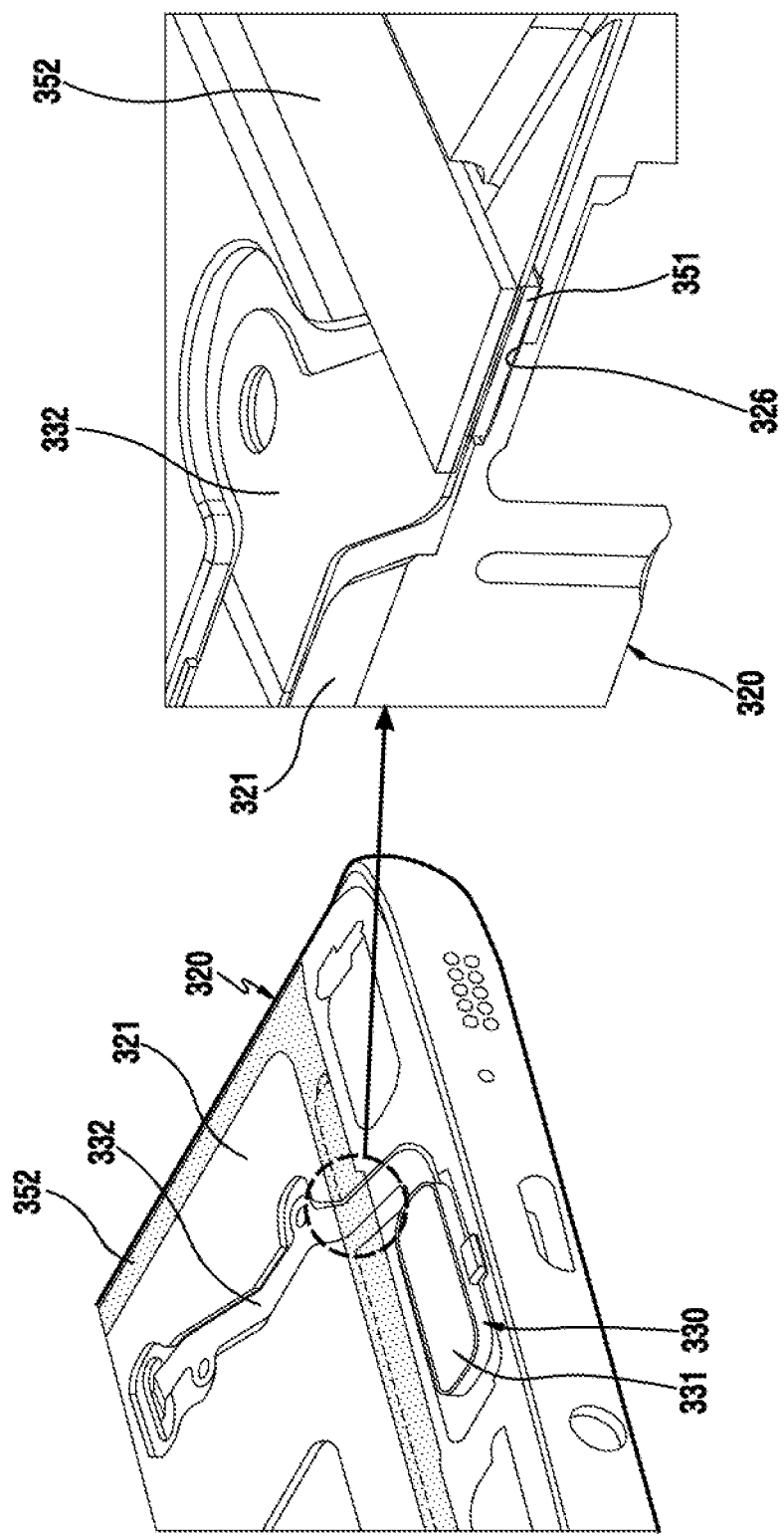

FIGS. 4D, 4E, and 4F are views illustrating a state in which a second seal member 352 is arranged in the housing 320 of an electronic device according to various embodiments of the present disclosure.

Referring to FIGS. 4D, 4E, and 4F, on the front face 321 of the housing 320, a second seal member 352 may be arranged in a state where the first seal member 351 and the key input device 330 are arranged in the housing 320. According to an embodiment, the second seal member receiving portion 352 may be formed along the rim of the display module arrangement region (the region S1 in FIG. 4E). According to an embodiment, the second seal member 352 may include a left rim region extending in the left rim region of the display module arrangement region, a lower rim region extending in the lower rim region of the display module arrangement region, and a right rim region extending in the right rim region of the display module arrangement region.

According to various embodiments, when the second seal member 352 is arranged in the housing 320, the printed circuit 332 of the key input device 330 may be arranged to be interposed between the first seal member 351 and the second seal member 352, and the portion of the printed circuit 332, which crosses the upper side of the first seal member 351 may be sealed by the first and second seal members 351 and 352, which have elasticity. According to an embodiment, the second seal member 352 may include at least one of tape, adhesive, waterproof dispensing, silicon, waterproof rubber, and urethane.

According to various embodiments, in order to seal a gap generated in a boundary region between the first seal member 351 and the second seal member 352, an additional filling member introduction hole may be further arranged in the corresponding region.

Figure 4G:
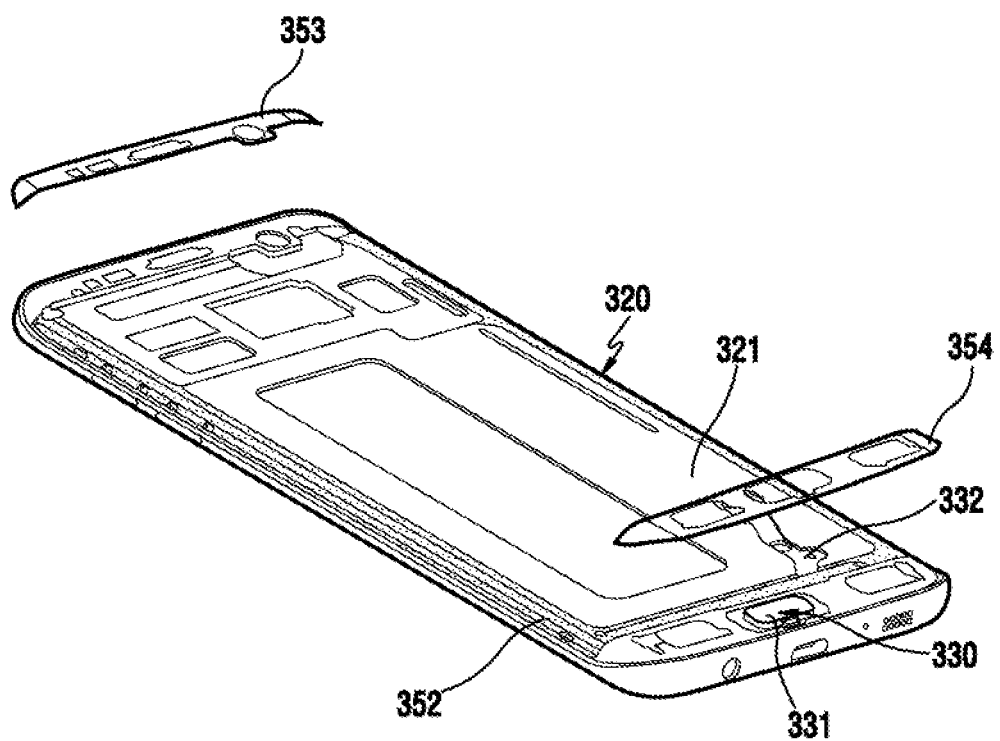
FIGS. 4G and 4H are views illustrating a state in which third and fourth seal members are disposed in a housing of an electronic device according to various embodiments of the present disclosure.
Figure 4H:
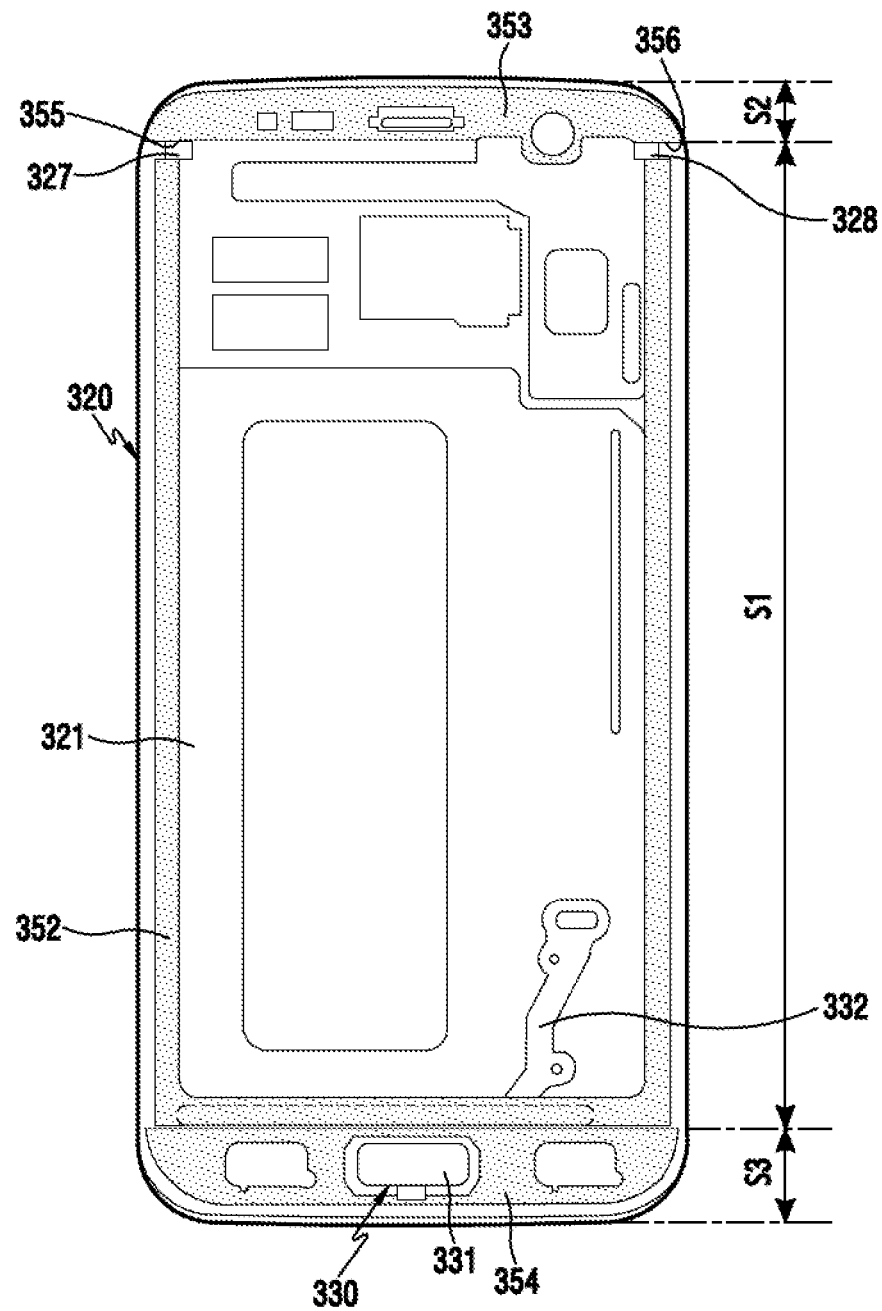
Figure 4I:
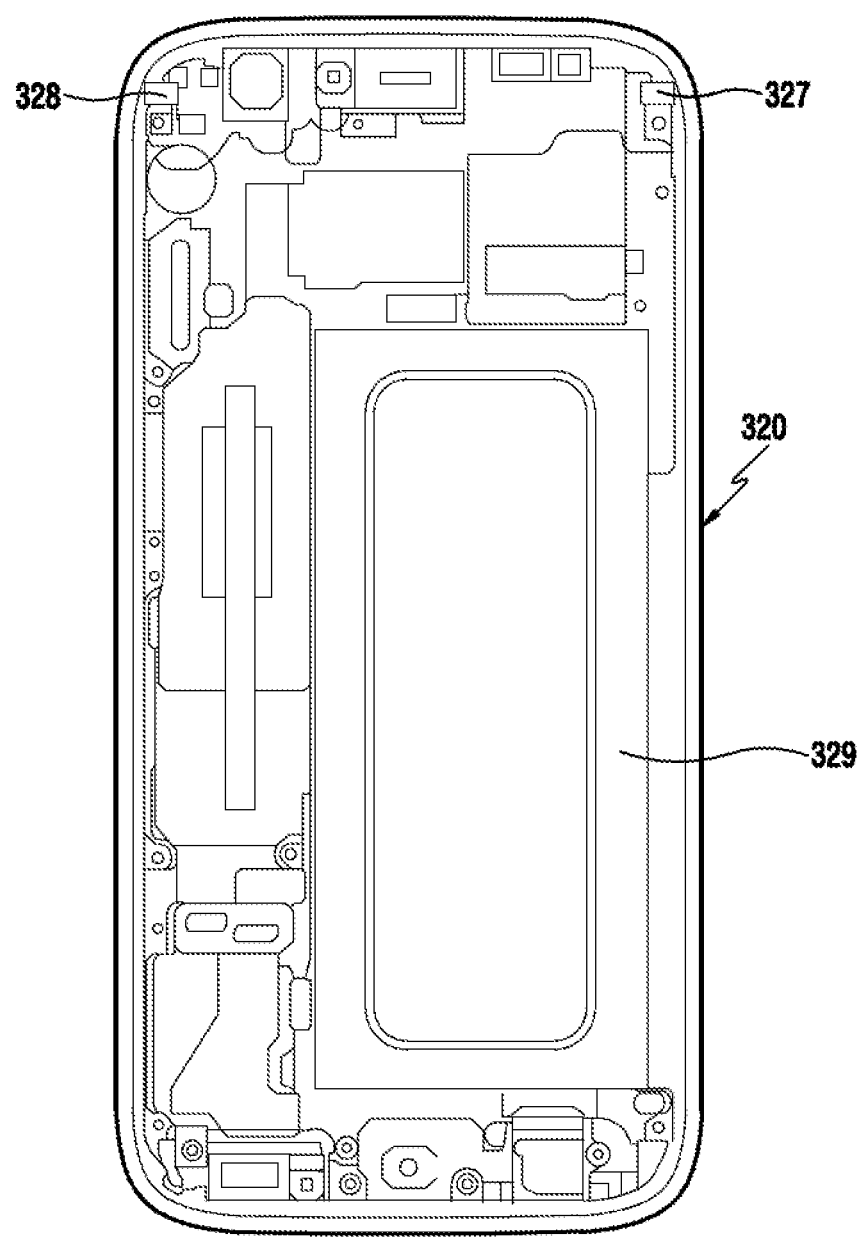
FIG. 4I is a view illustrating a housing of an electronic device that is provided with a filling member introduction hole for introducing a waterproofing filling member according to various embodiments of the present disclosure.

FIGS. 4G and 4H are views illustrating a state in which a third seal member 353 and a fourth seal member 354 are arranged in the housing 320 of an electronic device according to various embodiments of the present disclosure. FIG. 4I is a view illustrating the housing 320 of an electronic device that is provided with third and fourth filling member introduction holes 327 and 328 for introducing a waterproofing filling member according to various embodiments of the present disclosure.

Referring to FIGS. 4G, 4H, and 4I, on the front face 321 of the housing 320, the third seal member 353 and the fourth seal member 354 may be arranged in a state where the first seal member 351, the key input device 330, and the second seal member 352 are arranged. According to an embodiment, the third seal member 353 may be arranged in the upper region (the region S2 shown in FIG. 4H) of the display module arrangement region (the region S1) of the housing 320. According to an embodiment, the fourth seal member 354 may be arranged in the lower region (the region S3 shown in FIG. 4H) of the display module arrangement region (the region S1) of the housing 320. According to an embodiment, because the upper region of the second seal member 352 is arranged in an opened state, it is necessary to maintain the left and right upper ends of the second seal member 352 in the sealed state with the third seal member 353. However, gaps 355 and 356 (e.g., stepped portions) may be generated by stepped portions between the display module arrangement region (the region S1) and the region (the region S2) above the display module arrangement region, and the gaps 355 and 356 may be sealed by adding a waterproofing filling member to be described later. According to an embodiment, filling member introduction holes 327 and 328 are formed at the regions corresponding to the gaps 355 and 356, respectively, to introduce a waterproofing filling member through the rear face 329 of the housing 320. In an embodiment of the present disclosure, the filling member introduction holes 327 and 328 are formed in order to seal the gaps 355 and 356 generated in the boundary portion between the second seal member 352 and the third seal member 353. However, an additional filling member introduction hole may be further arranged in the corresponding region in order to seal a gap generated in a boundary region between the second seal member 352 and the fourth seal member 354. According to various embodiments, an additional filling member introduction hole may be further arranged in order to seal a gap between constituent products, such as a fixing member and an FPCB that are related to the key input device 330, and the second seal member 352 or the fourth seal member 354.

According to various embodiments, the third seal member 353 and the fourth seal member 354 may include at least one of tape, adhesive, waterproof dispensing, silicon, waterproof rubber, and urethane.

Figure 4J:
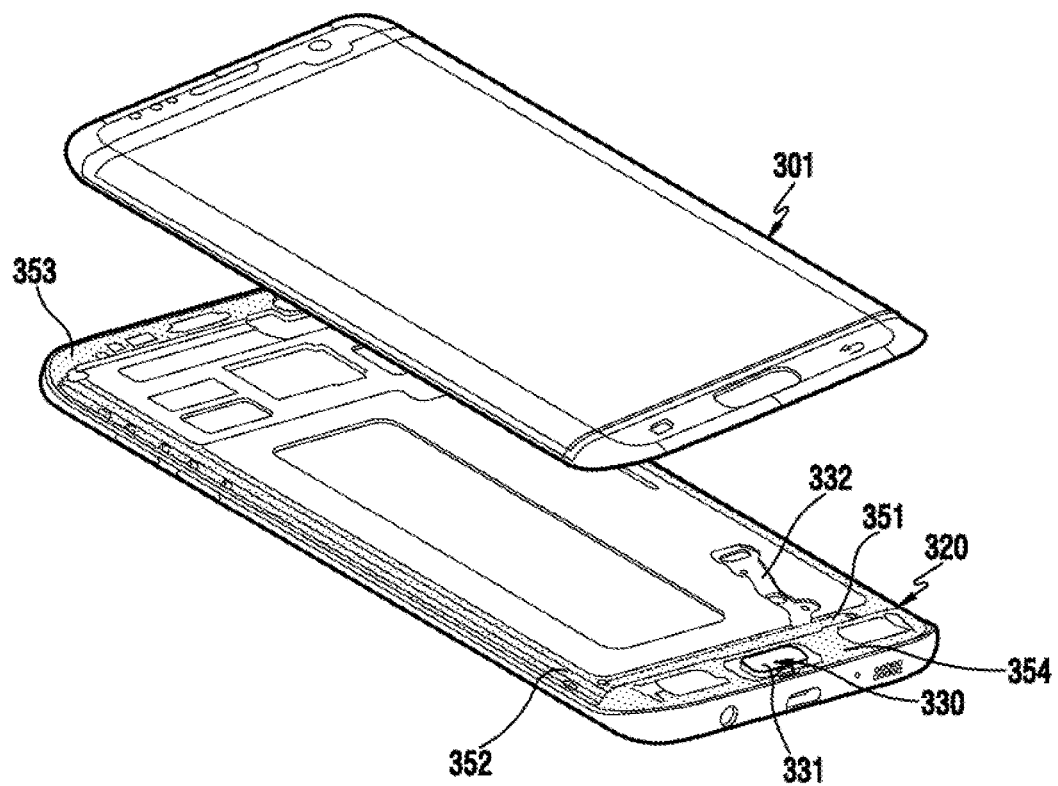
FIGS. 4J and 4K are views illustrating a state in which a display is disposed in the housing in which the first to fourth seal members are arranged according to various embodiments of the present disclosure.
Figure 4K:
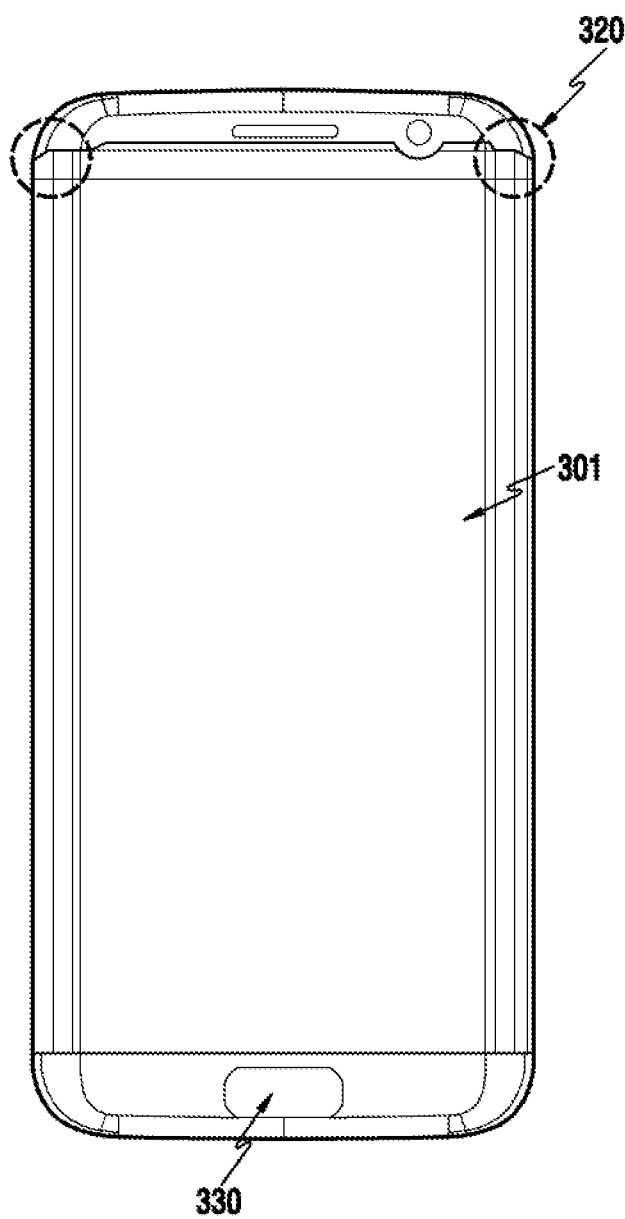

FIGS. 4J to 4K are views illustrating a state in which a display 301 is disposed in the housing 320 in which the first to fourth seal members 351 to 354 are arranged according to various embodiments of the present disclosure.

Referring to FIGS. 4J and 4K, in the state where the first seal member 351, the key input device 330, the second seal member 352, the third seal member 353, and the fourth seal member 354 are arranged on the front face 321 of the housing 320, the display 301 may be arranged thereabove. According to an embodiment, the display module 3012 of the display 301 may be sealed in such a manner in which the rear face of the display module 3012 is in contact with the second seal member 352, an upper region other than the display module arrangement region may be sealed in such a manner in which the rear face of the window is in contact with the third seal member 353, and a lower region other than the display module arrangement region may be sealed in such a manner in which the rear face of the window is in contact with the fourth seal member 354.

According to various embodiments of the present disclosure, the region indicated by a dotted line in FIG. 4K is a boundary portion between the second seal member 352 and the third seal member 353 where a gap is generated and may be sealed by an additional waterproofing filling member. Although not illustrated, the gap generated in a boundary portion between the second seal member 352 and the fourth seal member 354 may also be sealed by an additional waterproofing filling member.

Figure 4L:
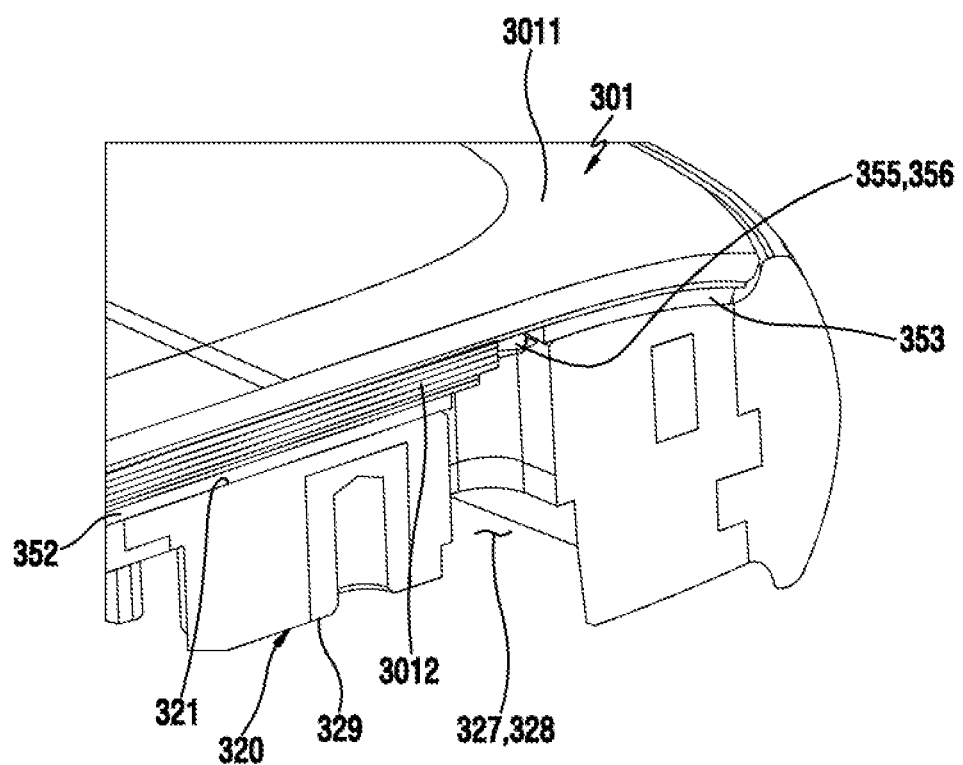
FIGS. 4L and 4M are views illustrating a state in which a waterproofing filling member is applied to a filling member introduction hole according to various embodiments of the present disclosure.
Figure 4M:
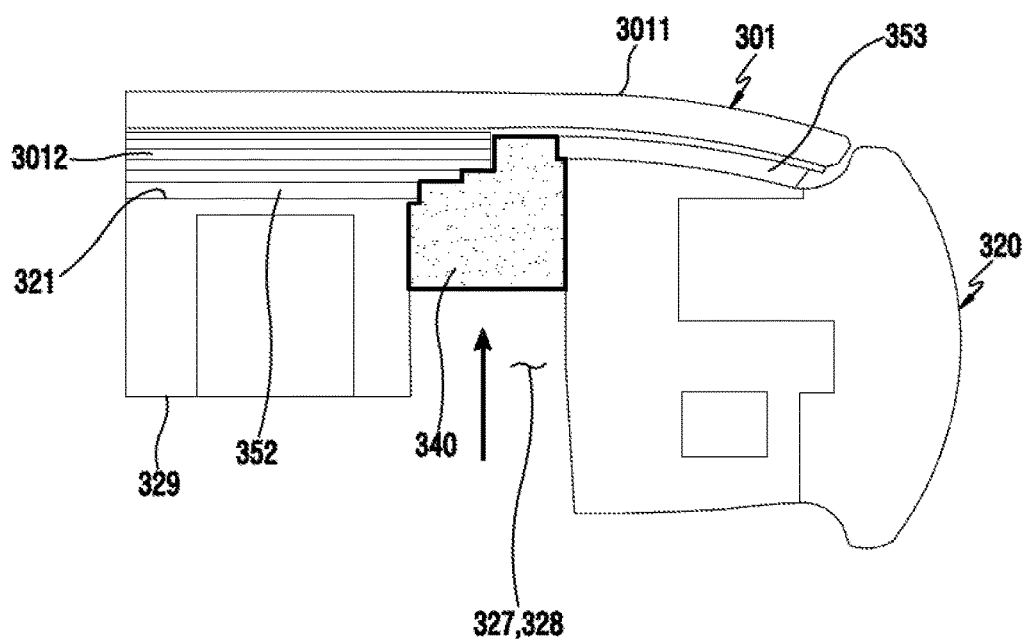

FIGS. 4L and 4M are views illustrating a state in which a waterproofing filling member is applied to a filling member introduction hole according to various embodiments of the present disclosure.

Referring to FIGS. 3, 4L and 4M, the display 301 coupled to the housing 320 may include a window 3011 and a display module 3012 attached to the rear face of the window 3011 and having a predetermined thickness. Accordingly, due to different heights, gaps 355 and 356 (e.g., stepped portions) may be formed between the regions (the regions S2 and S3) (e.g., the BM region) with which the window 3011 of the housing 320 is in contact and the display module arrangement region (the region S1) in which the display module 3012 of the housing 320 is arranged. For example, the BM regions (the regions S2 and S3) may be formed to be higher than the display module arrangement region (the region S1). According to an embodiment, the second seal member 352 and the third seal member 353 are arranged to be spaced apart from each other in the gap 355 and 356 regions where the second seal member 352 and the third seal member 353 meet, and thus it is necessary to seal the second seal member 352 and the third seal member 353.

According to various embodiments of the present disclosure, in the state where the first seal member 351, the key input device 330, the second seal member 352, the third seal member 353, and the fourth seal member 354 are arranged on the front face 321 of the housing 320, and the display 301 is arranged thereabove, a waterproofing filling member 340 may be introduced through the filling member introduction holes 327 and 328 of the rear face 329 of the housing. According to an embodiment, when the introduction of the waterproofing filling member 340 is completed, the filling member introduction holes 327 and 328 may be subjected to a finishing processing by a separate cover or the like.

According to various embodiments of the present disclosure, the waterproofing filling member 340 may include a semisolid material or a liquid material, and may be solidified by a natural or external condition (e.g., heat, ultraviolet ray, or pressure). Accordingly, in the electronic device, it is possible to provide a space sealed by a closed curve loop having no discontinuous section in order to implement a complete waterproof function by applying a plurality of seal members 351, 352, 353, and 354 and the waterproofing filling member 340 between the display 301 and the housing 320.

Figure 4N:
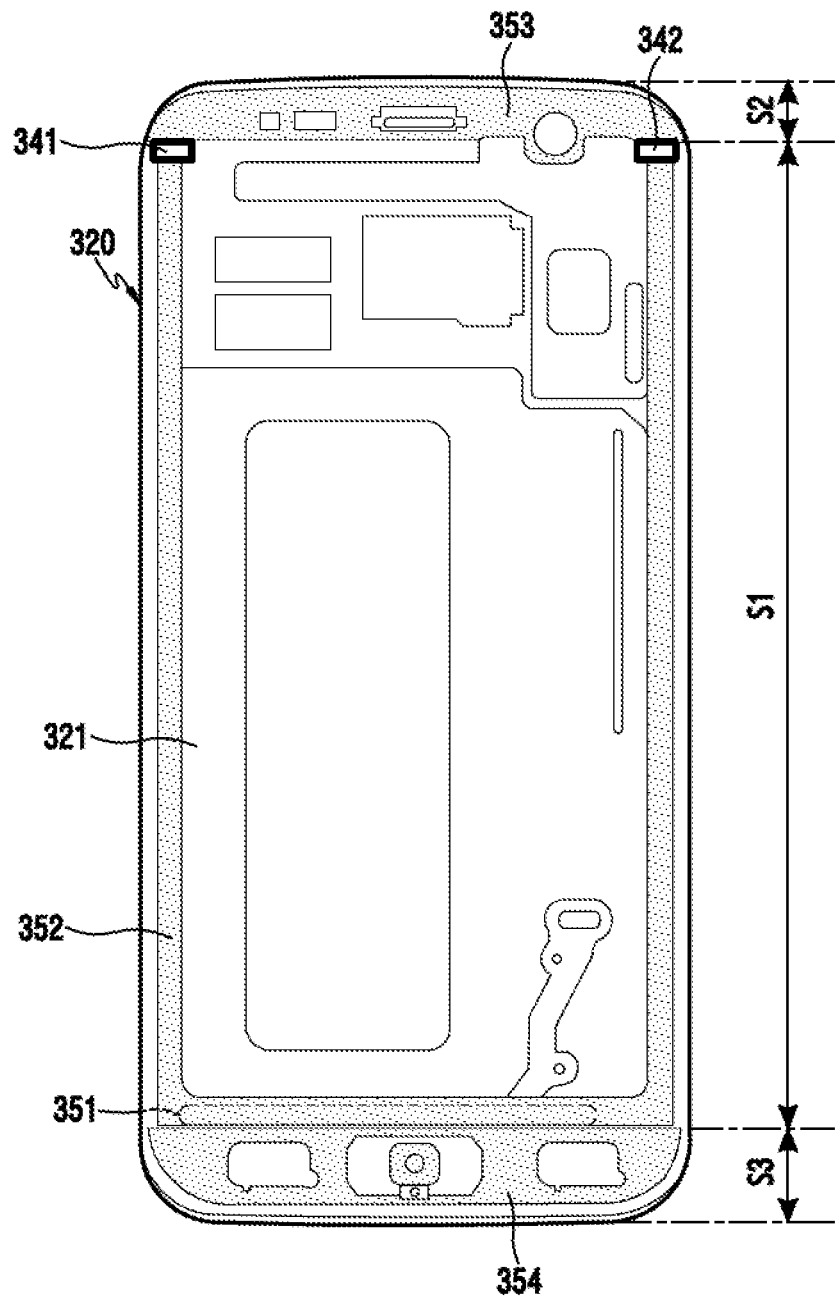
FIG. 4N is a view illustrating a state in which a waterproofing filling member is applied to a housing before a display is applied according to various embodiments of the present disclosure.

FIG. 4N is a view illustrating a state in which a waterproofing filling member is applied to a housing before a display is applied according to various embodiments of the present disclosure.

In a preceding embodiment, a configuration has been described in which the display 301 is attached to the housing 320 via a plurality of seal members 351, 352, 353, and 354, and then the waterproofing filling member 340 is applied to the gaps 355 and 356 between the display module arrangement region S1 of the housing 320 and the BM regions S2 and S3 of the window.

According to various embodiments, the display 301 may be attached to the housing 320 via the plurality of seal members 351, 352, 353, and 354 after the waterproofing filling member 341 is applied to the regions 341 and 342 corresponding to the gaps 355 and 356 of the housing 320 before the display 301 is applied to the housing 320.

Figure 5A:
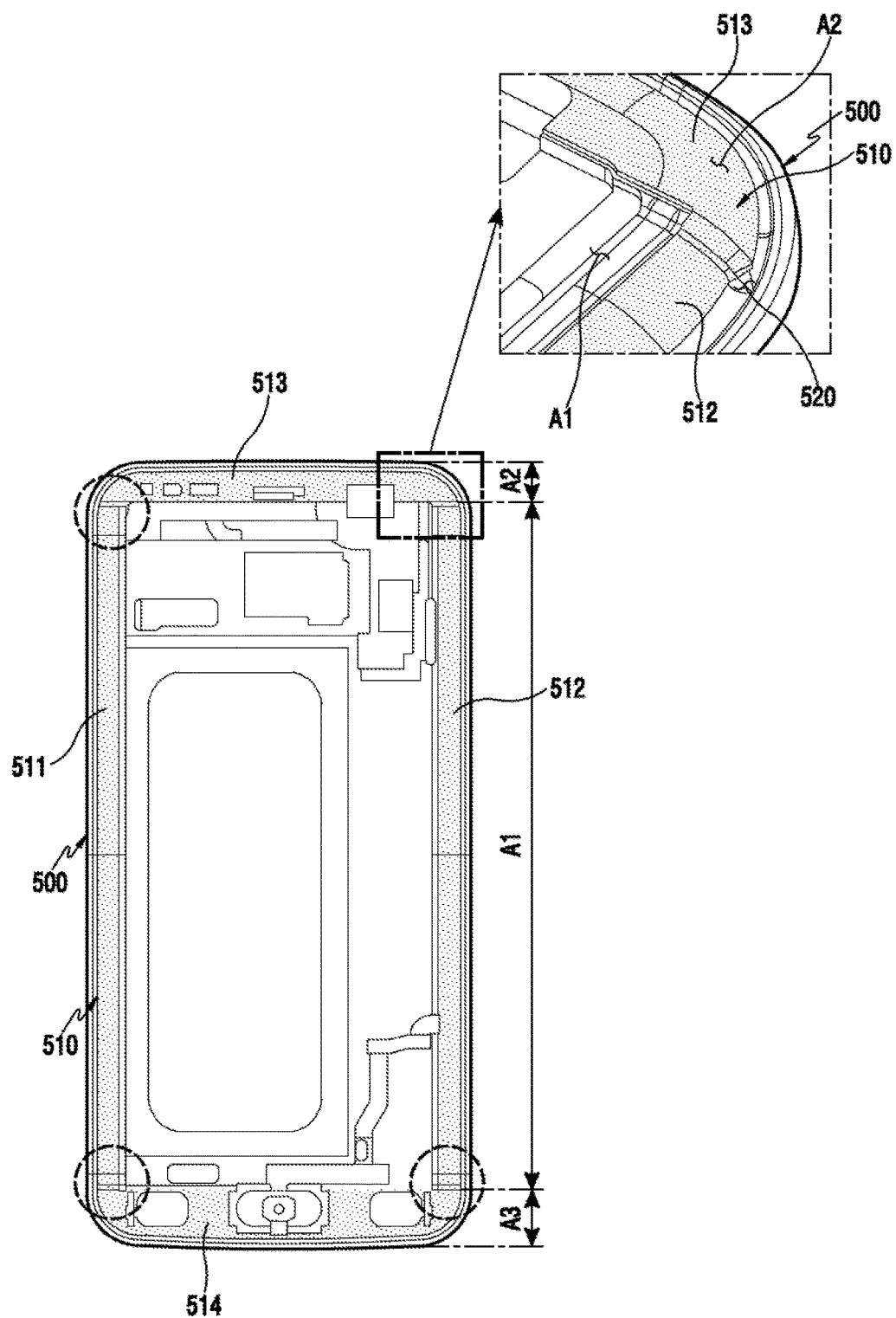
FIG. 5A is a view illustrating a state in which a seal member is arranged in a housing according to various embodiments of the present disclosure.

FIG. 5A is a view illustrating a state in which a seal member is disposed in a housing according to various embodiments of the present disclosure.

A housing 500 shown in FIG. 5A may be an embodiment of a housing that is similar to, or different from, the housing 320 of FIG. 4C or a combination in which the housing 320 of FIG. 4C and a middle plate are combined with each other.

Referring to FIG. 5A, the housing 500 may include a display module arrangement region (region A1) and BM regions (regions A2 and A3) formed in the upper and lower ends of the display module arrangement region. According to an embodiment, a seal member 510 may be disposed along the rim of the housing 500. According to an embodiment, the seal member 510 may be formed in a single body to have a closed loop shape. According to an embodiment, the seal member 510 may include at least one of tape, adhesive, waterproof dispensing, silicon, waterproof rubber, and urethane. According to an embodiment, the seal member 510 may form a sealing space for waterproof because it comes in close contact with the rim of a display that includes a window.

According to various embodiments of the present disclosure, the seal member 510 may include a first seal member 511 arranged on the left rim of the housing 500 and a second seal member 512 arranged on the right rim of the housing 500. According to an embodiment, the first and second seal members 511 and 512 may contribute to sealing the display arrangement region (the region A1) of the housing 500. According to an embodiment, the seal member 510 may include a third seal member 513 arranged on the upper rim of the housing 500 and a fourth seal member 514 arranged on the lower rim of the housing 500. According to an embodiment, the third and fourth seal members 513 and 514 may contribute to sealing the BM regions A2 and A3 of the housing 500. According to an embodiment, the first to fourth seal members 511, 512, 513, and 514 may be formed in a single body.

According to various embodiments of the present disclosure, the display 530 (see FIG. 5B) coupled to the housing 500 may include a window 531 (see FIG. 5B) and a display module 532 (see FIG. 5B) attached to the rear face of the window 3011 and having a predetermined thickness. Accordingly, due to different heights, a stepped portion 520 may be formed between the BM regions (the regions A2 and A3) with which the window 531 of the housing 500 is in contact and the display module arrangement region (the region A1) in which the display module 532 of the housing 500 is arranged. For example, the BM regions (the regions A2 and A3) may be formed to be higher than the display module arrangement region (the region A1). According to an embodiment, the seal member 510 may come in close contact with, and may be closely attached to, a face of the housing 500 to correspond to the stepped portion 520. According to an embodiment, the stepped portion 520 may be formed in the boundary region between the first to fourth seal members 511, 512, 513, and 514 of the illustrated housing 500 (the portions indicated by dotted lines at four corners of the illustrated housing).

Figure 5B:
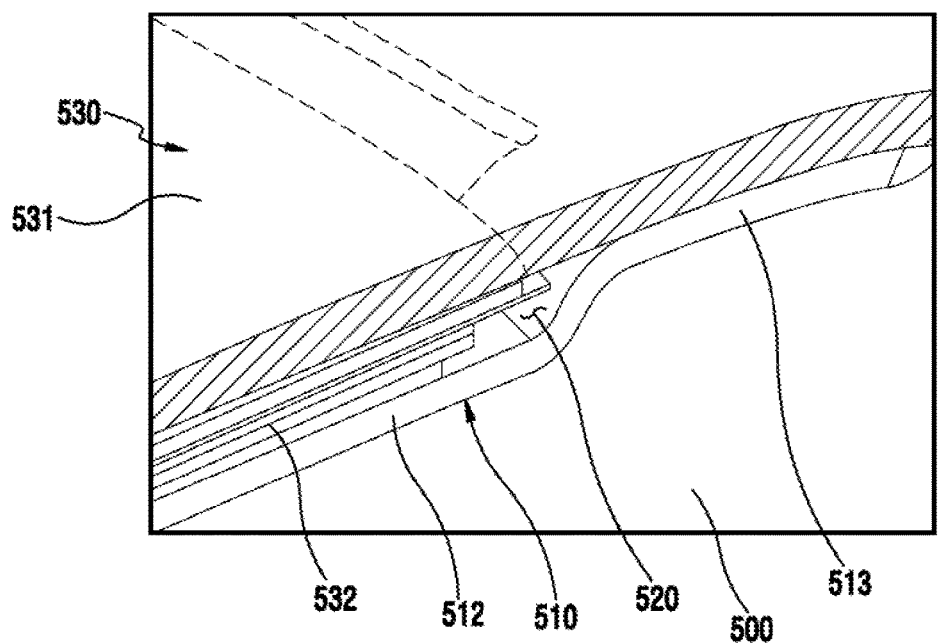
FIG. 5B is a view illustrating a state in which a display is arranged on an upper portion of a housing in which a seal member is arranged according to various embodiments of the present disclosure.
Figure 5C:
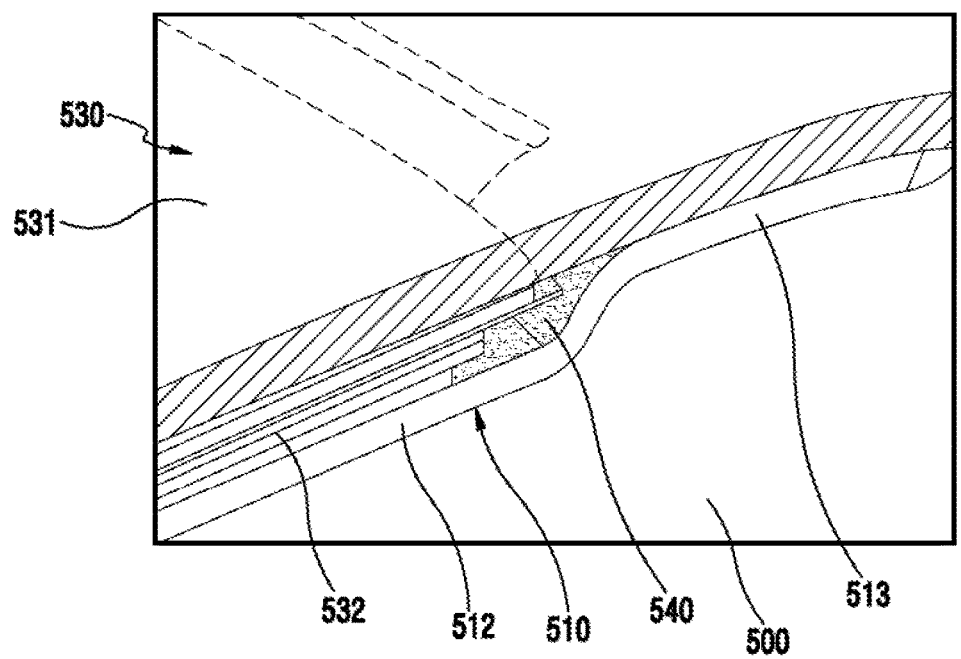
FIG. 5C is a view illustrating a state in which a waterproofing filling member is applied between a seal member and a display according to various embodiments of the present disclosure.

FIG. 5B is a view illustrating a state in which a display is arranged on an upper portion of a housing in which a seal member is arranged according to various embodiments of the present disclosure. FIG. 5C is a view illustrating a state in which a waterproofing filling member is applied between a seal member and a display according to various embodiments of the present disclosure.

Referring to FIGS. 5B and 5C, the display 530 may be stacked on the housing 500 where the seal member 510 is attached. According to an embodiment, the display 530 may include a window 531 made of a transparent material and a display module 532 arranged on the rear face of the window 531. According to an embodiment, in the case where the display 530 is arranged on the top face of the housing 500, the display module 532 of the display 530 may be positioned in the display module arrangement region (the region A1 in FIG. 5A) of the housing 500, and the window 531 may be arranged in the BM regions (the regions A2 and A3 in FIG. 5A) of the housing 500. According to an embodiment, in the display arrangement region (the region A1 in FIG. 5A), the display 530 may be fixed in a manner in which the rear face of the display module 532 is attached to a seal member 510 (e.g., the first and second seal members 511 and 512 in FIG. 5A), and in the BM regions (the regions A2 and A3 in FIG. 5A), the display may be fixed in a manner in which the corresponding rear face of the window 531 is attached to a seal member 510 (e.g., the third and fourth seal members 513 and 514 in FIG. 5A).

According to various embodiments, when the display 530 is attached to the housing 500 via the seal member 510 in the above-mentioned manner, a stepped portion 520 may generate a gap by the thickness of the display module 532, and water may flow into the stepped portion, which may consequently cause water infiltration into the electronic device. Accordingly, according to an embodiment, a separate waterproofing filling member 540 may be applied to such a stepped portion 520. According to an embodiment, the waterproofing filling member 540 may include a semisolid material or a liquid material, and may be solidified by a natural or external condition (e.g., heat, ultraviolet ray, or pressure). Accordingly, in the electronic device, it is possible to provide a space sealed by a closed curve loop having no discontinuous section in order to implement a complete waterproof function by applying the seal member 510 and the waterproofing filling member 540 between the display 630 and the housing 500.

Figure 6A:
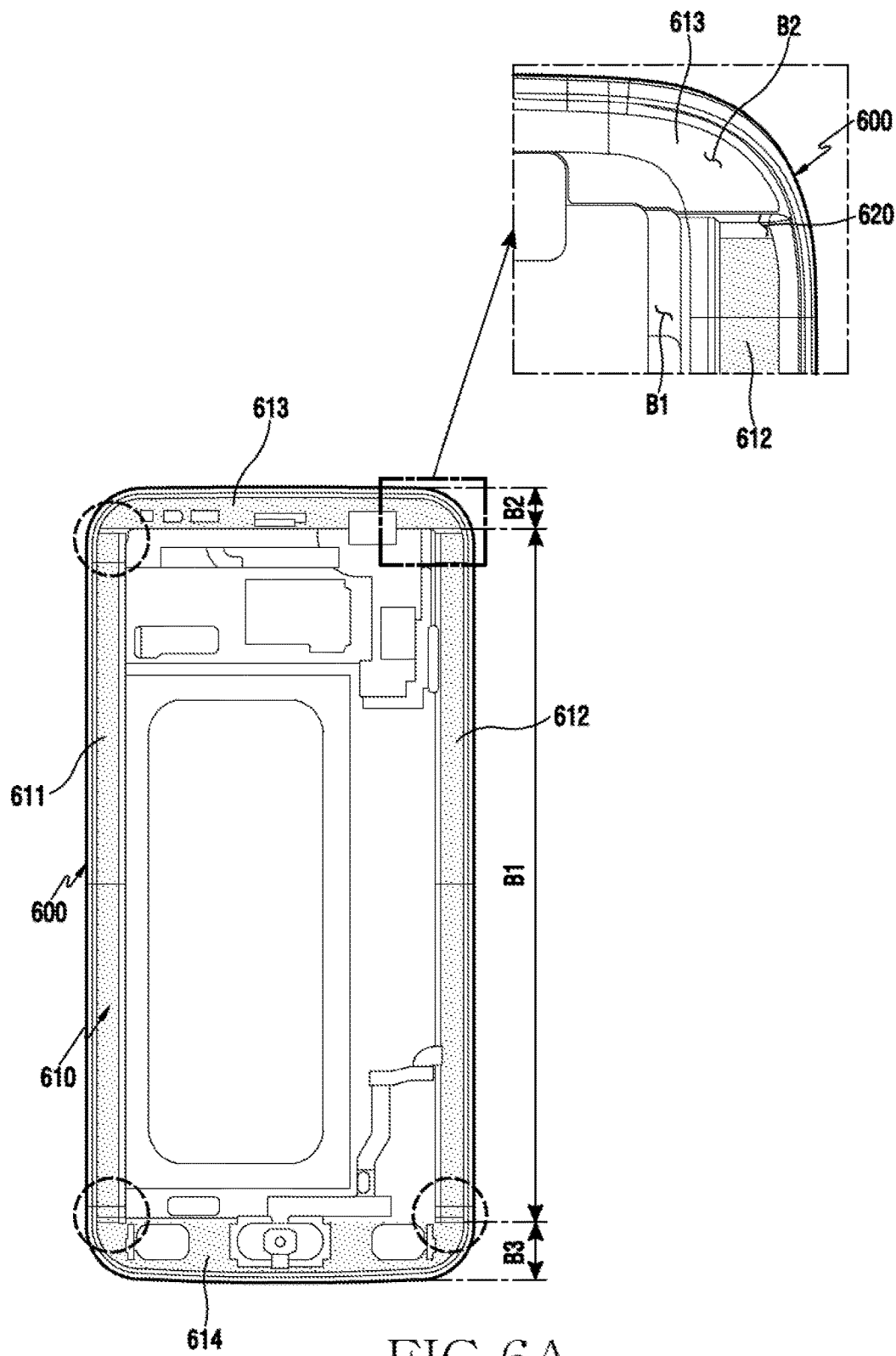
FIG. 6A is a view illustrating a state in which a seal member is arranged in a housing according to various embodiments of the present disclosure.
Figure 6B:
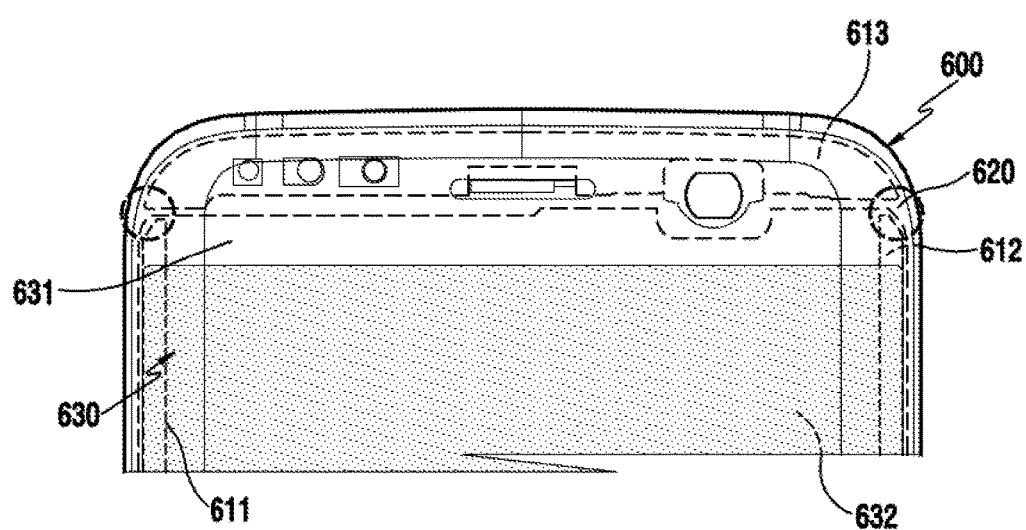
FIGS. 6B and 6C are views illustrating a state in which a display is arranged on an upper portion of a housing in which a seal member is arranged according to various embodiments of the present disclosure.
Figure 6C:
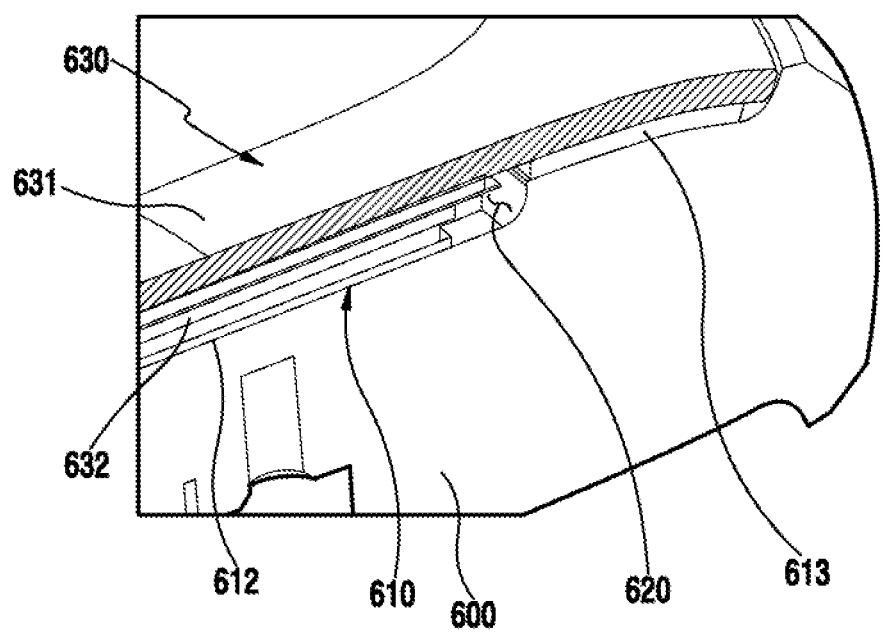

FIG. 6A is a view illustrating a state in which a seal member is arranged in a housing according to various embodiments of the present disclosure. FIGS. 6B and 6C are views illustrating a state in which a display is arranged on an upper portion of a housing in which a seal member is arranged according to various embodiments of the present disclosure.

A housing 600 shown in FIG. 6A may be similar to the housing 320 or FIG. 4C or an assembly in which the housing 320 shown FIG. 4C and a middle plate are assembled, or an embodiment of a housing similar to, or different from, the housing 500 shown FIG. 5A.

Referring to FIGS. 6A, 6B, and 6C, the housing 600 may include a display module arrangement region (region B1) and BM regions (regions B2 and B3) formed in the upper and lower ends of the display module arrangement region. According to an embodiment, a seal member 610 may be arranged along the rim of the housing 600. According to an embodiment, the seal member 610 may be arranged along the rim of the housing 600 to have a loop shape. According to an embodiment, the seal member 610 may include at least one of tape, adhesive, waterproof dispensing, silicon, waterproof rubber, and urethane. According to an embodiment, the seal member 610 may form a sealing space for waterproof because it comes in close contact with the rim of a display that includes a window.

According to various embodiments of the present disclosure, the seal member 610 may include a first seal member 611 arranged on the left rim of the housing 600 and a second seal member 612 arranged on the right rim of the housing 600. According to an embodiment, the first and second seal members 611 and 612 may contribute to sealing the display arrangement region (the region B1) of the housing 500. According to an embodiment, the seal member 610 may include a third seal member 613 arranged on the upper rim of the housing 600 and a fourth seal member 614 arranged on the lower rim of the housing 600. According to an embodiment, the third and fourth seal members 613 and 614 may contribute to sealing the BM regions B2 and B3 of the housing 600. According to an embodiment, the first to fourth seal members 611, 612, 613, and 614 may be individually formed.

According to various embodiments, the display 630 coupled to the housing 600 may include a window 631 and a display module 632 attached to the rear face of the window 631 and having a predetermined thickness. Accordingly, due to different heights, a stepped portion 620 may be formed between the BM regions (the regions B2 and B3) with which the window 631 of the housing 600 is in contact and the display module arrangement region (the region B1) in which the display module 632 of the housing 600 is arranged. For example, the BM regions (the regions B2 and B3) may be formed to be higher than the display module arrangement region (the region B1). According to an embodiment, it is possible to prevent the seal member 510 coming off in a corresponding region by the stepped portion 620 by arranging the seal member 610 to be spaced apart from the stepped portion 620 where the first to fourth seal members meet one another. According to an embodiment, the stepped portion 620 may be formed in the boundary region between the first to fourth seal members 611, 612, 613, and 614 of the illustrated housing 600 (the portions indicated by dotted lines at four corners of the illustrated housing).

Figure 6D:
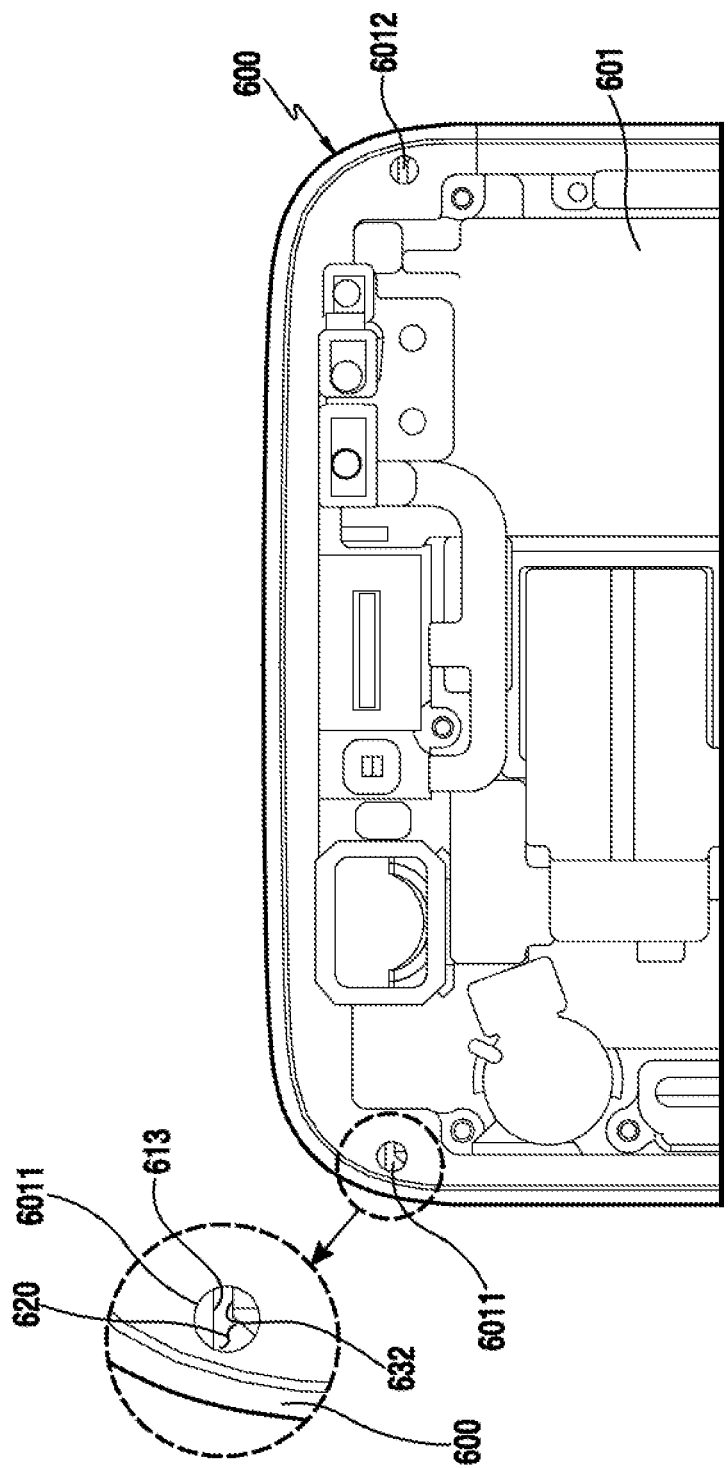
FIG. 6D is a view illustrating a portion of a housing having a filling member introduction hole for introducing a waterproofing filling member according to various embodiments of the present disclosure.

FIG. 6D is a view illustrating a portion of a housing having a filling member introduction hole for introducing a waterproofing filling member according to various embodiments of the present disclosure.

Referring to FIG. 6D, filling member introduction holes 6011 and 6012 may be formed from the rear face 601 of the housing 600 to the front face of the housing 600 in order to apply a waterproofing filling member 640. According to an embodiment, the filling member introduction holes 6011 and 6012 may be formed in a region corresponding to the above-mentioned stepped portion 620. According to an embodiment, the waterproofing filling member 640 may be introduced into the stepped portion 620 formed on the front face of the housing 600 through the filling member introduction holes 6011 and 6012 by using a separate tool. In such a case, the housing 600 and the display 630 may be in the state of being coupled to each other by the seal member 610, and in the coupled state, the waterproofing filling member 640 may be coated through the filling member introduction holes 6011 and 6012. According to an embodiment, when the introduction of the waterproofing filling member 640 is completed, the filling member introduction hole 6012 may be subjected to a finishing processing by a separate cover or the like.

Figure 6E:
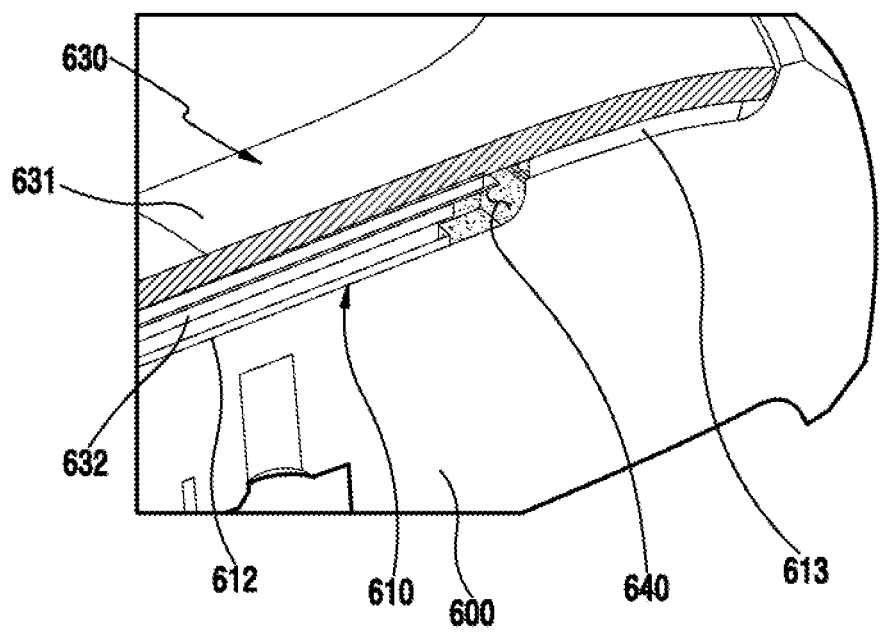
FIGS. 6E and 6F are views illustrating a state in which a waterproofing filling member is applied between a housing and a display according to various embodiments of the present disclosure.
Figure 6F:
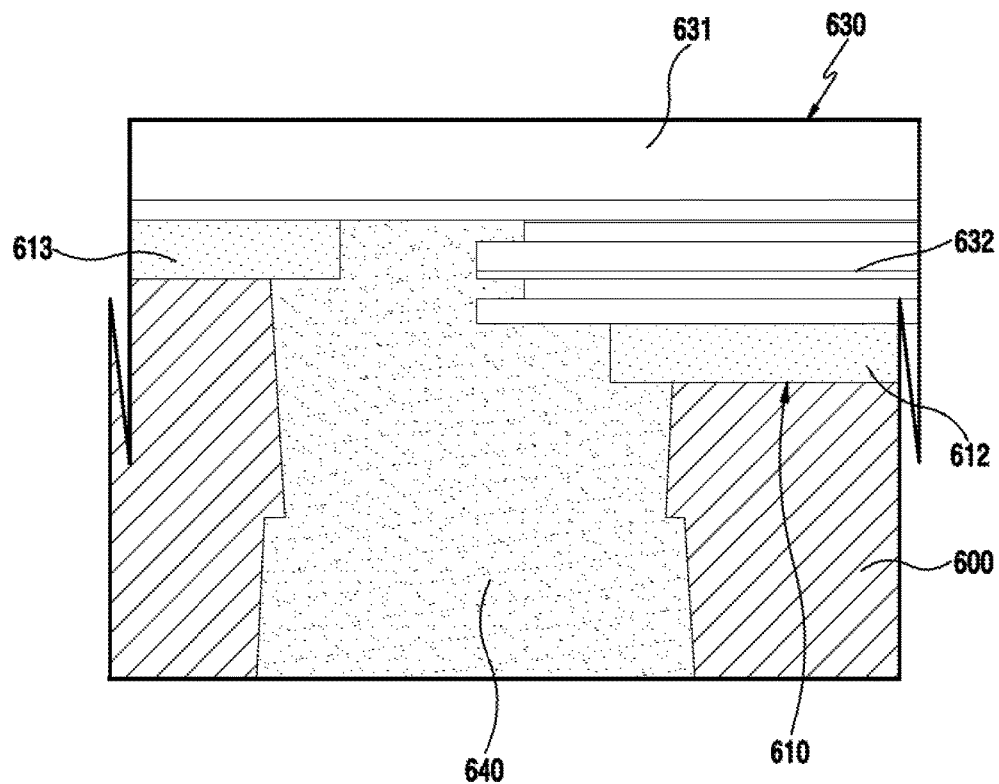

FIGS. 6E and 6F are views illustrating a state in which a waterproofing filling member is applied between a housing and a display according to various embodiments of the present disclosure.

Referring to FIGS. 6E and 6F, the display 630 may be stacked on the housing 600 where the seal member 610 is attached. According to an embodiment, the display 630 may include a window 631 made of a transparent material and a display module 632 on the rear face of the window 631. According to an embodiment, in the case where the display 630 is arranged on the top face of the housing 600, the display module 632 of the display 630 may be positioned in the display module arrangement region (the region B1 in FIG. 6A) of the housing 600, and the window 631 may be arranged in the BM regions (the regions B2 and B3 in FIG. 6A) of the housing 600. According to an embodiment, in the display arrangement region (the region B1 in FIG. 6A), the display 630 may be fixed in a manner in which the rear face of the display module 632 is attached to a seal member 610 (e.g., the first and second seal members 611 and 612 in FIG. 6A), and in the BM regions (the regions B2 and B3 in FIG. 6A), the display may be fixed in a manner in which the corresponding rear face of the window 631 is attached to a seal member 610 (e.g., the third and fourth seal members 613 and 614 in FIG. 6A).

According to various embodiments of the present disclosure, when the display 630 is attached to the housing 600 via the seal member 610 in the above-mentioned manner, water may flow into the housing through a spaced gap of each seal member arranged in the stepped portion 620, which may consequently cause water infiltration into the electronic device. Accordingly, according to an embodiment, a separate waterproofing filling member 640 (see FIG. 6E) may be applied to such a stepped portion 620. According to an embodiment, the waterproofing filling member 640 may be introduced into the filling member introduction holes 6011 and 6012 through the rear face 601 of the housing 600 in the state where the display 630 and the housing 600 are coupled to each other. According to an embodiment, the waterproofing filling member 640 may include a semisolid material or a liquid material, and may be solidified by a natural or external condition (e.g., heat, ultraviolet ray, or pressure). Accordingly, in the electronic device, it is possible to provide a space sealed by a closed curve loop having no discontinuous section in order to implement a complete waterproof function by applying the seal member 610 and the waterproofing filling member 640 between the display 630 and the housing 600.

Figure 6G:
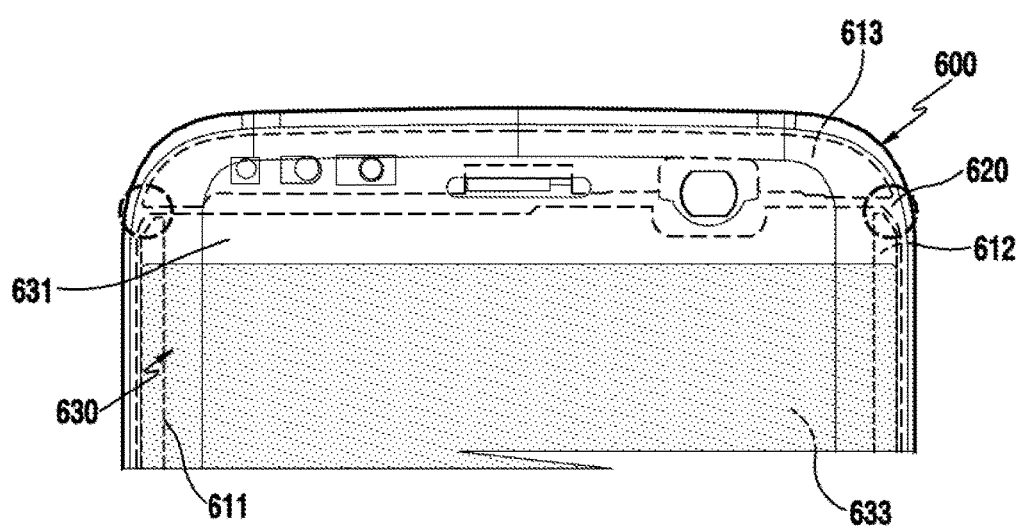
FIGS. 6G and 6H are views illustrating a configuration of a display to which a waterproofing filling member is applied according to various embodiments of the present disclosure.
Figure 6H:
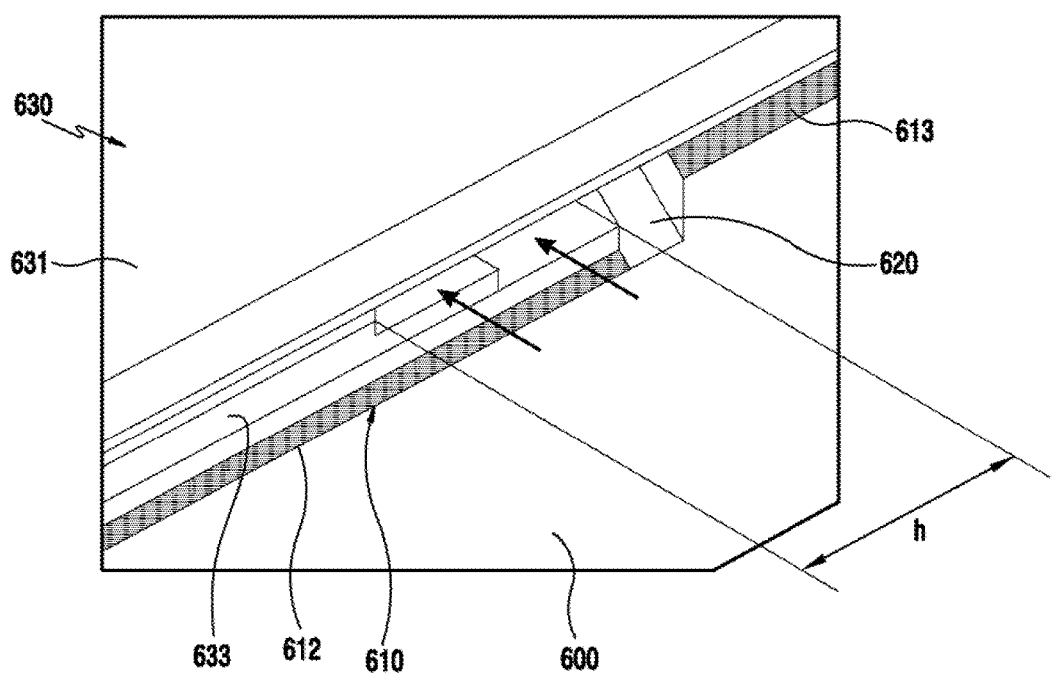

FIGS. 6G and 6H are views illustrating a configuration of a display to which a waterproofing filling member is applied according to various embodiments of the present disclosure.

Referring to FIGS. 6G and 6H, the housing 600 may include a display 630 fixed by the first seal member 611, the second seal member 612, and the third seal member 613. According to an embodiment, the display 630 may include a window 631 and a display module 633 arranged on the rear face of the window 631. According to an embodiment, the display module 633 may be fixed in a manner in which the rear face of the display module 633 is attached to the top face of the housing 600 by the first seal member 611 and the second seal member 612. According to an embodiment, the upper region of the window 631 other than the display module 633 may be fixed in a manner in which the rear face of the window 631 is attached to the top surface of the housing 600 by the third seal member 613. Although not illustrated, the lower region of the window 631 may also be attached to the housing 600 in the same manner as the upper region. According to an embodiment, the seal members 611, 612, and 613 may include at least one of tape, adhesive, waterproof dispensing, silicon, waterproof rubber, and urethane. According to an embodiment, the seal members 611, 612, and 613 may form a sealing space for waterproof because they come in close contact with the rim of a display that includes a window.

According to various embodiments, the display 630 coupled to the housing 600 may include a window 631 and a display module 633 attached to the rear face of the window 631. Accordingly, due to different heights, a stepped portion 620 (e.g., a gap region) may be formed between the black mask (BM) regions (the regions A2 and A3), other than the display module 633 arrangement region with which the window 631 of the housing 600 is in contact, and the display module arrangement region in which the display module 633 of the housing 600 is arranged. According to an embodiment, the stepped portion 620 may be sealed from the outside of the electronic device by introducing a waterproofing filling member into the stepped portion 620 through the filling member introduction holes 6013 and 6014 (see FIG. 6I) formed in the housing 600, as described above.

However, according to an embodiment, the display module 633 of the display 630 may be attached to the housing 600 via the seal members 611, 612, and 613 to implement a waterproof space in the inside of the electronic device. However, a reversely stepped section h (see FIG. 6H) is generated in at least a portion in a lateral space formed by the window 631, the housing 600, and the display module 633 depending on the type of the applied display module (e.g., an OCTA display module or a Super AMOLED display module). Thus, even if a waterproofing filling member is filled in the stepped portion 620, the waterproofing filling member is not completely filled to the reversely stepped portion that is generated due to a length difference between the constituent elements of the display module (e.g., a polarizing panel, an encap layer, and allow temperature polysilicon (LTPS)), and water may flow into such a space.

Figure 6J:
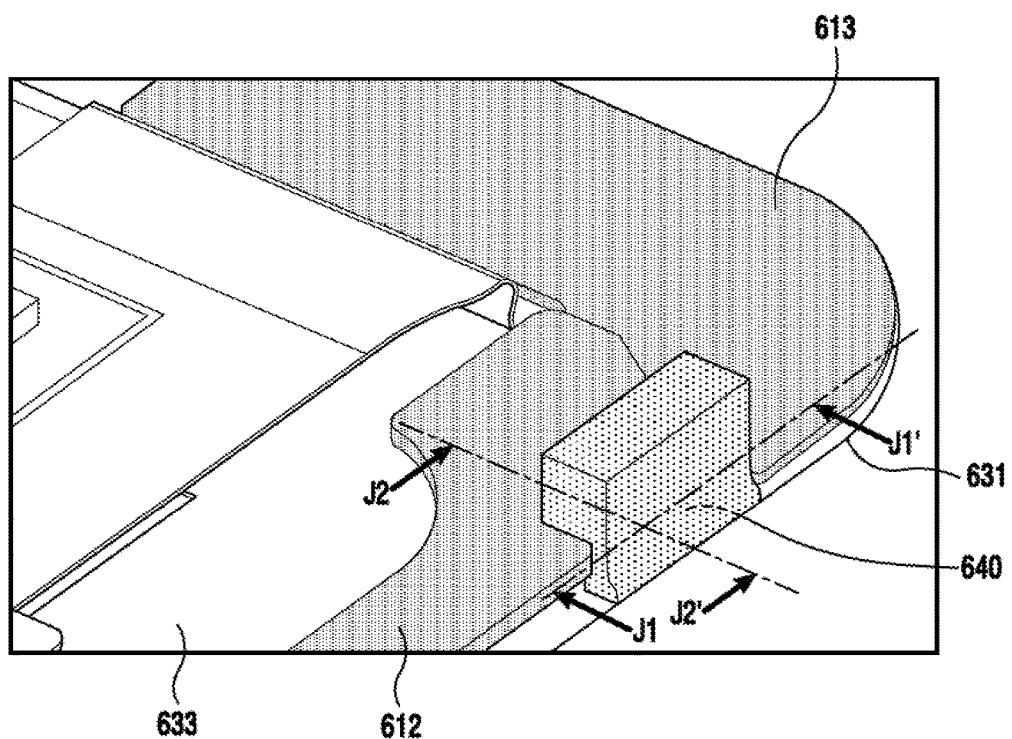
FIG. 6J is a view illustrating a state in which a waterproofing filling member is applied according to various embodiments of the present disclosure.

FIG. 6I is a view illustrating a configuration of a housing to which a waterproofing filling member is applied according to various embodiments of the present disclosure. FIG. 6J is a view illustrating a state in which a waterproofing filling member is applied according to various embodiments of the present disclosure.

Referring to FIGS. 6I and 6J, the above-described problem may be solved by changing the positions of the filling member introduction holes 6013 and 6014 formed in the housing 600. According to an embodiment, the housing 600 may be configured such that a reversely stepped portion of the display may be included in a sealing region. According to an embodiment, the housing 600 may be configured such that a reversely stepped portion of the display and a sealing line partially intersect with each other and the reversely stepped portion does not extend out of the sealing region. According to an embodiment, the housing 600 may include a seal member attachment portion 602 to allow the rear housing to be attached along the rear face 601. According to an embodiment, the filling member introduction holes 6013 and 6014 may be formed in the seal member attachment portion 602 of the housing 600. According to an embodiment, the filling member introduction holes 6013 may be used as an introduction hole, through which a waterproofing filling member may be introduced so as to seal a stepped portion 620 between the display 630 attached to the front face of the housing 600 via the seal members 611, 612, and 613 and the housing 600. As illustrated, the filling member introduction holes 6013 and 6014 may be, but not exclusively, formed in the seal member attachment portion 602. According to an embodiment, the filling member introduction holes 6013 and 6014 may be arranged inside or outside, avoiding the seal member attachment portion 602.

According to various embodiments, the filling member introduction holes 6013 and 6014 may be located at a position to be capable of entirely sealing the reversely stepped section h (see FIG. 6H) of the display module 633 (e.g., a position that overlaps with the side portion of the display module in which the reversely stepped section is included). According to an embodiment, the filling member introduction holes 6013 and 6014 may be formed to have a size that includes both of at least a partial region of a seal member arranged on a side face of the housing 600 (e.g., the first seal member and the second seal member) and at least a partial region of a seal member arranged on the top surface of the housing 600 (e.g., the third seal member). According to an embodiment, even if the filling member introduction holes 6013 and 6014 are not formed in such a size, the filling member introduction holes 6013 and 6014 may be formed to have a space and/or a size such that the waterproofing filling member 640 introduced through the filling member introduction holes 6013 and 6014 may be coated on all of the reversely stepped section h (see FIG. 6H) of the display module 633, at least a partial region of a seal member arranged on a side face of the housing 600 (e.g., the first seal member and the second seal member), and at least a partial region of a seal member arranged on the top surface of the housing 600 (e.g., the third seal member). According to an embodiment, after the waterproofing filling member 640 is coated through the filling member introduction holes 6013 and 6014, a rear housing fixing seal member may be attached onto the waterproofing filling member 640. Without being limited thereto, however, after the waterproofing filling member 640 is coated through the filling member introduction holes 6013 and 6014, the filling member introduction holes 6013 and 6014 may be finished by a separate cover. According to an embodiment, the waterproofing filling member 640 may include a semisolid material or a liquid material, and may be solidified by a natural or external condition (e.g., heat, ultraviolet ray, or pressure).

Figure 6K:
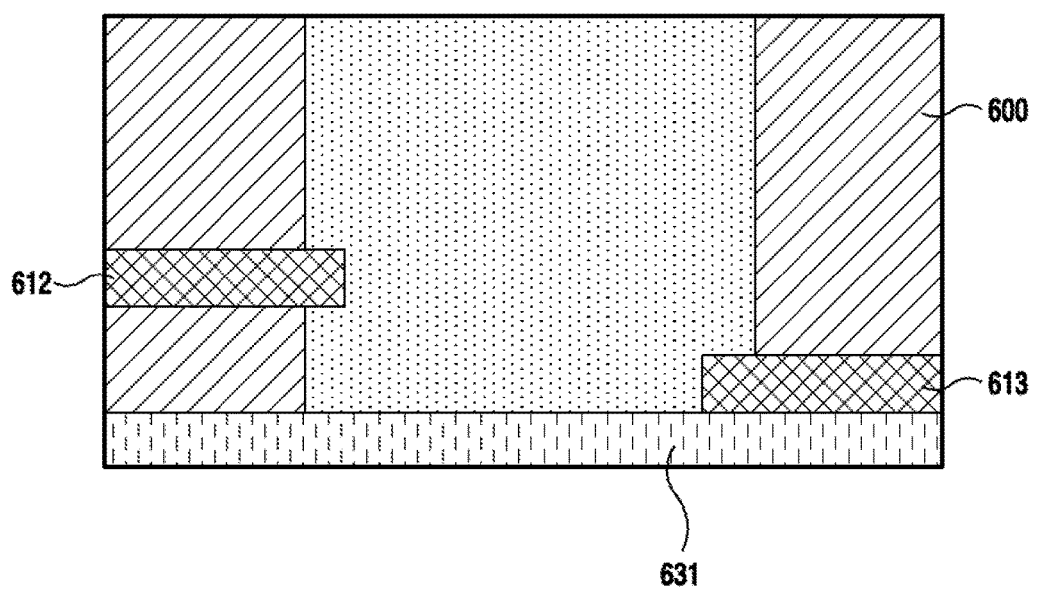
FIG. 6K is a sectional view taken along line J1-J1' of FIG. 6J.
Figure 6L:
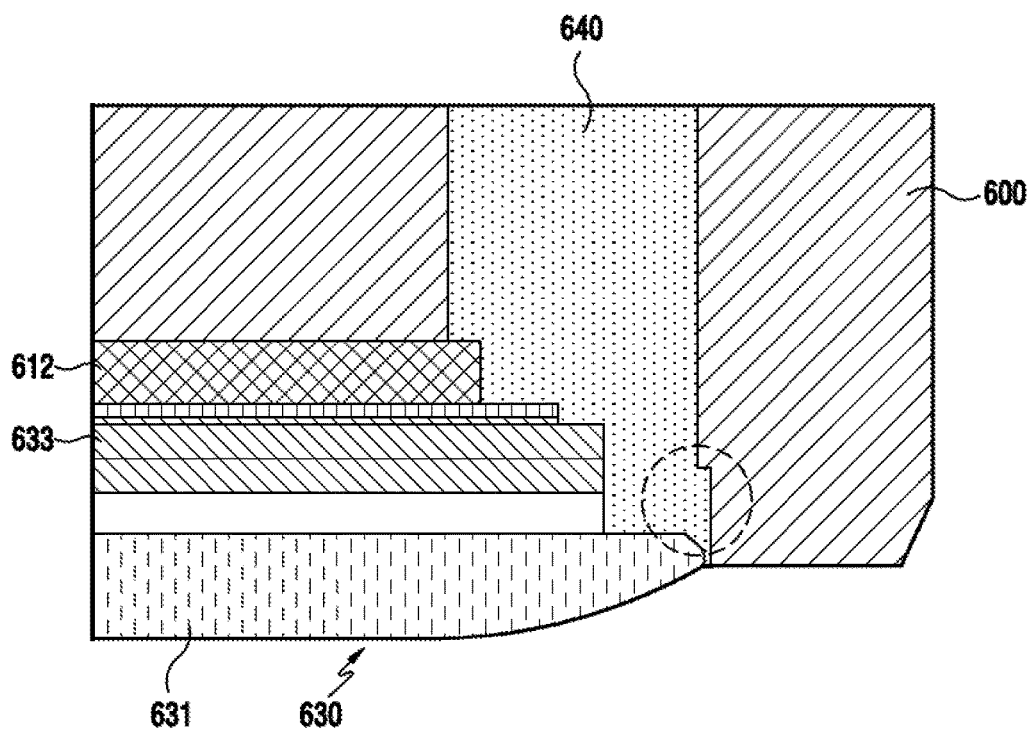
FIG. 6L is a sectional view taken along line J2-J2' of FIG. 6J.

FIG. 6K is a sectional view taken along line J1-J1' of FIG. 6J. FIG. 6L is a sectional view taken along line J2-J2' of FIG. 6J.

Referring to FIGS. 6K and 6L, the waterproofing filling member 640 may be coated in a manner in which the second seal member 612 and the third seal member 613 are sealed without being discontinued. At the same time, the coated waterproofing filling member 640 is pushed to the boundary region between the window 631 of the display module 633 and the housing 600 while also entirely sealing the reversely stepped section of the display module 633 such that the waterproofing filling member 640 may also naturally perform the sealing function between the window 631 and the housing 600. By such an additional sealing effect, an additional seal member (e.g., a waterproof film) to be described later may be excluded.

Figure 7A:
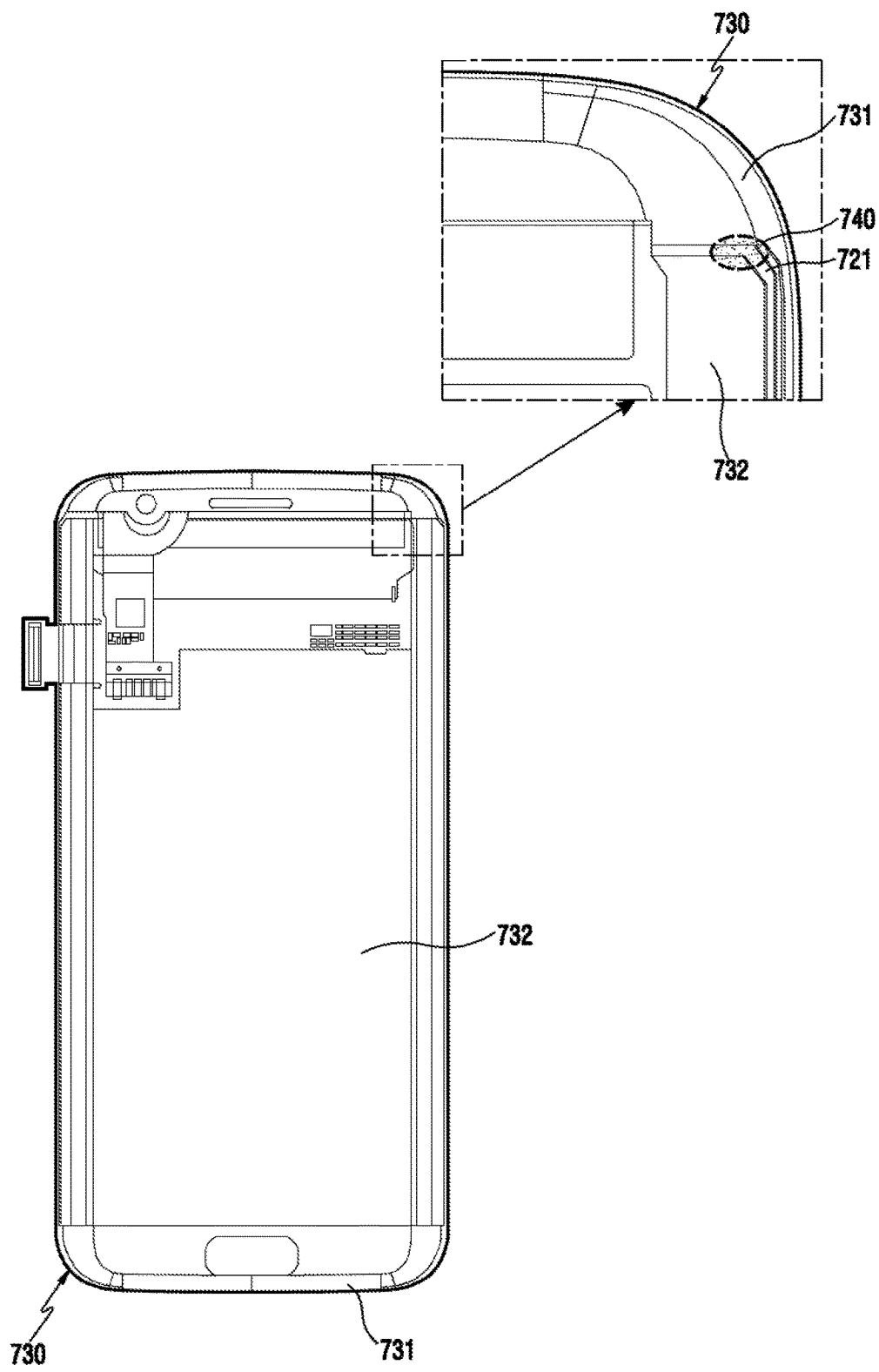
FIG. 7A is a view illustrating the rear side of a display to which a waterproofing filling member is applied according to various embodiments of the present disclosure.

FIG. 7A is a view illustrating the rear side of a display to which a waterproofing filling member is applied according to various embodiments of the present disclosure.

Referring to FIG. 7A, according to various embodiments, the display 730 may include a window 731 and a display module 732 arranged on the rear face of the window 731. In the preceding embodiment, descriptions have been made on a configuration in which a waterproofing filling member is applied to the stepped portion between the display module arrangement region of the housing and the BM regions of the window after the display is attached to the housing via seal members.

Figure 7B:
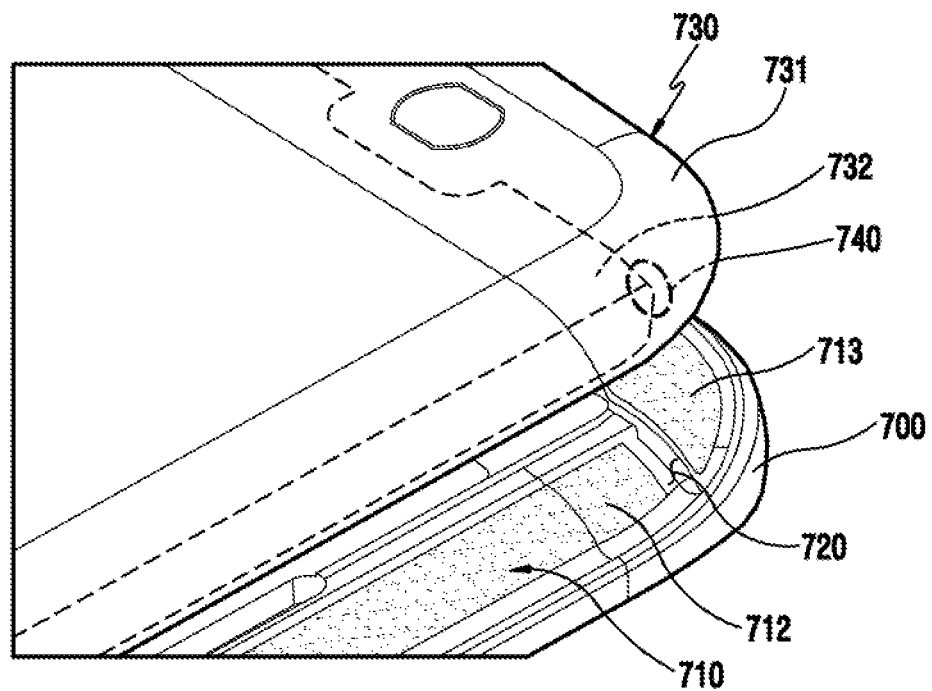
FIG. 7B is a view illustrating an arrangement of a waterproofing filling member when a display and a housing are coupled to each other according to various embodiments of the present disclosure.

The present embodiment discloses a method in which, before the display 730 is applied to the housing 700 (see FIG. 7B), the waterproofing filling member 740 is applied to a display region 721, which corresponds to a stepped portion 720 (see FIG. 7B) of the housing 700, first, and then the display 730 is attached to the housing 700 via a seal member 710 (see FIG. 7B).

According to various embodiments, the waterproofing filling member 740 may include a semisolid material or a liquid material, and may be solidified by a natural or external condition (e.g., heat, ultraviolet ray, or pressure). According to an embodiment, a region 721 of the display 730, which corresponds to a stepped portion of the housing, may be included in the vicinity of four corners of the display 730 where the display module 732 is terminated and the window 731 is initiated, and a waterproofing filling member 740 may be applied (e.g., by coating) to the corresponding region first.

Figure 7C:
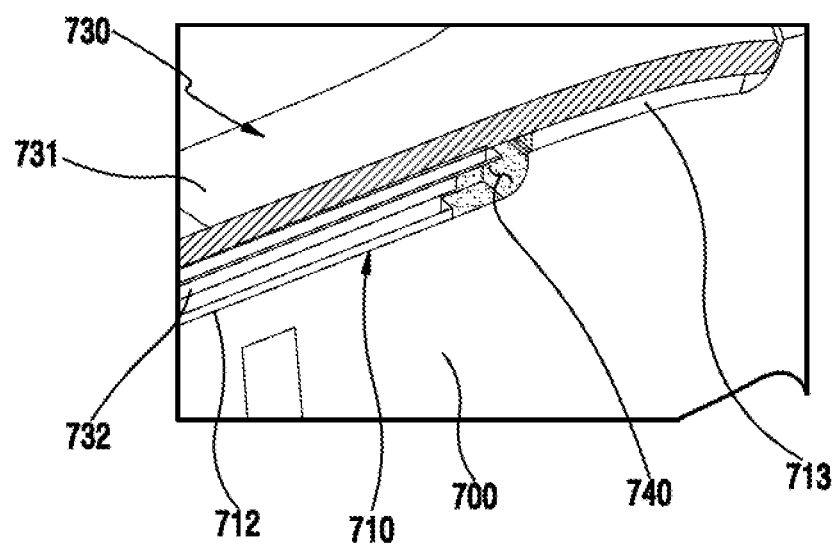
FIG. 7C is a view illustrating a state in which a waterproofing filling member is applied between a housing and a display according to various embodiments of the present disclosure.

FIG. 7B is a view illustrating an arrangement of a waterproofing filling member when a display and a housing are coupled to each other according to various embodiments of the present disclosure. FIG. 7C is a view illustrating a state in which a waterproofing filling member is applied between a housing and a display according to various embodiments of the present disclosure.

Referring to FIGS. 7B and 7C, a seal member 710 may be arranged on a face of the housing 700, to which the display 730 is applied, along a rim thereof. According to an embodiment, the seal member 710 may include at least one of tape, adhesive, waterproof dispensing, silicon, waterproof rubber, and urethane. According to an embodiment, the seal member 710 may include a first seal member 712 arranged on a rim region of the housing 740 in which the display module 732 of the display 730 is disposed, and a second seal member 713 arranged on a BM region of the housing 700, to which, rather than the display module, the rear face of the window 731 is directly applied. According to an embodiment, due to the different heights, a stepped portion 720 may be formed in the boundary region between the display module arrangement region and the BM region of the housing 700. According to an embodiment, as illustrated, the stepped portion 720 may include a space in which a first seal member 712 and a second seal member 713 are spaced from each other without extending. Without being limited thereto, however, the first seal member 712 and the second seal member 713 may be integrally arranged without being discontinued in such a manner of being in close contact with the top face of the stepped portion 720.

According to various embodiments of the present disclosure, after the seal member 710 is attached to the housing 700, the display 730 may be applied in a manner of being stacked thereon. According to an embodiment, the rear face of the display module 732 of the display 730 may be attached to the first seal member 712. According to an embodiment, the window 731 of the display 730 may be attached to the second seal member 713. According to an embodiment, the waterproofing filling member 740 coated on the boundary portion 721 between the display module 732 and the window 731 of the display 730 may seal a gap generated between the housing 700 and the display 730 by the stepped portion 720 at a position corresponding to the stepped portion 720 of the housing 700. According to an embodiment, the waterproofing filling member 740 may be applied to a face of the display and/or the window in the vicinity of the boundary portion 721 between the display module 732 and the window 731. Accordingly, in the electronic device, it is possible to provide a space sealed by a closed curve loop having no discontinuous section in order to implement a complete waterproof function by applying the seal member 710 and the waterproofing filling member 740 between the display 730 and the housing 700.

Figure 8A:
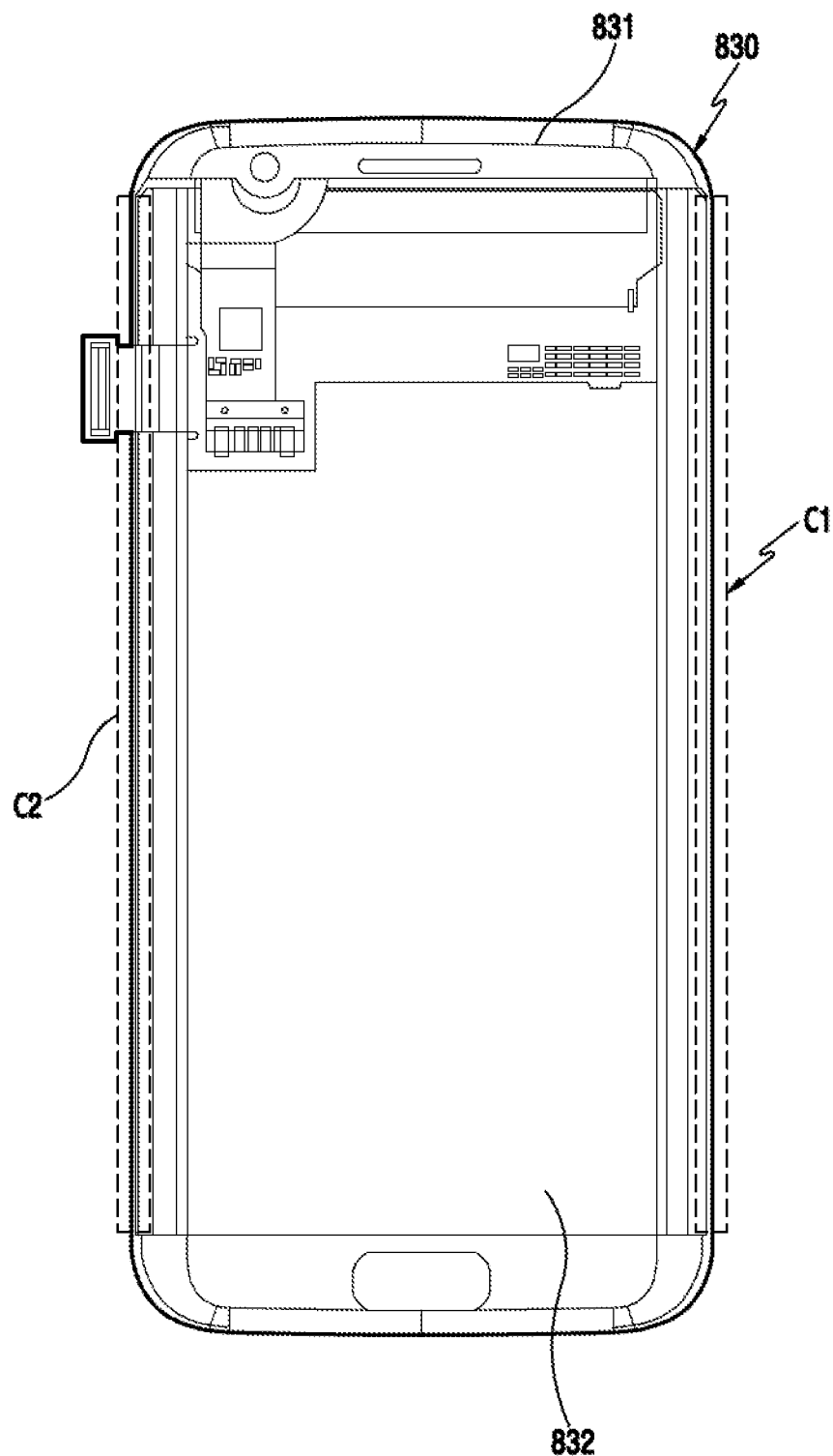
FIGS. 8A, 8B, and 8C are views illustrating a state in which a waterproofing filling member is applied to both side faces of a display coupled to a housing according to various embodiments of the present disclosure.
Figure 8B:
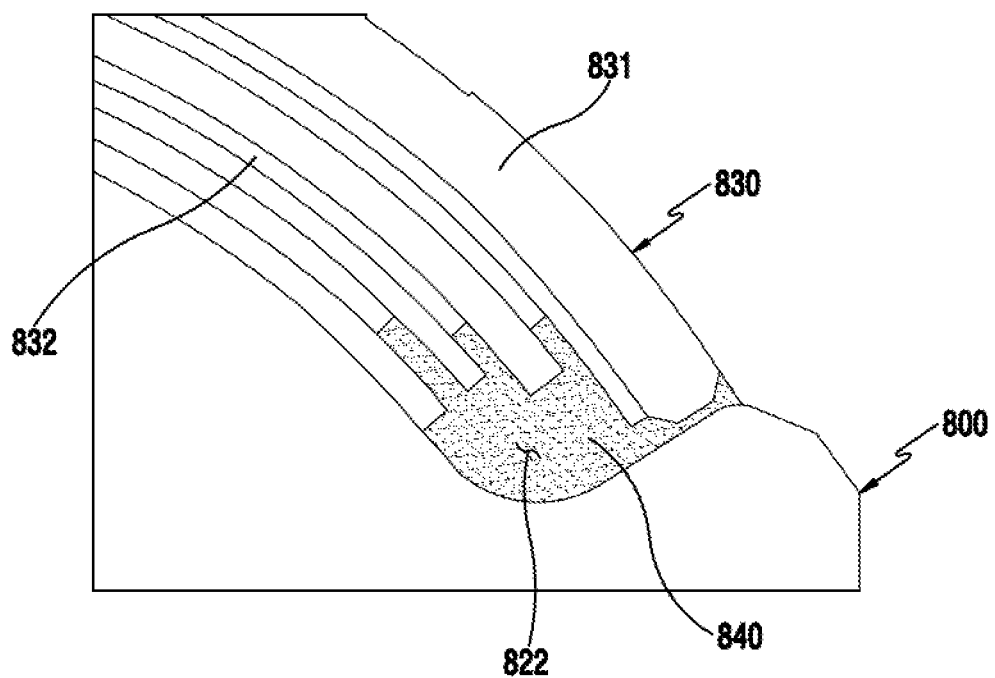
Figure 8C:
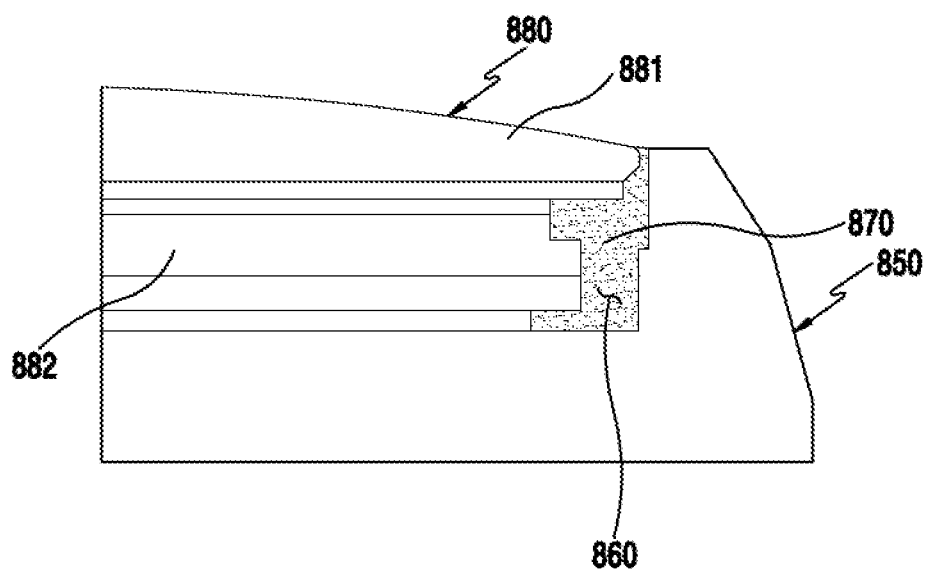

FIGS. 8A to 8C are views illustrating a state in which a waterproofing filling member is applied to both side faces of a display coupled to a housing according to various embodiments of the present disclosure.

Referring to FIGS. 8A to 8C, the display 830 may include a window 831 and a display module 832 at least partially arranged on the rear face of the window 831. According to an embodiment, in a case where the display module 832 of the display 830 is attached to the outer face of the housing by a seal member, side face regions (e.g., regions C1 and C2 in FIG. 8A) of the display 830 arranged outside the seal member may also be exposed to the outside. When the display module 832 of the display 830 and the housing are attached to each other via a seal member, a sealed space for waterproof may be formed inside the electronic device, but the side face regions (regions C1 and C2 in FIG. 8A) of the display, which are positioned outside the seal member, may be exposed to the outside. Accordingly, a separate side face seal member (e.g., a waterproof film) may be applied in order to protect the display module 832 exposed to the side faces of the display 830.

According to various embodiments, FIG. 8B is a sectional view of a housing 800, to which a flexible display module 832 is applied, in which a display 830 may be attached to the housing 800. According to an embodiment, the display module 832 of the display 830 may be attached to the housing 800 via a seal member to implement a waterproof space inside the electronic device. However, a side space 822 formed by the window 831, the housing 800, and the display module 832 may be exposed to the outside, and foreign matter or water may be infiltrated into such a space, which may cause the display module 832 to be damaged. According to an embodiment, a side face seal member 840 (e.g., a waterproof film or a water-repellent film) may be applied to such a space 822. According to an embodiment, the side face seal member 840 may include at least one of a water-repellent coating material containing fluorine, a liquid acryl-based adhesive, an adhesive having elasticity and recovering force, a waterproof dispensing, silicon, and waterproof rubber.

According to various embodiments, FIG. 8C is a sectional view of a housing 850, to which an OCTA display module 882 is applied, in which a display 880 may be attached to the housing 850. According to an embodiment, the display module 882 of the display 880 may be attached to the housing 850 via a seal member to implement a waterproof space inside the electronic device. However, a side space 860 formed by the window 881, the housing 850, and the display module 882 may be exposed to the outside, and foreign matter or water may be infiltrated into such a space 860, which may cause the display module 882 to be damaged. According to an embodiment, a side face seal member 870 (e.g., a waterproof film or a water-repellent film) may be applied to such a space 860. According to an embodiment, the side face seal member 870 may include at least one of a water-repellent coating material containing fluorine, a liquid acryl-based adhesive, an adhesive having elasticity and recovering force, a waterproof dispensing, silicon, and waterproof rubber.

Figure 9A:
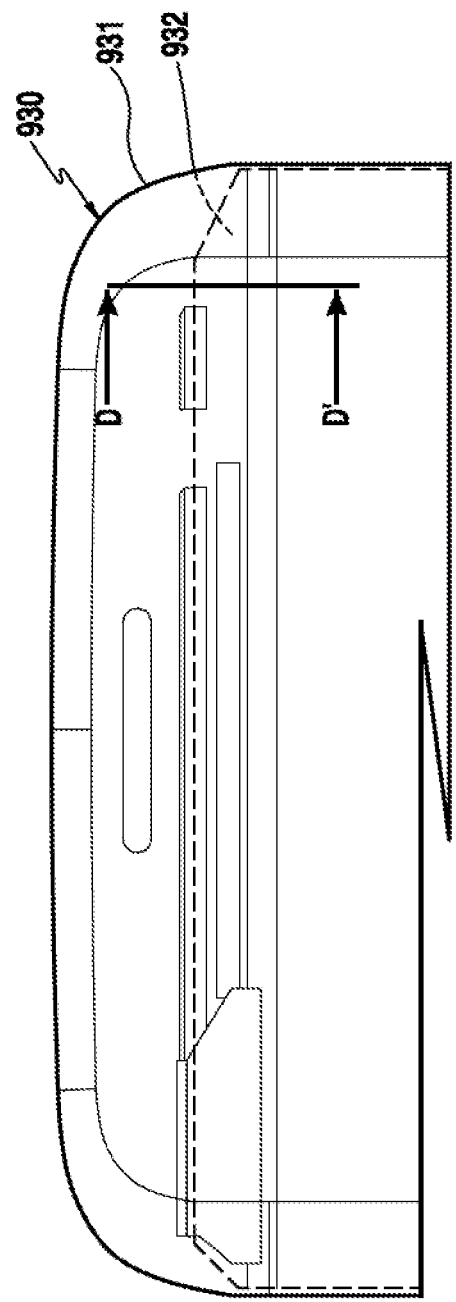
FIGS. 9A, 9B, and 9C are views illustrating a state in which a waterproofing filling member is applied to a space generated by a structure of a display module according to various embodiments of the present disclosure.
Figure 9B:
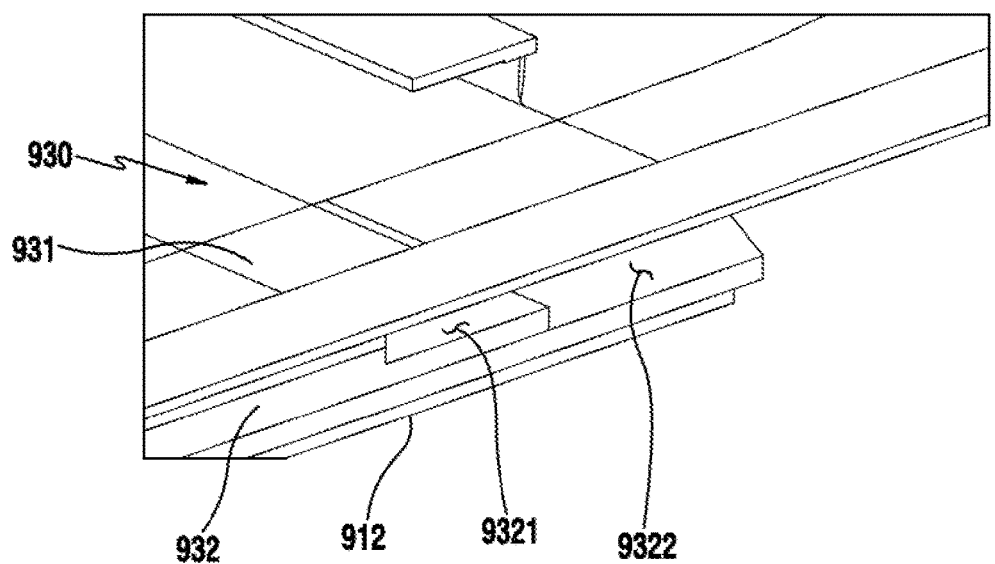
Figure 9C:
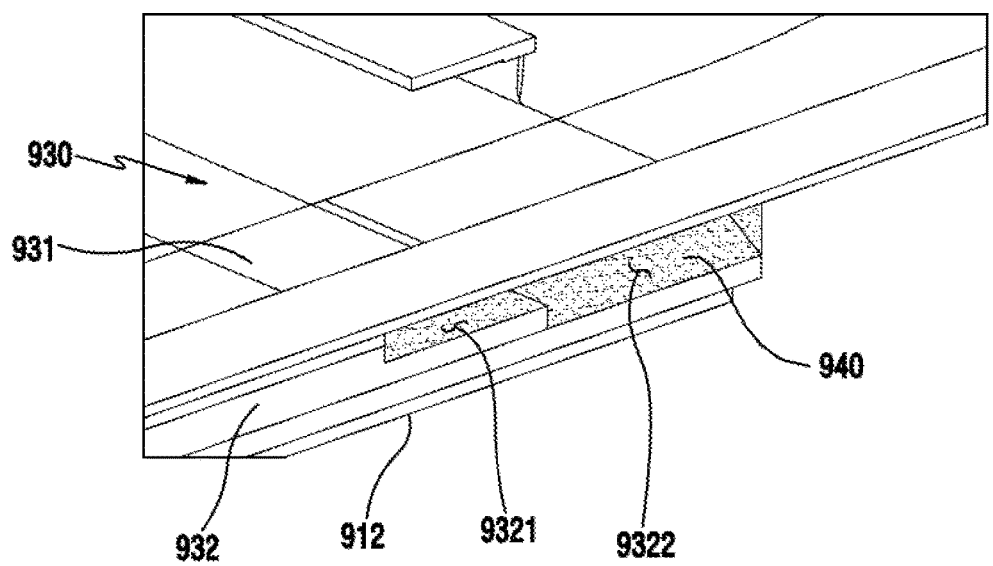

FIGS. 9A to 9C are views illustrating a state in which a waterproofing filling member is applied to a space generated by a structure of a display module according to various embodiments of the present disclosure. FIGS. 9B and 9C are perspective views illustrating a main part when viewed in a direction indicated by line D-D' in FIG. 9A.

Referring to FIGS. 9A to 9C, the display 930 may include a window 931 and a display module 932 at least partially arranged on the rear face of the window 931. According to an embodiment, in a case where the display module 932 of the display 930 is attached to the outer face of the housing (not illustrated) by a seal member 912, a side face region of the display 930 arranged outside the seal member 912 may also be exposed to the outside. When the display module 932 of the display 930 and the housing are attached to each other via the seal member 912, a sealed space for waterproof may be formed inside the electronic device, but the side face region of the display 930, which is positioned outside the seal member 912, may be exposed to the outside. For example, respective constituent elements of the display module 932, which are exposed to a side face of the display 930, may be arranged to form a stepped portion in a vertical direction (in the z-axis direction). By such a stepped structure, a plurality of water infiltration spaces 9321 and 9322 may be generated on the side faces of the display 930. According to an embodiment, a side face seal member 940 (e.g., a waterproof film or a water-repellent film) may also be applied to such water infiltration spaces 9321 and 9322. According to an embodiment, the side face seal member 940 may include at least one of a water-repellent coating material containing fluorine, a liquid acryl-based adhesive, an adhesive having elasticity and recovering force, a waterproof dispensing, silicon, and waterproof rubber.

Figure 10:
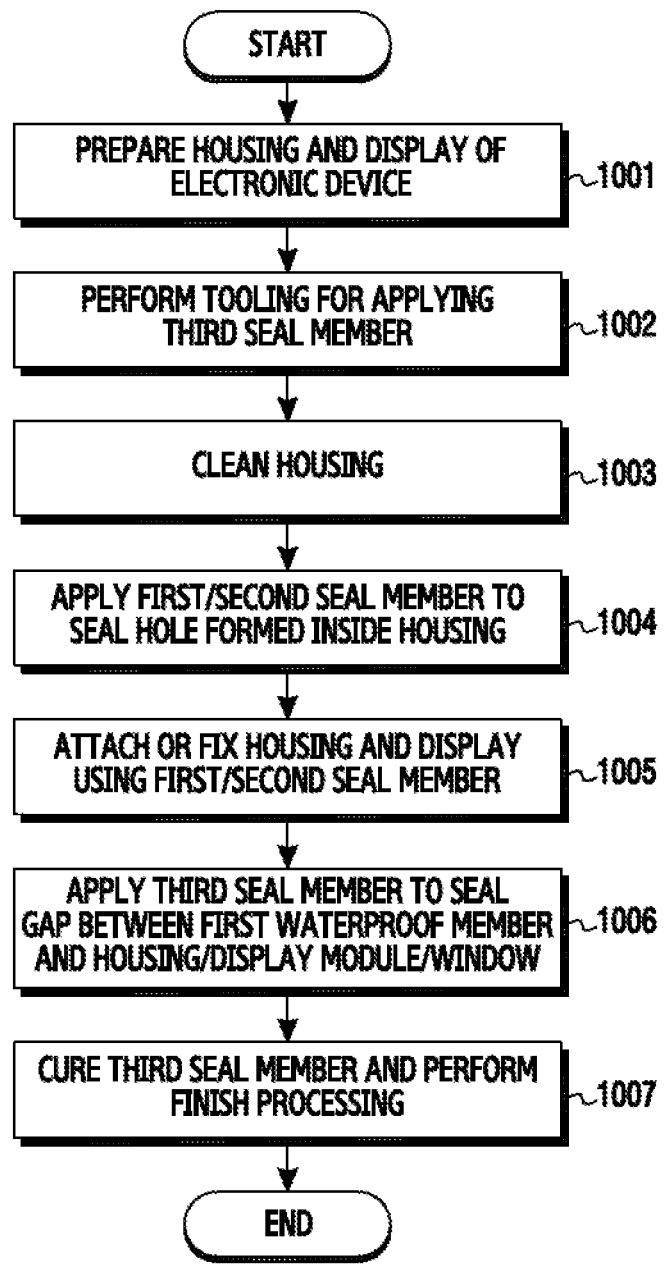
FIG. 10 is a flowchart illustrating a process in which at least one seal member is disposed in an electronic device according to various embodiments of the present disclosure.

FIG. 10 is a flowchart illustrating a process in which at least one seal member is disposed in an electronic device according to various embodiments of the present disclosure.

Referring to FIG. 10, in operation 1001, a housing of an electronic device and a display applied to the housing may be prepared. According to an embodiment, the housing may, but not exclusively, form a single component. According to an embodiment, the housing may be defined as a combination in which an external housing and at least one middle plate (e.g., a bracket) are combined with each other. According to an embodiment, a combination in which a synthetic resin material, a metallic material, and/or a hetero-material are combined with each other may be applied to the housing. According to an embodiment, the display may include a window made of a transparent material and a display module arranged on the rear face of the window. According to an embodiment, the display module may include a touch sensor, and, in such a case, the display may be used as a touch screen.

According to an embodiment, in operation 1002, a tooling operation may be performed so as to apply the third seal member. According to an embodiment, the third seal member may be applied to a gap formed by a stepped portion formed in a boundary of the housing in which the first seal member and the second seal member are arranged. According to an embodiment, in order to apply the third seal member to the rear face that is opposite to the face of the housing to which the display is attached, an introduction hole may be formed at the corresponding position of the housing.

According to an embodiment, in operation 1003, an operation of cleaning the housing, for which the tooling operation has been finished, may be performed. According to an embodiment, because the housing formed with the introduction hole may generate machining particles, a cleaning operation may be performed in order to remove the machining particles. According to an embodiment, in operation 1004, the first and second seal members may be applied in order to seal holes formed inside the cleaned housing. According to an embodiment, the first seal member may be attached to a region of the housing in which the display module is arranged. According to an embodiment, the second seal member may be attached to a region of the housing other than the region in which the display module is arranged. According to an embodiment, the first seal member and the second seal member may be formed as a single body. Without being limited thereto, however, the first seal member and the second seal member may be individually formed to be arranged on corresponding regions, respectively. According to an embodiment, the first seal member and the second seal member may include at least one of tape, adhesive, waterproof dispensing, silicon, waterproof rubber, and urethane.

According to an embodiment, in operation 1005, the housing and the display may be attached to each other by using the first seal member and the second seal member. According to an embodiment, the first seal member may attach the display module of the display to the housing. According to an embodiment, the first seal member may attach the rear face of the display module of the display and a face of the housing to each other. According to an embodiment, the second seal member may attach the window and the housing to each other. According to an embodiment, the second seal member may attach the rear face of the window, which corresponds to a BM region of the display, and a face of the housing to each other.

According to an embodiment, in operation 1006, the third seal member may be applied in order to seal a gap between the first waterproof member and the housing, the housing, and the display. According to an embodiment, the third seal member may be introduced through an introduction hole in the rear face of the housing. According to an embodiment, the third seal member may be introduced into a gap formed in the boundary portion between the first seal member and the second seal member. According to an embodiment, the third seal member is a waterproofing filling member, which may include a semisolid material or a liquid material, and may be solidified by a natural or external condition (e.g., heat, ultraviolet ray, or pressure). According to an embodiment, the third seal member may include a waterproof film applied to a side face of the display module and the housing, which are attached to each other by the first seal member.

According to an embodiment, in operation 1007, an operation of curing and finishing the third seal member may be performed. According to an embodiment, a complete waterproof function may be implemented in the electronic device by providing a sealed space by a closed curve loop that does not have a discontinuous section by the first, second, and third seal members.

According to various embodiments, an electronic device formed as illustrated in FIGS. 5A, 5B, 5C, 6A, 6B, 6C, 6D, 6E, and 6F described above may be manufactured by using the manufacturing method of FIG. 10.

Figure 11:
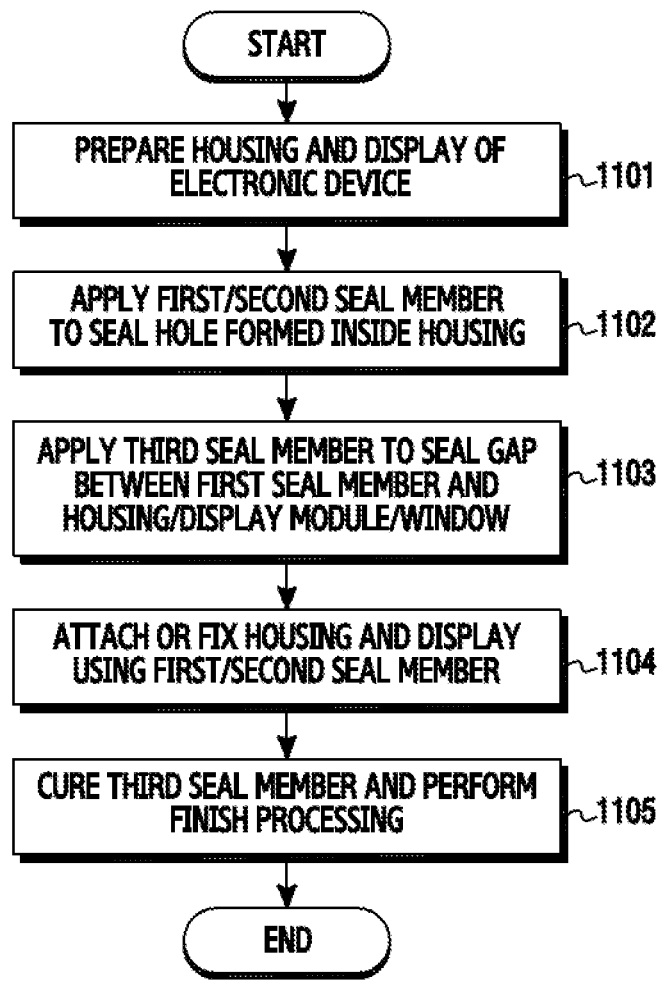
FIG. 11 is a flowchart illustrating a process in which at least one seal member is disposed in an electronic device according to various embodiments of the present disclosure.

FIG. 11 is a flowchart illustrating a process in which at least one seal member is disposed in an electronic device according to various embodiments of the present disclosure.

Referring to FIG. 11, in operation 1101, a housing of an electronic device and a display applied to the housing may be prepared. According to an embodiment, the housing may, but not exclusively, form a single component. According to an embodiment, the housing may be defined as a combination in which an external housing and at least one middle plate (e.g., a bracket) are combined with each other. According to an embodiment, a combination in which a synthetic resin material, a metallic material, and/or a hetero-material are combined with each other may be applied to the housing. According to an embodiment, the display may include a window made of a transparent material and a display module arranged on the rear face of the window. According to an embodiment, the display module may include a touch sensor, and, in such a case, the display may be used as a touch screen.

According to an embodiment, in operation 1102, the first and second seal members may be applied in order to seal holes formed inside the housing. According to an embodiment, the first seal member may be attached to a region of the housing in which the display module is arranged. According to an embodiment, the second seal member may be attached to a region of the housing other than the region in which the display module is arranged. According to an embodiment, the first seal member and the second seal member may be formed as a single body. Without being limited thereto, however, the first seal member and the second seal member may be individually formed to be arranged on corresponding regions, respectively. According to an embodiment, the first seal member and the second seal member may include at least one of tape, adhesive, waterproof dispensing, silicon, waterproof rubber, and urethane.

According to an embodiment, in operation 1103, the third seal member may be applied in order to seal a gap between the first waterproof member and the housing, the housing, and the display. According to an embodiment, the third seal member may be applied to the boundary portion between the first seal member and the second seal member. According to an embodiment, the third seal member is a waterproofing filling member, which may include a semisolid material or a liquid material, and may be solidified by a natural or external condition (e.g., heat, ultraviolet ray, or pressure).

According to an embodiment, in operation 1104, the housing and the display may be attached to each other by using the first seal member and the second seal member. According to an embodiment, the first seal member may attach the display module of the display to the housing. According to an embodiment, the first seal member may attach the rear face of the display module of the display and a face of the housing to each other. According to an embodiment, the second seal member may attach the window and the housing to each other. According to an embodiment, the second seal member may attach the rear face of the window, which corresponds to a BM region of the display, and a face of the housing to each other. According to an embodiment, the third seal member may be applied to a gap formed by a stepped portion formed in a boundary of the housing in which the first seal member and the second seal member are arranged, thereby performing a function to seal the gap.

According to an embodiment, in operation 1105, an operation of curing and finishing the third seal member may be performed. According to an embodiment, a complete waterproof function may be implemented in the electronic device by providing a sealed space by a closed curve loop that does not have a discontinuous section by the first, second, and third seal members.

According to various embodiments of the present disclosure, an electronic device formed as illustrated in FIGS. 7A, 7B, and 7C described above may be manufactured by using the manufacturing method of FIG. 10.

Figure 12:
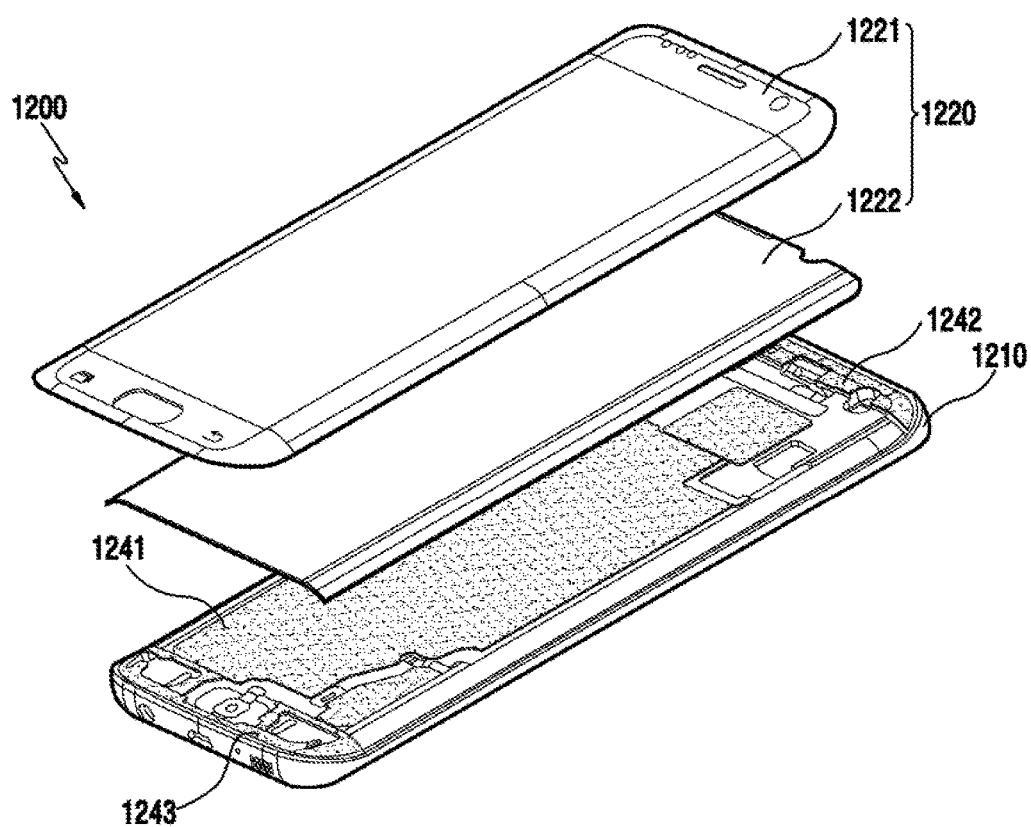
FIG. 12 is an exploded perspective view illustrating an electronic device that is provided with a seal member according to various embodiments of the present disclosure.

FIG. 12 is an exploded perspective view illustrating an electronic device that is provided with a seal member according to various embodiments of the present disclosure.

Hereinafter, at least one seal member applied for waterproof may be applied to seal at least one hole formed in the housing that corresponds to the rear face of the display module, rather than a rim of the rear face of the display module.

The electronic device 1200 of FIG. 12 may be an embodiment of an electronic device that is similar to, or different from, the electronic device 400 illustrated in FIGS. 4A and 4B.

Referring to FIG. 12, the electronic device 1200 may include a housing 1210, a display 1220 arranged above the housing 1210, and one or more seal members 1241, 1242, and 1243 interposed between the display 1220 and the housing 1210. According to an embodiment, the display 1220 may include a window 1221 arranged on the front face of the electronic device 1200 and a display module 1222 arranged on the rear face of the window 1221. According to an embodiment, the seal members may include a first seal member 1241 arranged in a region of the housing 1210 which corresponds to the display module 1222, and a second seal member 1242 and a third seal member 1243 which are arranged in a region of the housing 1210 that corresponds to a BM region of the window 1221 and corresponds to a region other than the display module 1222.

According to various embodiments of the present disclosure, the first, second, and third seal members 1241, 1242, and 1243 may include at least one of tape, adhesive, waterproof dispensing, silicon, waterproof rubber, and urethane. According to an embodiment, the first seal member 1241 may be arranged between the rear face of the display module 1222 and the housing 1210. According to an embodiment, the second seal member 1242 and the third seal member 1243 may be arranged between the rear face of the window 1221 and the housing 1210. According to an embodiment, as an arrangement space between the window 1221 and the housing 1210 by the first seal member 1241 is excluded by the arrangement structure of the first seal member 1241 between the display module 1222 and the housing 1210, the electronic device 1200 may secure a BM region that is reduced in, or excluded from, the display region.

According to various embodiments of the present disclosure, the first seal member 1241 may seal one or more structural holes formed in a region of the housing 1210 which corresponds to the display module 1222, thereby preventing water infiltration into the electronic device. According to an embodiment, the holes may include a through-hole for reducing the protrusion amount of a rear camera or a through-hole for battery swell.

Figure 13A:
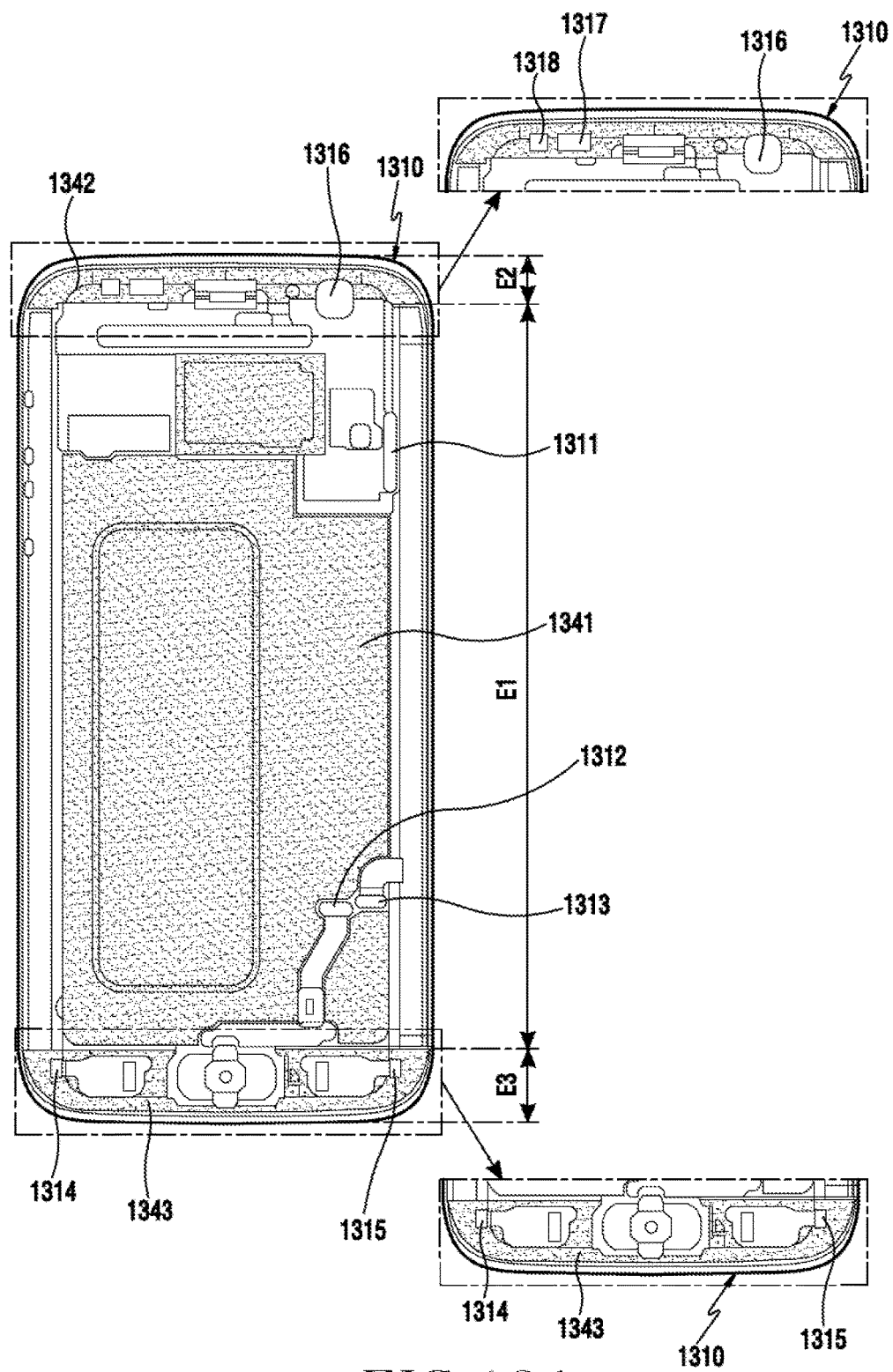
FIG. 13A is a view illustrating the front side of a housing in which at least one seal member is disposed according to various embodiments of the present disclosure.

FIG. 13A is a view illustrating the front side of a housing in which at least one seal member is disposed according to various embodiments of the present disclosure.

A housing 1310 shown in FIG. 13A may be an embodiment of a housing that is similar to, or different from, the housing 1210 of FIG. 12. A plurality of seal members 1341, 1342, and 1343 of FIG. 13A may be an embodiment of seals that are similar to, or different from, a plurality of seal members 1241, 1242, and 1243 of FIG. 12.

Referring to FIG. 13A, the housing 1310 may include a display module arrangement region (region E1) and BM regions (regions E2 and E3) formed in the upper and lower ends of the display module arrangement region. According to an embodiment, the plurality of seal members 1341, 1342, and 1343 may be arranged on the face of the housing 1310 where the display is mounted. According to an embodiment, the seal members 1341, 1342, and 1343 may include at least one of tape, adhesive, waterproof dispensing, silicon, waterproof rubber, and urethane.

According to various embodiments of the present disclosure, the seal members 1341, 1342, and 1343 may include a first seal member 1341 arranged in a region of the housing 1310 which corresponds to the display module, and a second seal member 1342 and a third seal member 1343 which are arranged in a region of the housing 1310 that corresponds to a BM region of the window and corresponds to a region other than the display module. According to an embodiment, the first seal member 1341 may contribute to sealing at least a portion of the display arrangement region (the region El) of the housing 1310. According to an embodiment, the second seal member 1342 may be arranged in the upper region (the region E2) of the display module arrangement region of the housing 1310. According to an embodiment, the third seal member 1343 may be arranged in the lower region (the region E3) of the display module arrangement region of the housing 1310.

According to various embodiments of the present disclosure, the first seal member 1341 may seal one or more structural holes formed in a region (region E1) of the housing 1310 which corresponds to the display module, thereby preventing water infiltration into the electronic device. According to an embodiment, the holes may include a through-hole for reducing the protrusion amount of a rear camera or a through-hole for battery swell.

According to various embodiments of the present disclosure, the second seal member 1342 may seal one or more structural holes 1317 and 1318 formed in the upper region (region E2) of the housing 1310, thereby preventing water infiltration into the electronic device. According to an embodiment, the holes may include a sensor through-hole 1317 or an indicator through-hole 1318.

According to various embodiments of the present disclosure, the third seal member 1343 may seal one or more structural holes 1314 and 1315 formed in the lower region (region E3) of the housing 1310, thereby preventing water infiltration into the electronic device. According to an embodiment, the holes may include through-holes 1314 and 1315 for an electric connection member for touch (e.g., an FPCB)) arranged in the lower portion of the electronic device.

As will be described below, the housing 1310 may include one or more other through-holes. According to an embodiment, the one or more other through-holes may include a through-hole 1311 for an electric connection member (e.g., an FPCB) of the display module, a through-hole 1312 or 1313 for an electric connection member (e.g., an FPCB) of the home key module of the electronic device, and a through-hole 1316 for an electric connection member (e.g., an FPCB) of a camera module. According to an embodiment, the through-holes 1311, 1312, 1313, and 1316 are arranged on the front face of the housing 1310. However, the through-holes may be used as penetration means for electric connection members for electronic components (e.g., a display module, a home key module, and a camera module), which shall be electrically connected to a PCB of the electronic device which is arranged on the rear face of the housing 1310. According to an embodiment, a waterproof structure implemented by at least one separately provided seal member may be applied to the through-holes, and the detailed construction thereof will be described below.

Figure 13B:
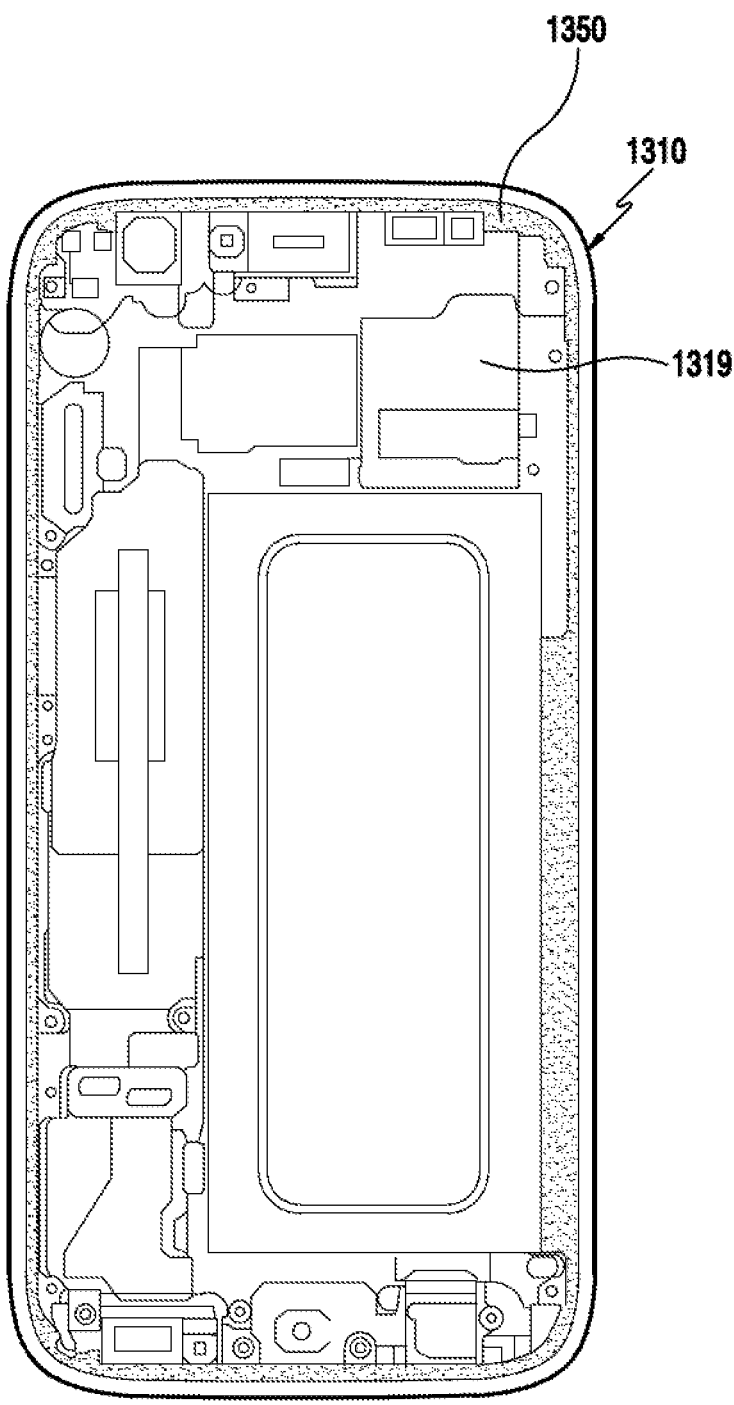
FIG. 13B is a view illustrating the rear side of a housing in which at least one seal member is disposed according to various embodiments of the present disclosure.
Figure 13C:
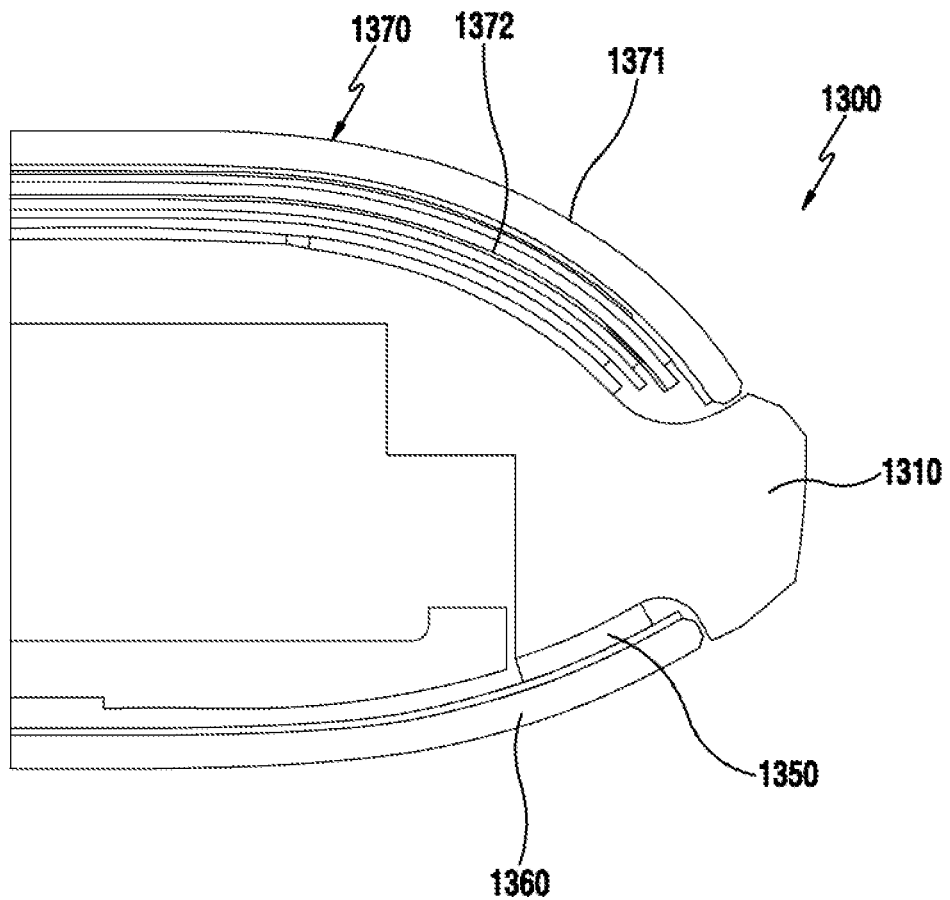
FIG. 13C is a sectional view of a main part of an electronic device that is provided with the seal member of FIG. 13B according to various embodiments of the present disclosure.

FIG. 13B is a view illustrating the rear side of a housing in which at least one seal member is disposed according to various embodiments of the present disclosure. FIG. 13C is a sectional view of a main part of an electronic device that is provided with the seal member of FIG. 13B according to various embodiments of the present disclosure.

Referring to FIGS. 13B and 13C, the electronic device 1300 may include a display 1370 arranged on the front face thereof. According to an embodiment, the display 1370 may include a window 1371 and a display module 1372 arranged on the rear face of the window 1371. According to an embodiment, the display module 1372 may be attached to the front face of the housing 1310 by a plurality of seal members 1341, 1342, and 1343 illustrated in FIG. 13A.

According to various embodiments of the present disclosure, the second electronic device 1300 may include a rear window 1360. According to an embodiment, the rear window 1360 may be attached to the housing 1310 by the fourth seal member 1350 arranged on the rear face 1319 of the housing 1310 in a closed loop shape along the rim thereof. According to an embodiment, the fourth seal member 1350 may include at least one of tape, adhesive, waterproof dispensing, silicon, waterproof rubber, and urethane.

Figure 14A:
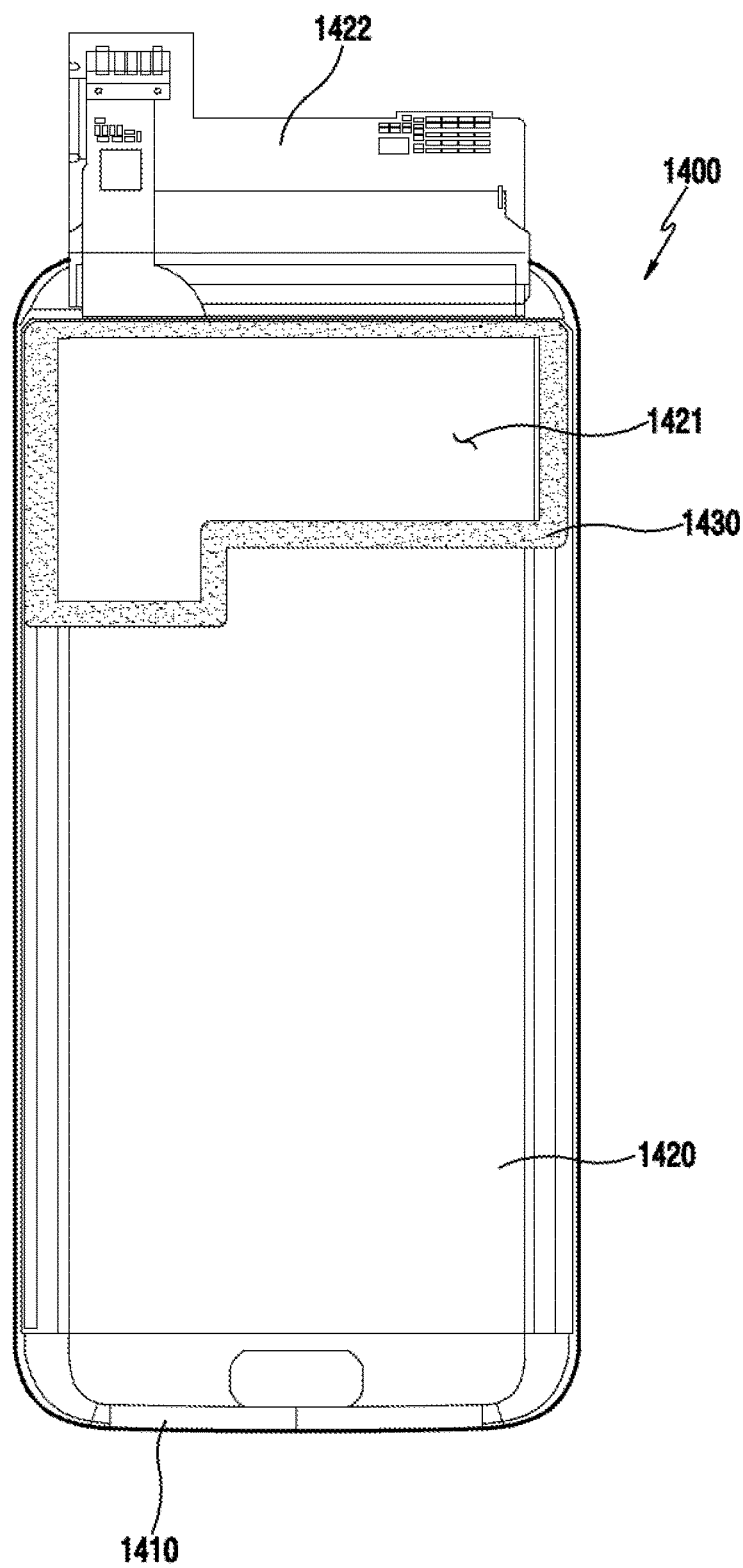
FIGS. 14A, 14B, and 14C are views illustrating a waterproof structure for an electric connection member of a display module according to various embodiments of the present disclosure.
Figure 14B:
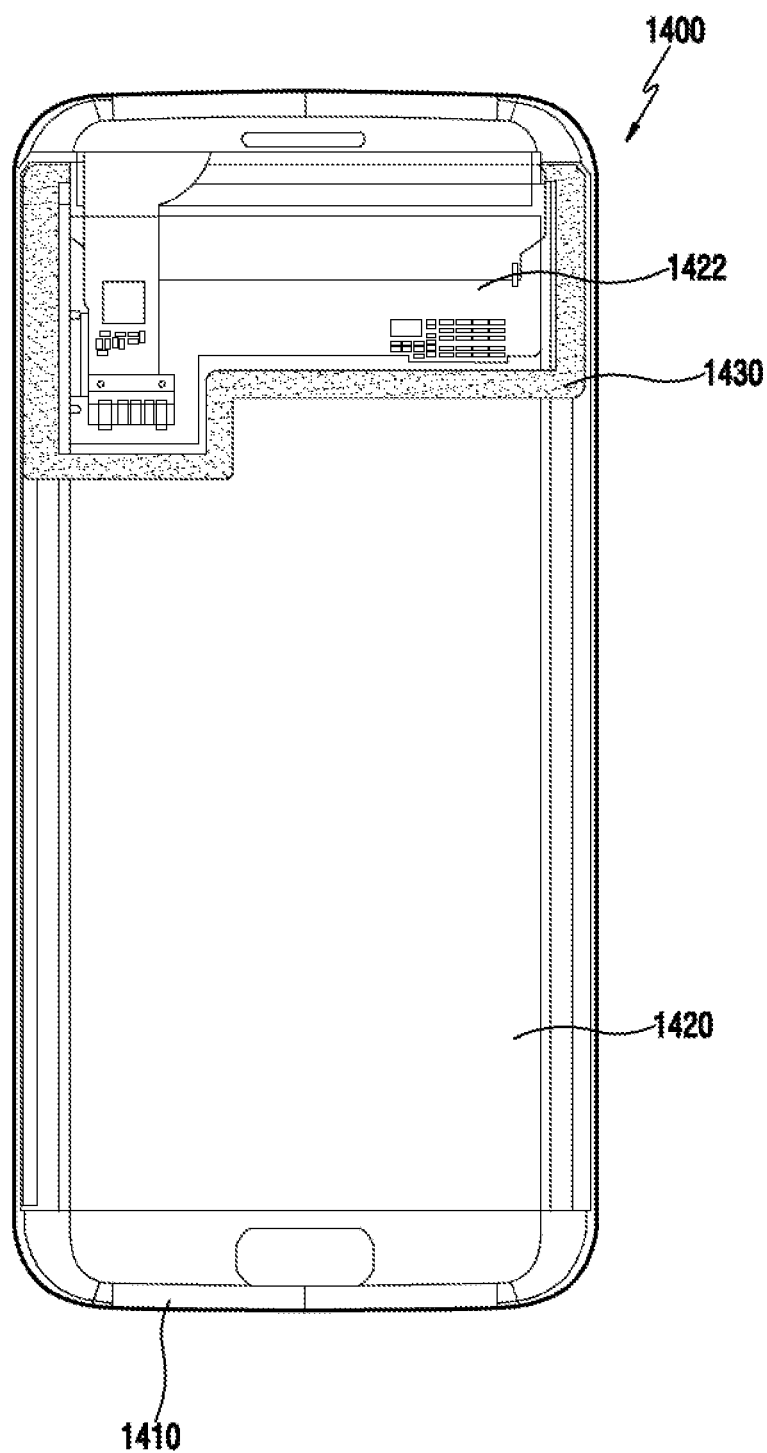
Figure 14C:
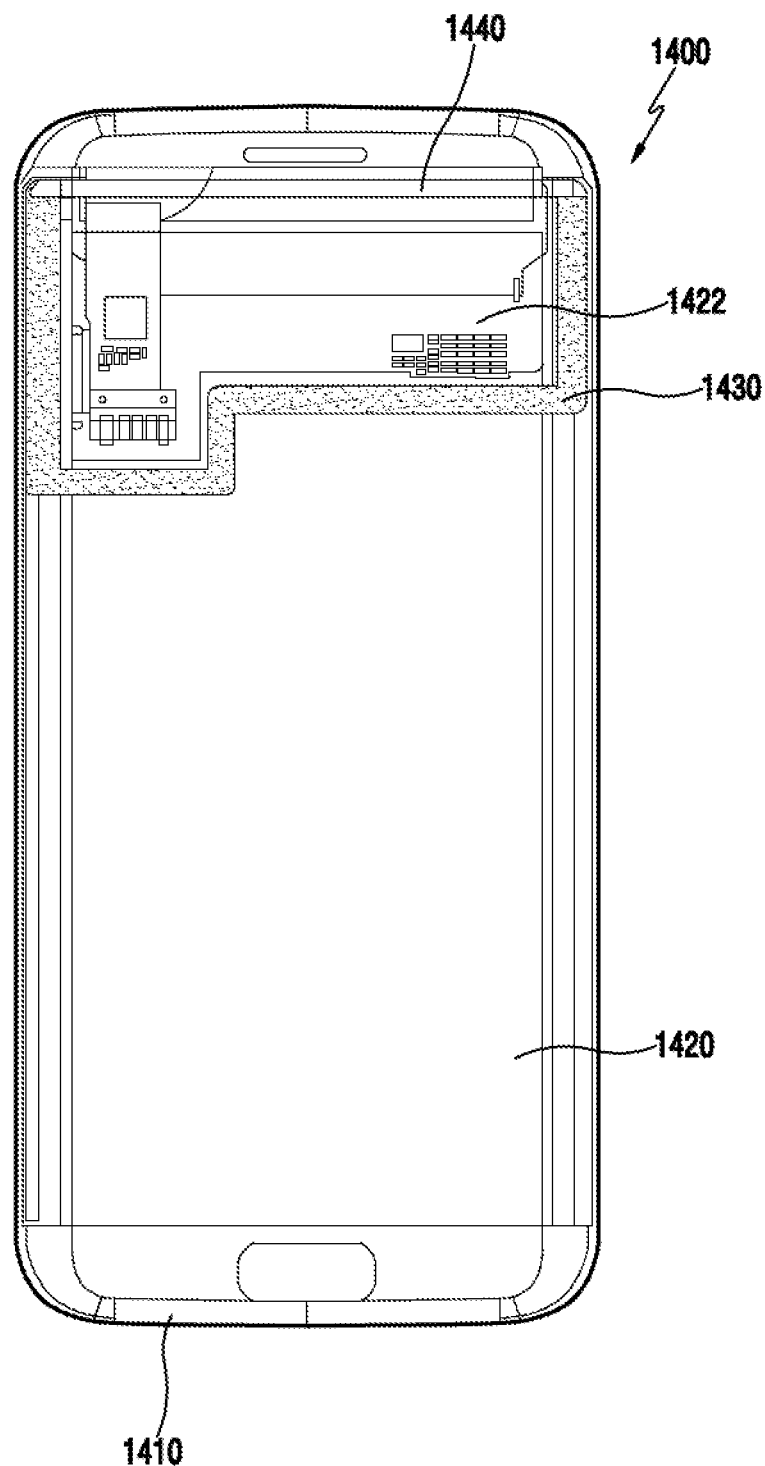

FIGS. 14A, 14B, and 14C are views illustrating a waterproof structure for an electric connection member of a display module according to various embodiments of the present disclosure.

A display 1400 of FIGS. 14A to 14C may be an embodiment of a display that is similar to, or different from, the display 1220 of FIG. 12.

Referring to FIGS. 14A to 14C, the display 1400 may include a window 1410 and a display module 1420 arranged on the rear face of the window 1410. According to an embodiment, the display 1400 may be fixed in a manner of being attached to the top face of the housing in a state in which the display module 1420 is arranged on the window 1410. According to an embodiment, an electric connection member 1422 (e.g., an FPCB) drawn out from the display module 1420 may be arranged in a manner of overlapping with the display module 1420 by being bent to the rear face of the display module 1420. According to an embodiment, the rear face of the display module 1420 is fixed in a manner of being in plane contact with a face of the housing, and thus, a waterproof structure for the electric connection member 1422 and a waterproof structure for a bent line of the electric connection member 1422 may be requested.

According to various embodiments of the present disclosure, a first seal member 1430 may be arranged in a member accommodation region 1421 in which the electric connection member 1422 is bent to overlap with the member accommodation region 1421 in the rear face of the display module 1420. According to an embodiment, the first seal member 1430 may be formed in a closed loop shape that encloses the rim of the member accommodation region 1421. According to an embodiment, the first seal member 1430 may include at least one of tape, adhesive, waterproof dispensing, silicon, waterproof rubber, and urethane, which are disposed on the rear face of the display module 1420.

According to various embodiments of the present disclosure, the first seal member 1430 may be arranged to enclose the member accommodation region 1421 of the rear face of the display module 1420, and the electric connection member 1422 is bent within the member accommodation region 1421 formed by the first seal member 1430 to overlap with the rear face of the display module 1420. According to an embodiment, a second seal line 1440 may be arranged to overlap along the bent line of the electric connection member 1422 in the upper region of the first seal member 1430 arranged in the member accommodation region 1421. According to an embodiment, the electric connection member 1422 may implement a sealed waterproof structure because the first seal member arranged to enclose the electric connection member 1422 and the housing are in plane contact with each other. According to an embodiment, the bent line of the electric connection member 1422 is interposed between the first seal member 1430 and the second seal member 1440, and is then attached to the housing so that water infiltration through the bent line may be prevented in advance.

Figure 15A:
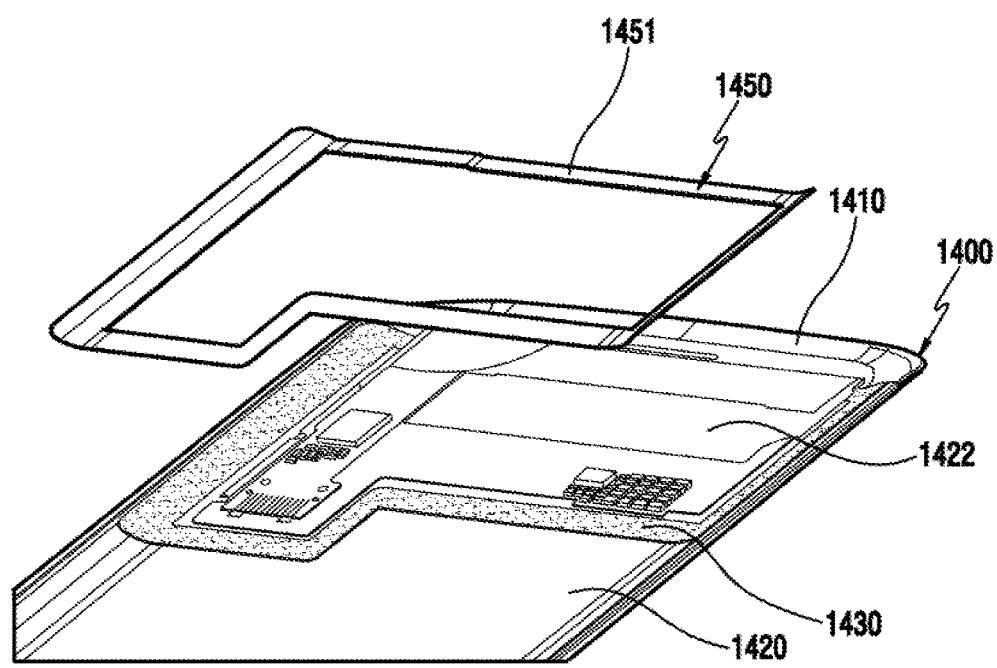
FIGS. 15A and 15B are views illustrating a waterproof structure for an electric connection member of a display module according to various embodiments of the present disclosure.
Figure 15B:
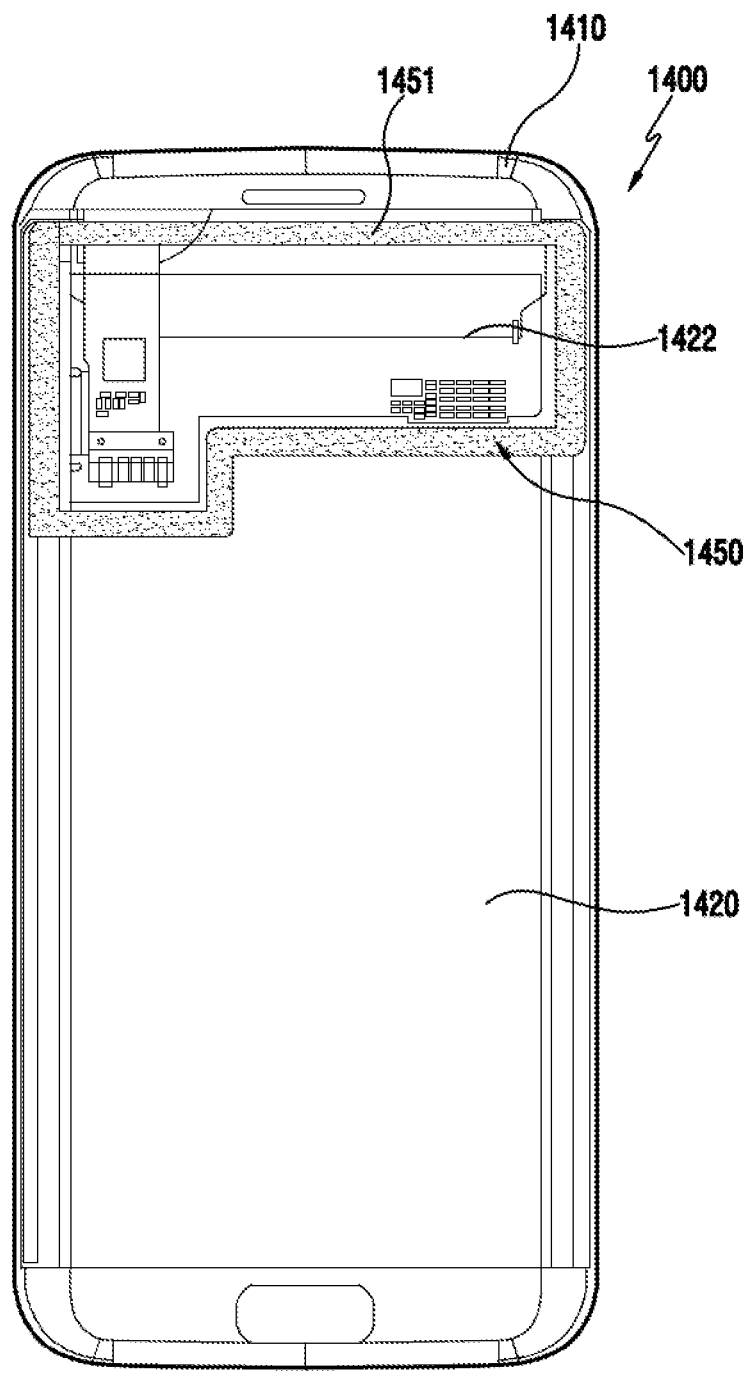

FIGS. 15A and 15B are views illustrating a waterproof structure for an electric connection member of a display module according to various embodiments of the present disclosure.

In the display 1400 of FIGS. 15A and 15B, a third seal member 1450 may be applied instead of the second seal member in the same structure as that of FIGS. 14A to 14C. According to an embodiment, the third seal member 1450 may be formed in the same shape as the first seal member 1430 (e.g., a closed loop shape), and a member stacking portion 1451 may be arranged in the position where the second seal member 1440 is applied. According to an embodiment, the third seal member 1450 may be arranged in the manner of overlapping with the first seal member 1430. According to an embodiment, the bent line of the electric connection member 1422 is interposed between the first seal member 1430 and the member stacking portion 1451 of the third seal member 1440 and is then attached to the housing so that water infiltration through the bent line may be prevented in advance.

Figure 16A:
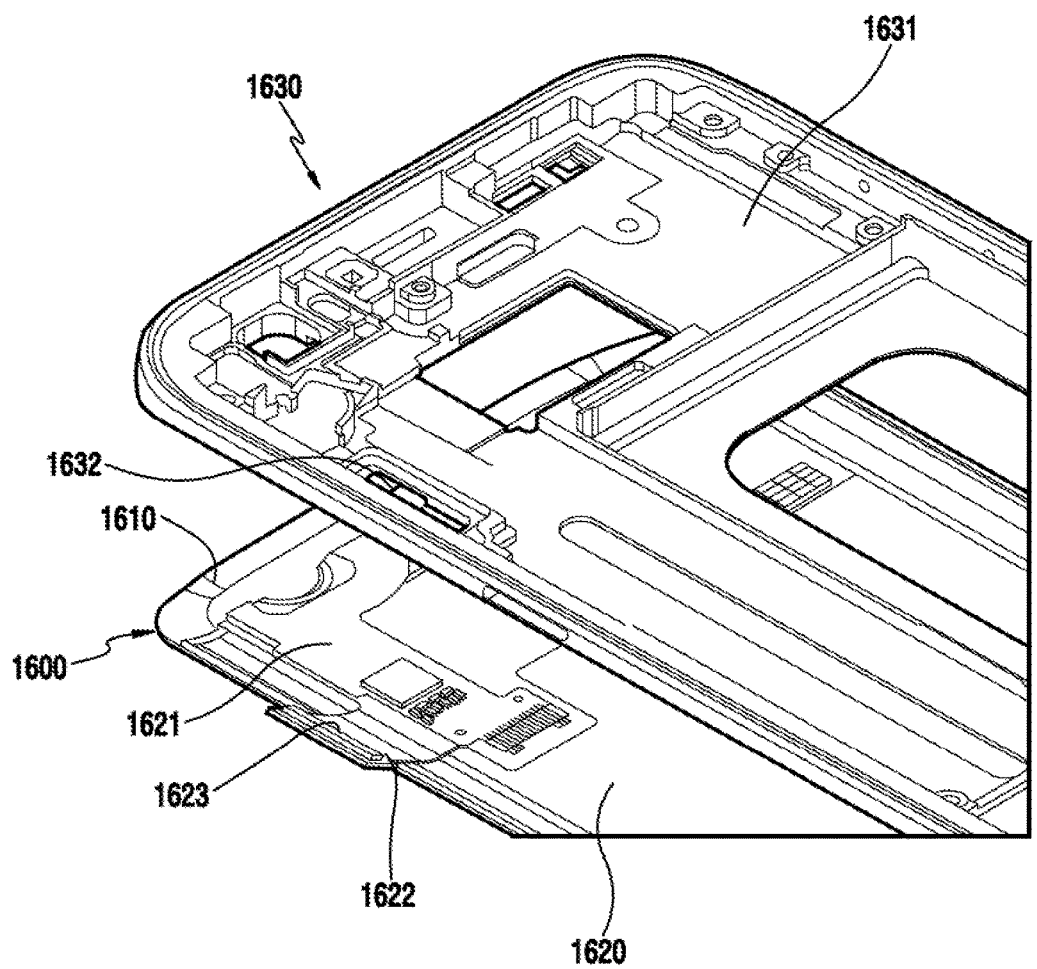
FIGS. 16A, 16B, and 16C are views illustrating a waterproof structure for an electric connection member of a display module according to various embodiments of the present disclosure.
Figure 16B:
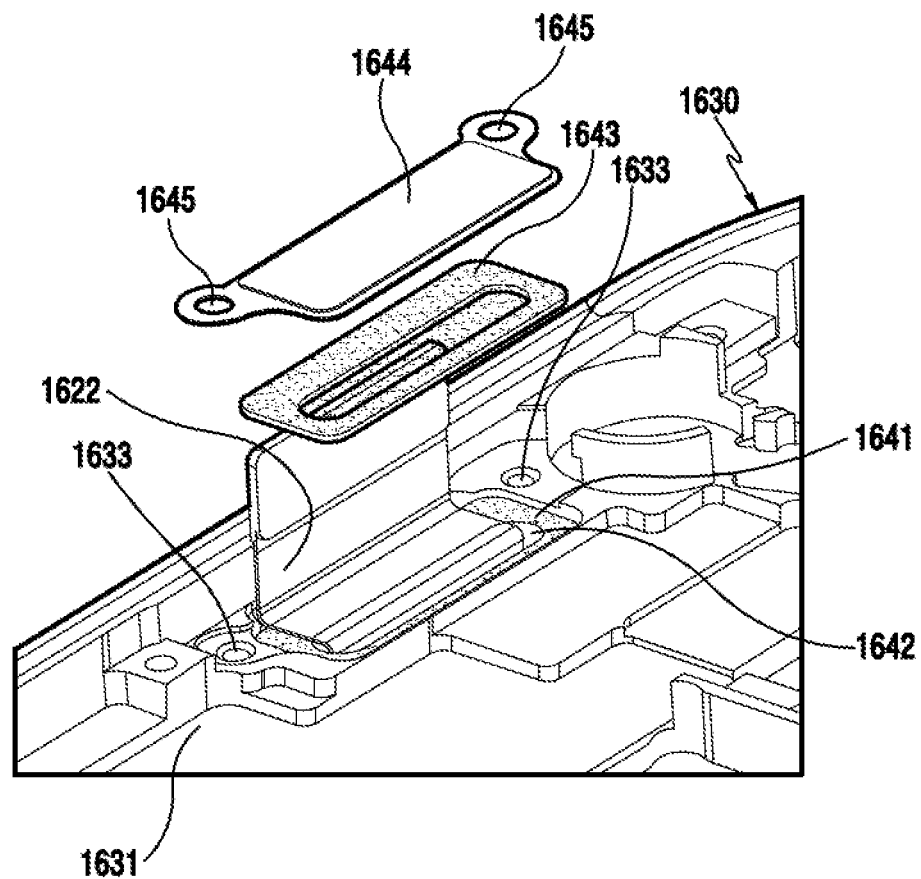
Figure 16C:
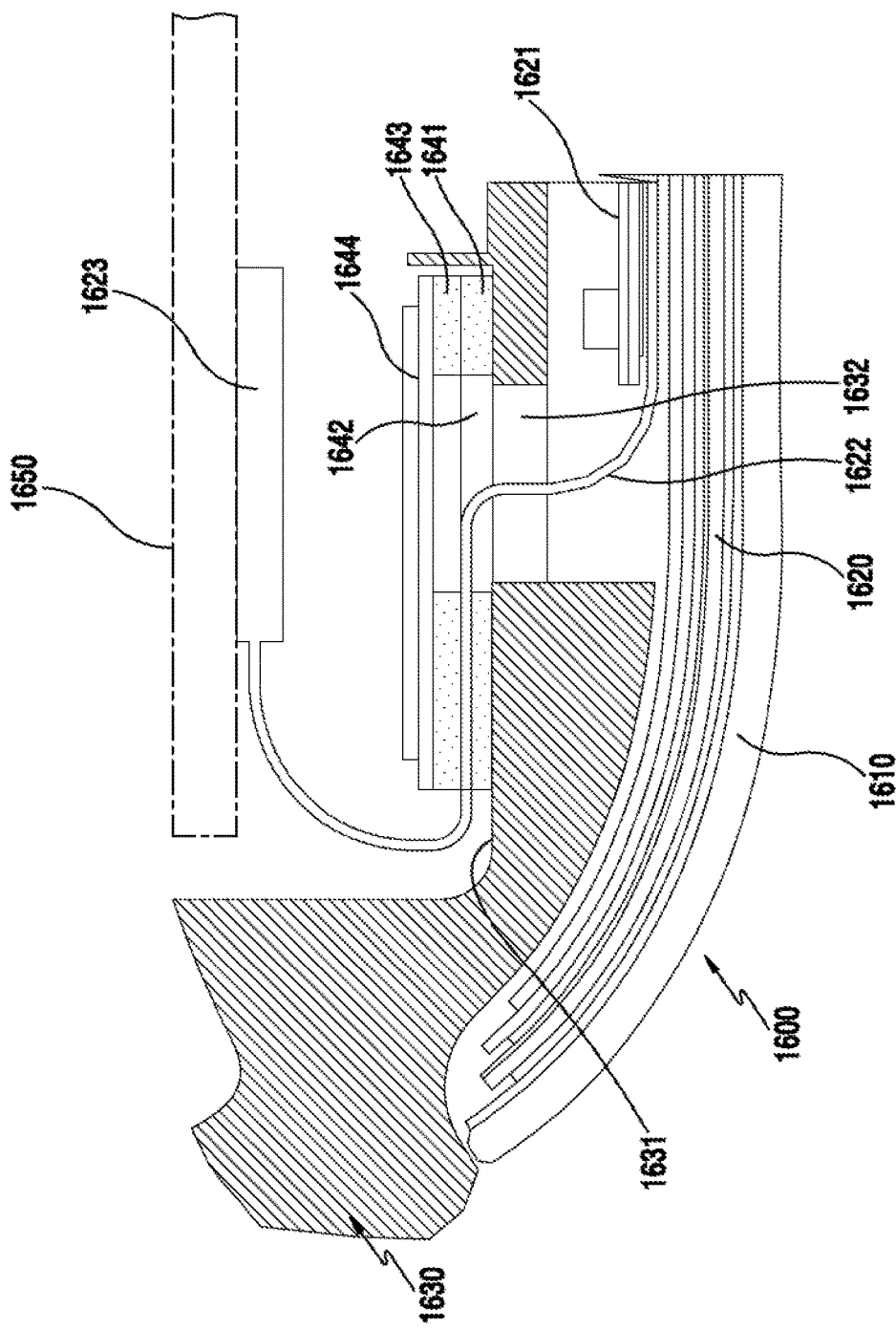

FIGS. 16A, 16B, and 16C are views illustrating a waterproof structure for an electric connection member of a display module according to various embodiments of the present disclosure.

A housing 1630 of FIG. 16A may be an embodiment of a housing that is similar to, or different from, the housing 1310 of FIG. 13A.

Referring to FIG. 16A, a display 1600 may be attached to the housing 1630. According to an embodiment, the display 1600 may be attached to the front face of the housing 1630. According to an embodiment, a PCB 1650 (see FIG. 16C) of the electronic device may be arranged on the rear face 1631 of the housing 1630. According to an embodiment, the display 1600 may be electrically connected to the PCB 1650.

According to various embodiments of the present disclosure, the display 1600 may include a window 1610 and a display module 1620 arranged on the rear face of the window 1610. According to an embodiment, the display module 1620 may include a first electric connection member 1621 (e.g., a FPCB) and a second electric connection member 1622 (e.g., an FPCB). According to an embodiment, the first electric connection member 1621 may be arranged to extend from one end of the display module 1620 and to be bent to the rear face of the display module 1620. According to an embodiment, the second electric connection member 1622 may be drawn out from the first electric connection member 1621 to be electrically connected to the PCB 1650 arranged on the rear face 1631 of the housing 1630. According to an embodiment, the second electric connection member 1622 may include a connector 1623 at one end thereof to be electrically connected to the PCB 1650.

According to various embodiments of the present disclosure, a member through-hole 1632 may be formed in the housing 1630 to extend from the rear face to the front face of the housing 1630. According to an embodiment, the second electric connection member 1622 extends through the member through-hole 1632, and may be electrically connected to the PCB 1650 via the connector 1623. In such a case, a waterproof structure may be applied to the member through-hole 1632 of the housing 1630.

Referring to FIGS. 16B and 16C, a first seal member 1641 may be arranged around the member through-hole 1632 of the housing 1630. According to an embodiment, the first seal member 1641 may include a member through-hole 1642, and the second electric connection member 1622 penetrated through the member through-hole 1632 of the housing 1630 may also be penetrated through the member through-hole 1642 of the first seal member 1641 to be drawn out to the rear face 1631 of the housing 1630. According to an embodiment, the second seal member 1643 may be arranged on the upper portion of the second electric connection member 1622 penetrated through the member through-hole 1632 of the housing 1630 and the member through-hole 1642 of the second seal member 1641. According to an embodiment, the second seal member 1643 may be formed in the same shape as the first seal member 1641, and may be arranged in a manner of overlapping with the first seal member 1641. Without being limited thereto, however, the second seal member 1643 may be formed in various shapes including a region that overlaps with the region of the first seal member 1641. According to an embodiment, the first seal member 1641 and the second seal member 1643 may include at least one of tape, adhesive, waterproof dispensing, silicon, waterproof rubber, and urethane.

According to various embodiments of the present disclosure, a finish member 1644 may be arranged on the upper portion of the second seal member 1643. According to an embodiment, the finish member 1644 may be formed in the same shape as the second seal member 1643, and may be formed in various shapes including the region of the second seal member 1643. According to an embodiment, the finish member 1644 may include a metal, a synthetic resin, or a PCB. According to an embodiment, the finish member 1644 may be arranged in the manner of pressing the first seal member 1641 and the second seal member 1643, which overlap with each other, from the upper side thereof. This is to prevent water from being infiltrated through the second electric connection member 1622 interposed between the first seal member 1641 and the second seal member 1643. According to an embodiment, at least one screw through-hole 1645 may be formed on at least one side of the finish member 1644. A screw accommodated through the screw through-hole 1645 may be fastened to a screw fastening hole 1633 formed in the vicinity of the member through-hole 1632 of the housing 1630 so that the finish member 1645 may be fixed to the housing 1630. Without being limited thereto, however, the finish member 1645 may be fixed by the housing 1630 and a snap-fit structure formed by itself without a separate fastening means.

According to various embodiments of the present disclosure, the second electric connection member 1622 of the display module 1620 arranged on the front face of the housing 1630 may be penetrated through the member through-hole 1632 of the housing 1630 and the member through-hole 1642 of the first seal member 1641 to be electrically connected to the PCB 1650 arranged on the rear face 1631 of the housing 1630, and the infiltration of water, which may flow into the inside of the electronic device, through the member through-hole 1632 of the housing 1630 may be prevented by a waterproof structure using the first seal member 1641, the second seal member 1643, and the finish member 1644.

Figure 17A:
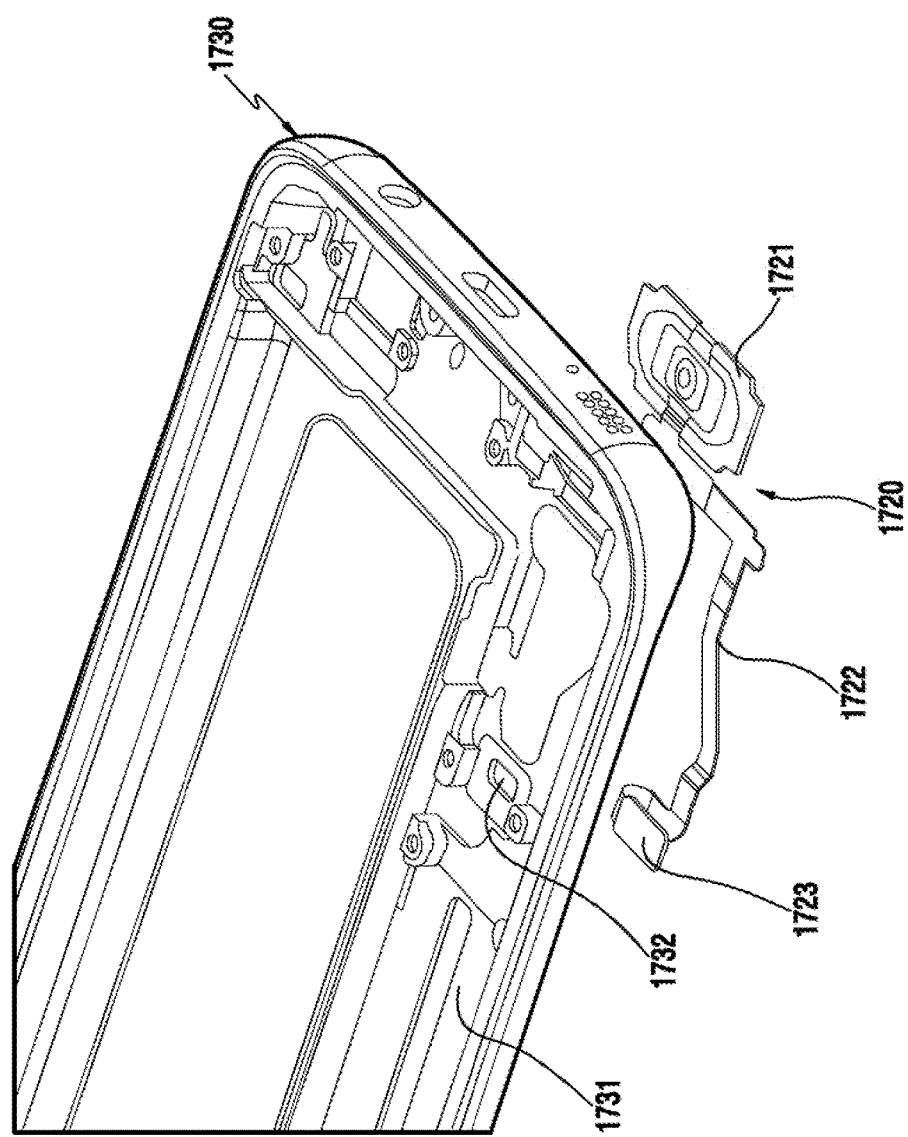
FIGS. 17A, 17B, and 17C are views illustrating a waterproof structure for an electric connection member of a key input device according to various embodiments of the present disclosure.
Figure 17B:
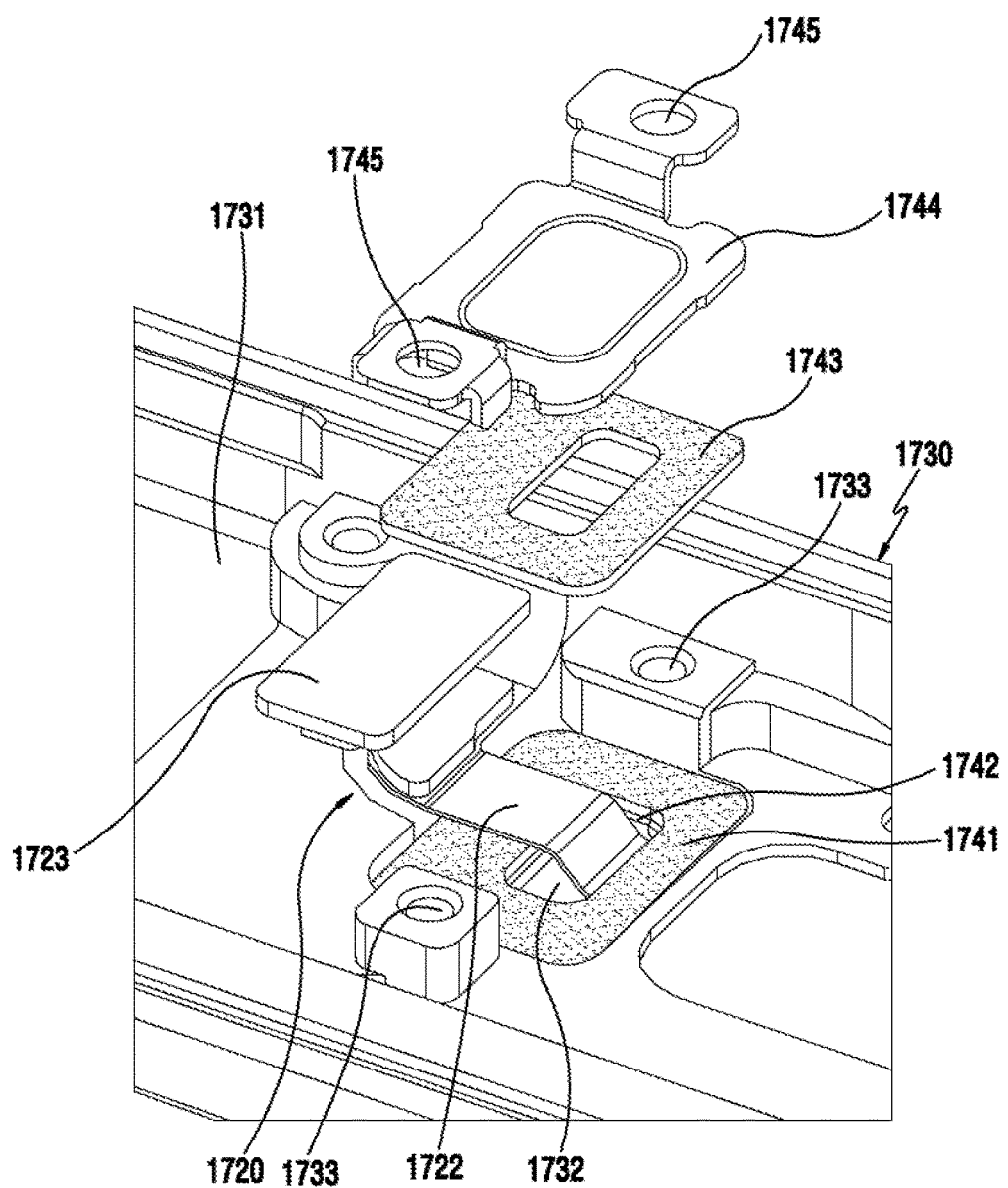
Figure 17C:
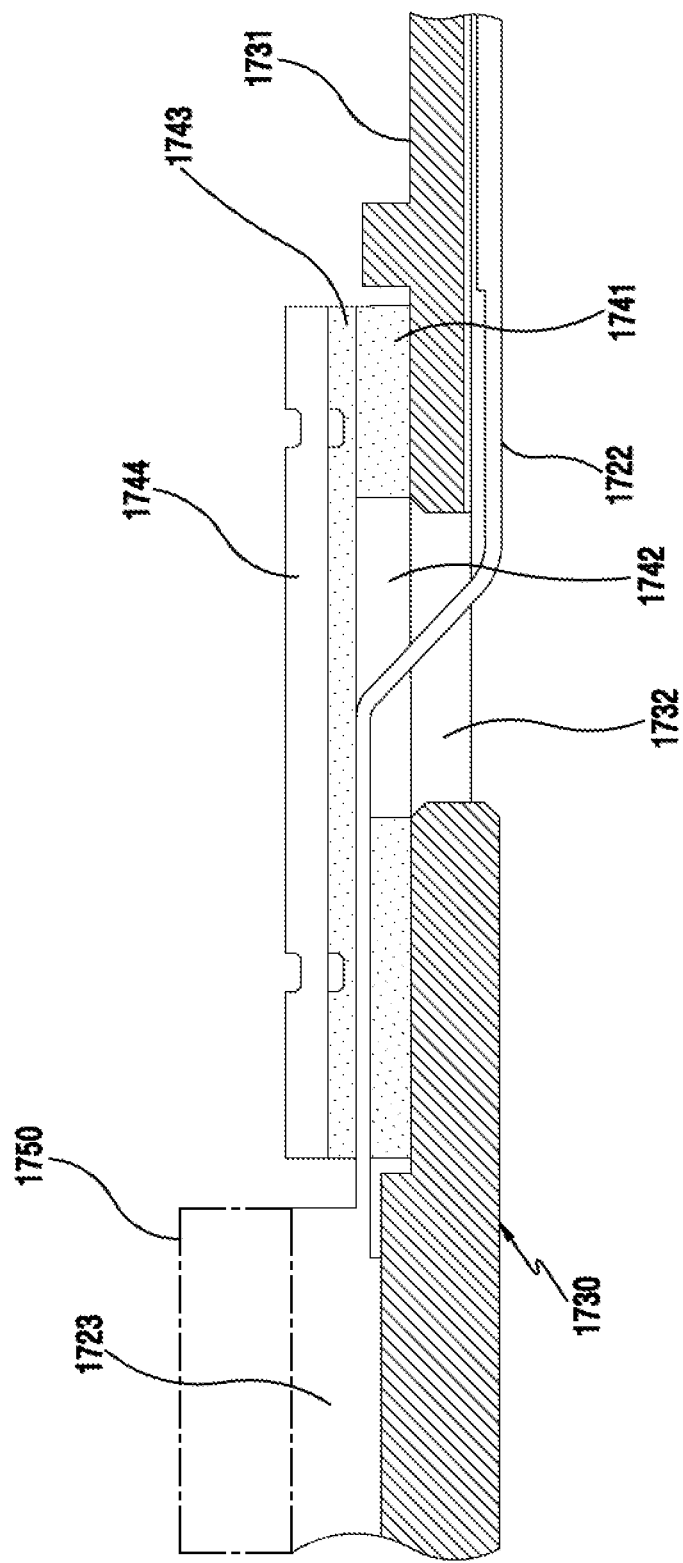

FIGS. 17A, 17B, and 17C are views illustrating a waterproof structure for an electric connection member of a key input device according to various embodiments of the present disclosure.

A housing 1730 of FIG. 17A may be an embodiment of a housing that is similar to, or different from, the housing 1310 of FIG. 13A and/or the housing 1630 shown in FIG. 16A.

Referring to FIG. 17A, an electronic device may be provided with at least one key input device 1720 (e.g., a home button assembly). According to an embodiment, the key input device 1720 may include a key button 1721 arranged on the front face of the electronic device, an electric connection member 1722 drawn out from the key button 1721 by a predetermined length, and a connector 1723 provided at an end of the electric connection member 1722 to be electrically connected to the PCB 1750 (see FIG. 17C) disposed inside the electronic device. According to an embodiment, the key button 1721 may be arranged to be exposed on the front face of the electronic device (e.g., the front direction of the housing), and may be electrically connected to the PCB 1750 arranged on the rear face 1731 of the housing 1730.

According to various embodiments of the present disclosure, a member through-hole 1732 may be formed in the housing 1730 to extend from the rear face to the front face of the housing 1730. According to an embodiment, the electric connection member 1722 extends through the member through-hole 1732, and may be electrically connected to the PCB 1750 via the connector 1723. In such a case, a waterproof structure may be applied to the member through-hole 1732 of the housing 1730.

Referring to FIGS. 17B and 17C, a first seal member 1741 may be arranged around the member through-hole 1732 of the housing 1730. According to an embodiment, the first seal member 1741 may include a member through-hole 1742, and the electric connection member 1722 penetrated through the member through-hole 1732 of the housing 1730 may also be penetrated through the member through-hole 1742 of the first seal member 1741 to be drawn out to the rear face 1731 of the housing 1730. According to an embodiment, the second seal member 1743 may be arranged on the upper portion of the electric connection member 1722 penetrated through the member through-hole 1732 of the housing 1730 and the member through-hole 1742 of the second seal member 1741. According to an embodiment, the second seal member 1743 may be formed in the same shape as the first seal member 1741, and may be arranged in a manner of overlapping with the first seal member 1741. Without being limited thereto, however, the second seal member 1743 may be formed in various shapes including a region that overlaps with the region of the first seal member 1741. According to an embodiment, the first seal member 1741 and the second seal member 1743 may include at least one of tape, adhesive, waterproof dispensing, silicon, waterproof rubber, and urethane.

According to various embodiments of the present disclosure, a finish member 1744 may be arranged on the upper portion of the second seal member 1743. According to an embodiment, the finish member 1744 may be formed in the same shape as the second seal member 1743, and may be formed in various shapes including the region of the second seal member 1743. According to an embodiment, the finish member 1744 may include a metal, a synthetic resin, or a PCB. According to an embodiment, the finish member 1744 may be arranged in the manner of pressing the first seal member 1741 and the second seal member 1743, which overlap with each other, from the upper side thereof. This is to prevent water from being infiltrated through the second electric connection member 1722 interposed between the first seal member 1741 and the second seal member 1743. According to an embodiment, at least one screw through-hole 1745 may be formed at least one side of the finish member 1744. A screw accommodated through the screw through-hole 1745 may be fastened to a screw fastening hole 1733 formed in the vicinity of the member through-hole 1732 of the housing 1730 so that the finish member 1745 may be fixed to the housing 1730. Without being limited thereto, however, the finish member 1745 may be fixed by the housing 1730 and a snap-fit structure formed by itself without a separate fastening means.

According to various embodiments of the present disclosure, the electric connection member 1722 arranged on the front face of the housing 1730 may be penetrated through the member through-hole 1732 of the housing 1730 and the member through-hole 1742 of the first seal member 1741 to be electrically connected to the PCB 1750 arranged on the rear face 1731 of the housing 1730, and the infiltration of water, which may flow into the inside of the electronic device, through the member through-hole 1732 of the housing 1730 may be prevented by a waterproof structure using the first seal member 1741, the second seal member 1743, and the finish member 1744.

Figure 18A:
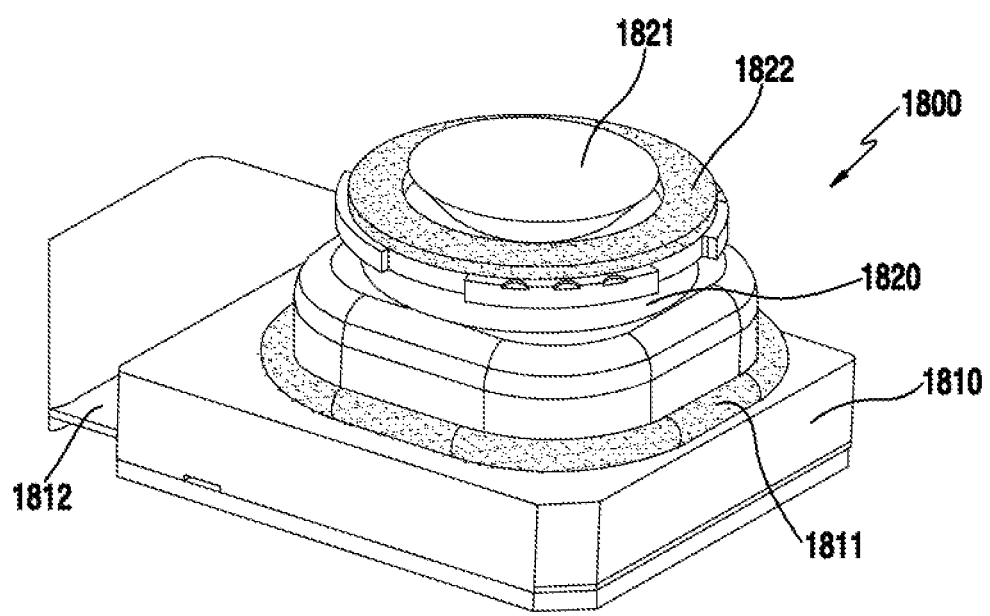
FIGS. 18A and 18B are views illustrating a waterproof structure applied to a camera module according to various embodiments of the present disclosure.
Figure 18B:
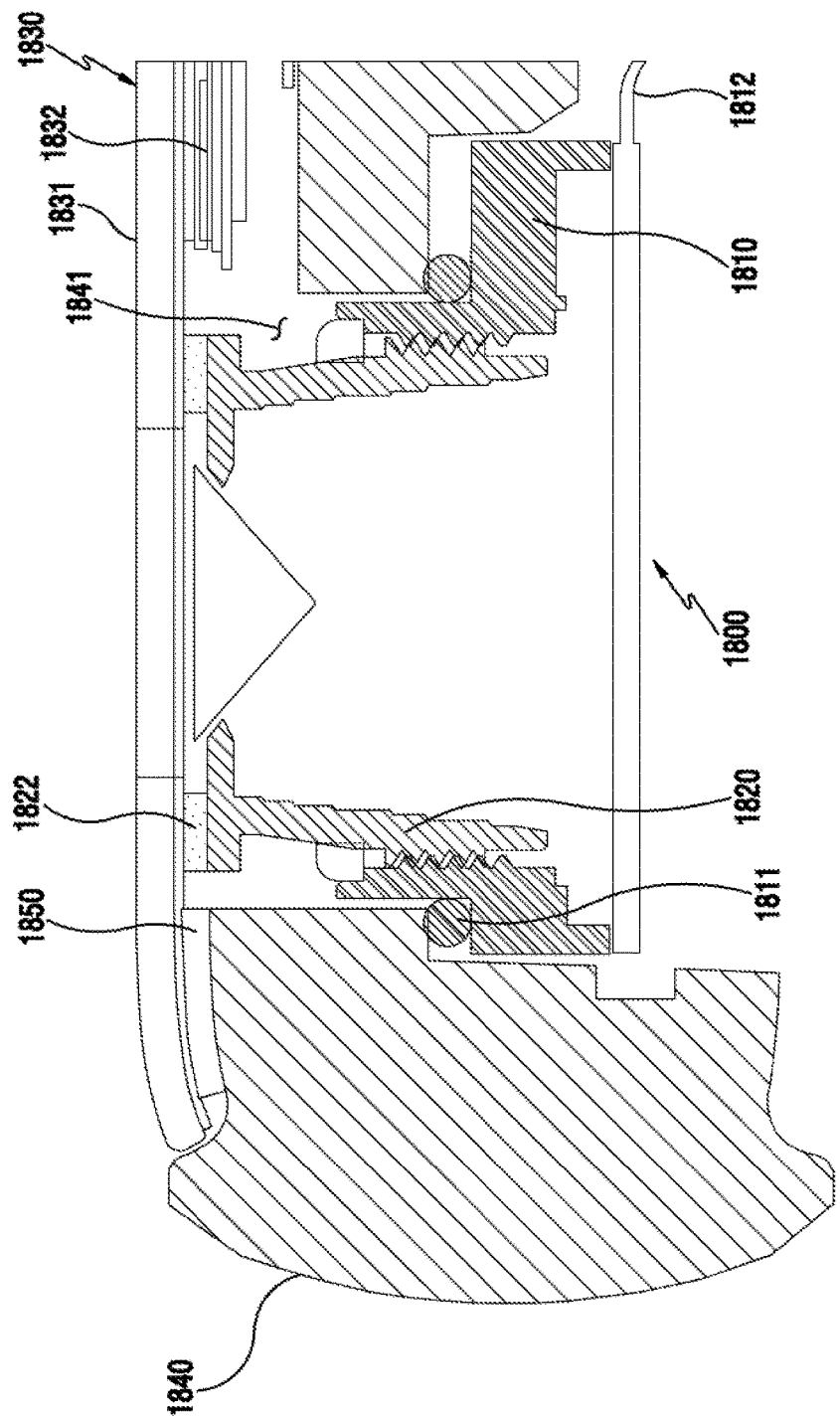

FIGS. 18A and 18B are views illustrating a waterproof structure applied to a camera module according to various embodiments of the present disclosure.

A housing 1840 of FIG. 18B may be an embodiment of a housing that is similar to, or different from, the housing 1310 shown in FIG. 13A.

Referring to FIGS. 18A and 18B, a camera module 1800 may be arranged in a manner of being partially penetrated through the camera through-hole 1841 of the housing 1840, and the top face of the camera module 1800 may be fixed in the manner of being in contact with the rear face of the window 1831 of the electronic device.

According to various embodiments of the present disclosure, the camera module 1800 may include a base 1810, a barrel 1820 arranged in the upper portion of the base 1810 and configured to accommodate a plurality of lenses 1821, and an electric connection member 1812 arranged on the bottom face of the base 1810 and electrically connected to a PCB (not illustrated) arranged on the rear face of the housing 1840. According to an embodiment, a first seal member 1811 may be arranged on an upper face of the base 1810, and a second seal member 1822 may be arranged on an upper face of the barrel 1820. According to an embodiment, the first seal member 1811 and the second seal member 1822 may include at least one of tape, adhesive, waterproof dispensing, silicon, waterproof rubber, and urethane.

According to various embodiments of the present disclosure, in the case where the camera module 1800 is mounted through the camera through-hole 1841 of the housing 1840, the base 1810 may be arranged in a manner of being engaged with the housing 1840. In such a case, a waterproof structure may be primarily implemented in a manner in which the first seal member 1811 is in contact with the housing 1840. At the same time, according to an embodiment, the second seal member 1822 arranged on the top face of the barrel 1820 may secondarily implement a waterproof structure by being arranged in the manner of being in close contact with the rear face of the window 1831 on which the display module 1832 of the display 1830 is not arranged.

According to various embodiments of the present disclosure, the first seal member 1811 and the second seal member 1822 may prevent the infiltration of water, which flows into the rear face of the housing 1840 through the camera through-hole 1841. At the same time, the first seal member 1811 and the second seal member 1822 may expose the camera module 1800 to the front face of the housing 1840, and may electrically connect the camera module 1800 to the PCB arranged on the rear face of the housing 1840.

Figure 19A:
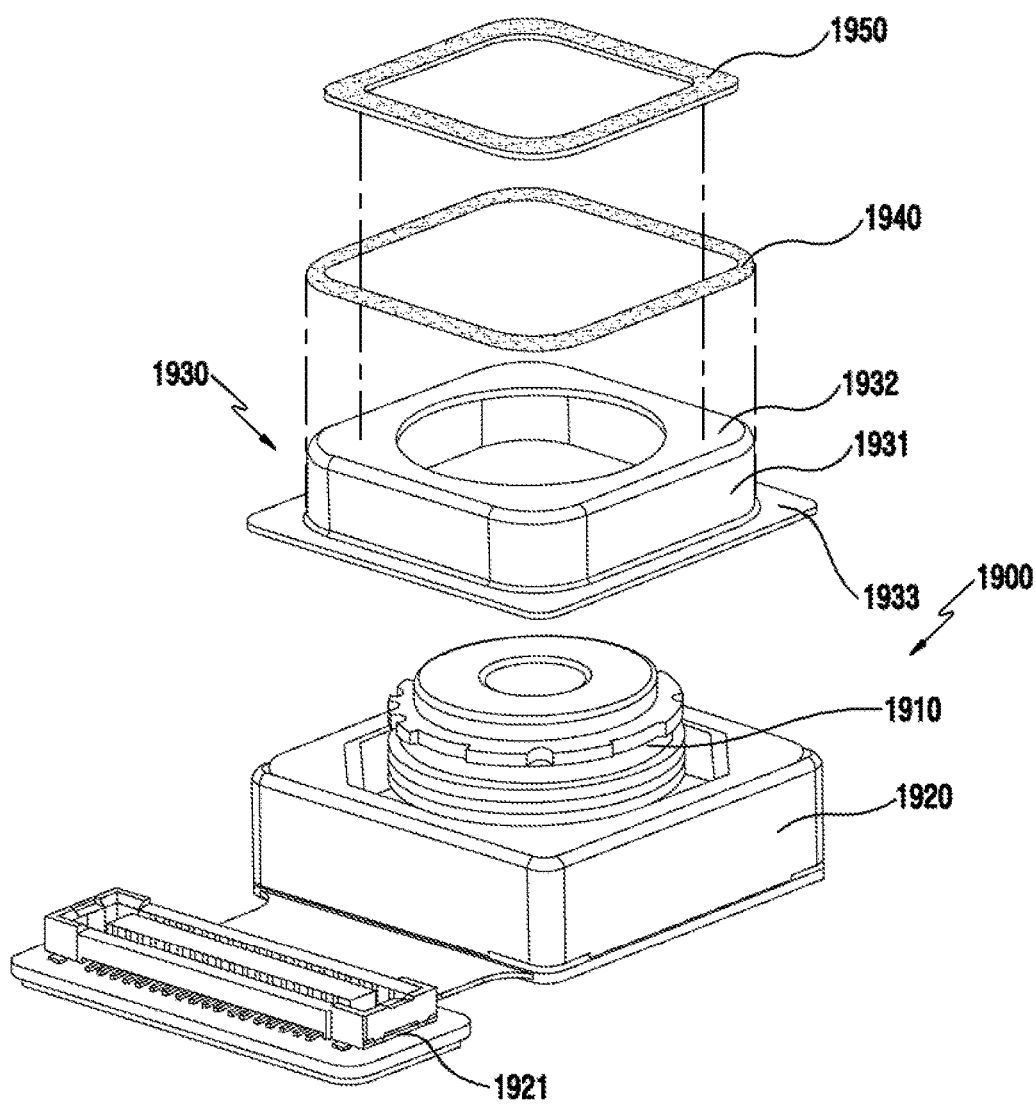
FIGS. 19A and 19B are views illustrating a waterproof structure applied to a camera assembly according to various embodiments of the present disclosure.
Figure 19B:
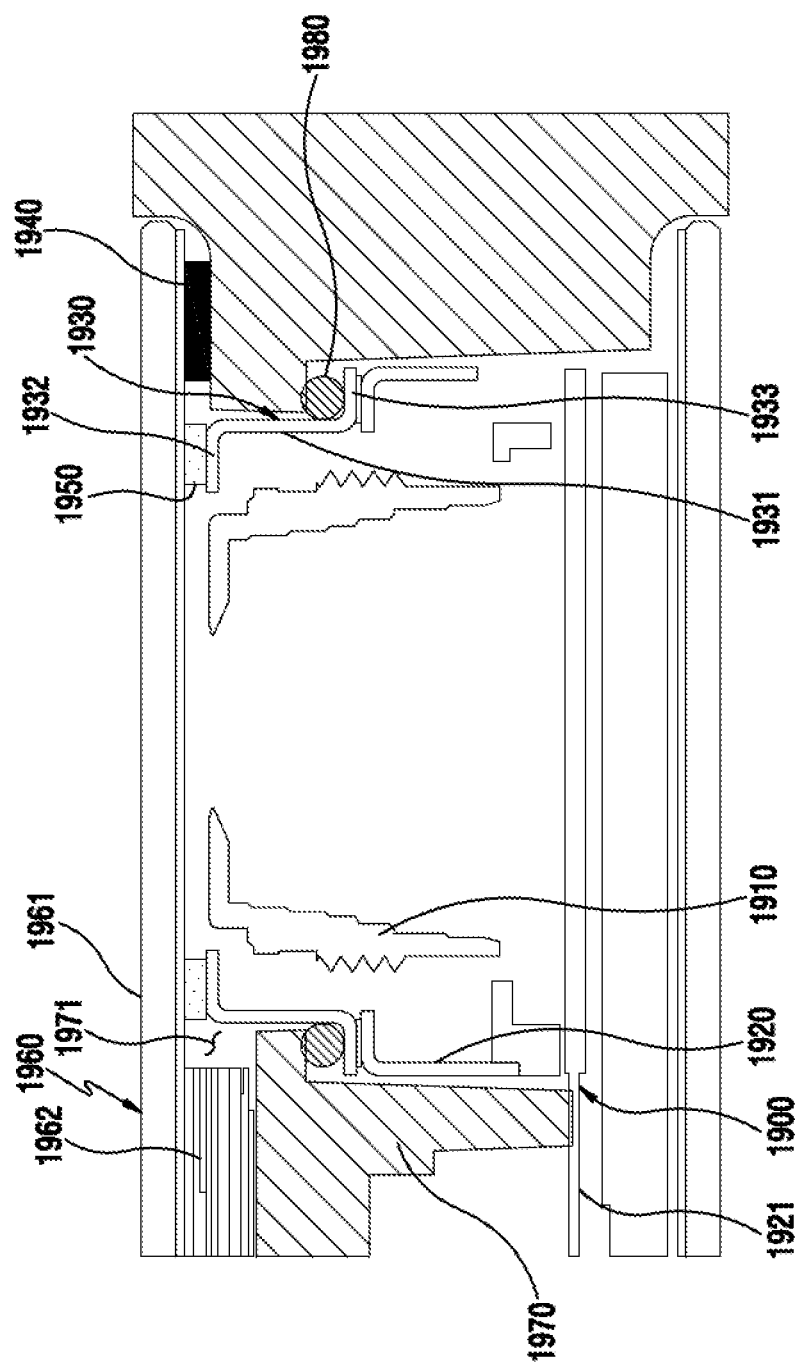

FIGS. 19A and 19B are views illustrating a waterproof structure applied to a camera assembly according to various embodiments of the present disclosure.

A housing 1970 shown in FIG. 19B may be an embodiment of a housing that is similar to, or different from, the housing 1310 shown in FIG. 13A.

Referring to FIGS. 19A and 19B, a camera assembly 1900 may be arranged in a manner of being partially penetrated through the camera through-hole 1971 of the housing 1970, and the top face of the camera assembly 1900 may be fixed in the manner of being in contact with the rear face of the window 1961 of the electronic device.

According to various embodiments of the present disclosure, the camera assembly 1900 may include a camera module 1910 that is movably arranged inside a camera housing 1930. According to an embodiment, the camera assembly 1900 may adjust focus by being moved within the camera housing 1930. According to an embodiment, the camera housing 1930 may include a lower camera housing 1920 including a space configured to accommodate the camera module 1910, and an upper camera housing 1931 coupled to the lower camera housing 1920. According to an embodiment, the lower camera housing 1920 may include an electric connection member 1921 drawn out from the camera module 1910 and configured to be electrically connected to a PCB (not illustrated) of the electronic device. According to an embodiment, a flange 1933 may be formed on the bottom of the upper camera housing 1931 to extend along a rim, and a first seal member 1940 may be arranged on the flange 1933. According to an embodiment, a second seal member 1950 may be arranged on the top face of the camera housing 1931. According to an embodiment, the first seal member 1940 and the second seal member 1950 may include at least one of tape, adhesive, waterproof dispensing, silicon, waterproof rubber, and urethane.

According to various embodiments, in the case where the camera assembly 1900 is mounted through the camera through-hole 1971 of the housing 1970, the flange 1933 of the upper camera housing 1931 may be arranged in a manner of being engaged with the housing 1970. In such a case, a waterproof structure may be primarily implemented in a manner in which the first seal member 1940 is in contact with the housing 1970. At the same time, according to an embodiment, the second seal member 1950 arranged on the top face 1932 of the upper camera housing 1931 may secondarily implement a waterproof structure by being arranged in the manner of being in close contact with the rear face of the window 1961, on which the display module 1962 of the display 1960 is not arranged. In addition, a gasket, structure or sealing member 1980 can be positioned between the flange 1933 of the upper camera housing 1931 and the housing 1970, as illustrated in FIG. 19B.

According to various embodiments of the present disclosure, the first seal member 1940 and the second seal member 1950 may prevent the infiltration of water, which flows into the rear face of the housing 1970 through the camera through-hole 1971. At the same time, the first seal member 1940 and the second seal member 1950 may expose the camera module 1910 to the front face of the housing 1970, and may electrically connect the camera module 1910 to the PCB arranged on the rear face of the housing 1970.

Figure 20:
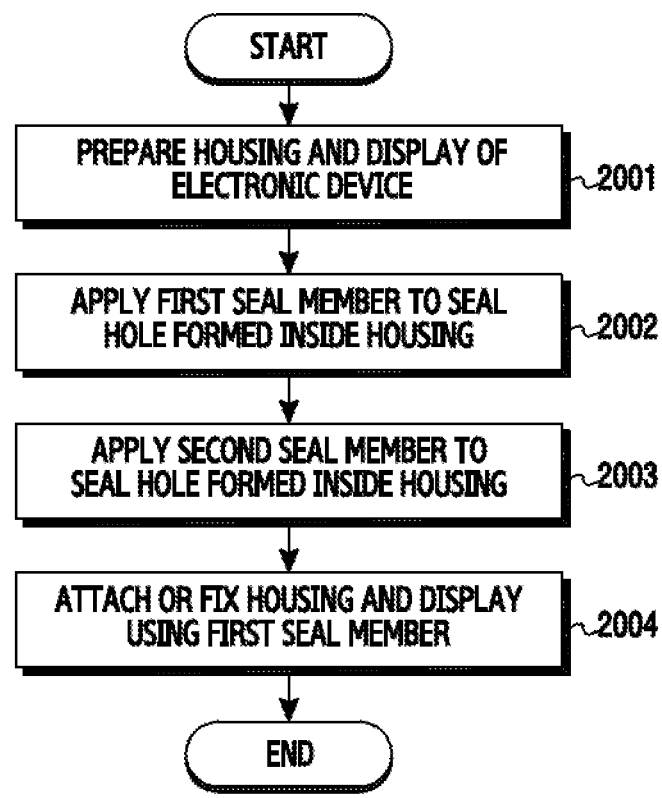
FIG. 20 is a flowchart illustrating a process in which at least one seal member is disposed in an electronic device according to various embodiments of the present disclosure.

FIG. 20 is a flowchart illustrating a process in which at least one seal member is disposed in an electronic device according to various embodiments of the present disclosure.

Referring to FIG. 20, in operation 2001, a housing of an electronic device and a display applied to the housing may be prepared. According to an embodiment, the housing may, but not exclusively, form a single component. According to an embodiment, the housing may be defined as a combination in which an external housing and at least one middle plate (e.g., a bracket) are combined with each other. According to an embodiment, a combination in which a synthetic resin material, a metallic material, and/or a hetero-material are combined with each other may be applied to the housing. According to an embodiment, the display may include a window made of a transparent material and a display module arranged on the rear face of the window. According to an embodiment, the display module may include a touch sensor, and, in such a case, the display may be used as a touch screen.

According to an embodiment, in operation 2002, the first seal member may be applied in order to seal a hole formed inside the housing. According to an embodiment, the first seal member may be attached to a region of the housing in which the display module is arranged. According to an embodiment, the first seal member may include one or more holes formed on the face of a substantially central portion of the housing, which is faced by the display module. According to an embodiment, the holes may include a through-hole for reducing the protrusion amount of a rear camera or a through-hole for battery swell.

According to an embodiment, in operation 2003, an operation of applying the second seal member to seal a hole formed inside the housing may be performed. According to an embodiment, the second seal member may be arranged in a region of the housing, which is directly in contact with the window, other than at least the region of the housing in which the display module is arranged. According to an embodiment, the second seal member may be arranged to seal a plurality of holes formed on a face that is directly in contact with the window of the housing. According to an embodiment, the second seal member may be provided in the form of an elastic material or the like in a region of an electronic module (e.g., a camera), and may be applied in the form of an elastic material to a face of a main component of a battery or the like. According to an embodiment, the holes may include a sensor through-hole or an indicator through-hole. According to an embodiment, the first seal member and the second seal member may include at least one of tape, adhesive, waterproof dispensing, silicon, waterproof rubber, and urethane.

According to an embodiment, in operation 2004, an operation of attaching the housing and the display to each other may be performed by the first seal member.

According to various embodiments, an electronic device formed as illustrated in FIGS. 13A, 13B, 13C, 14A, 14B, 14C, 15A, 15B, 16A, 16B, 16C, 17A, 17B, 17C, 18A, 18B, 19A, and 19B described above may be manufactured by using the manufacturing method of FIG. 20.

Figure 21:
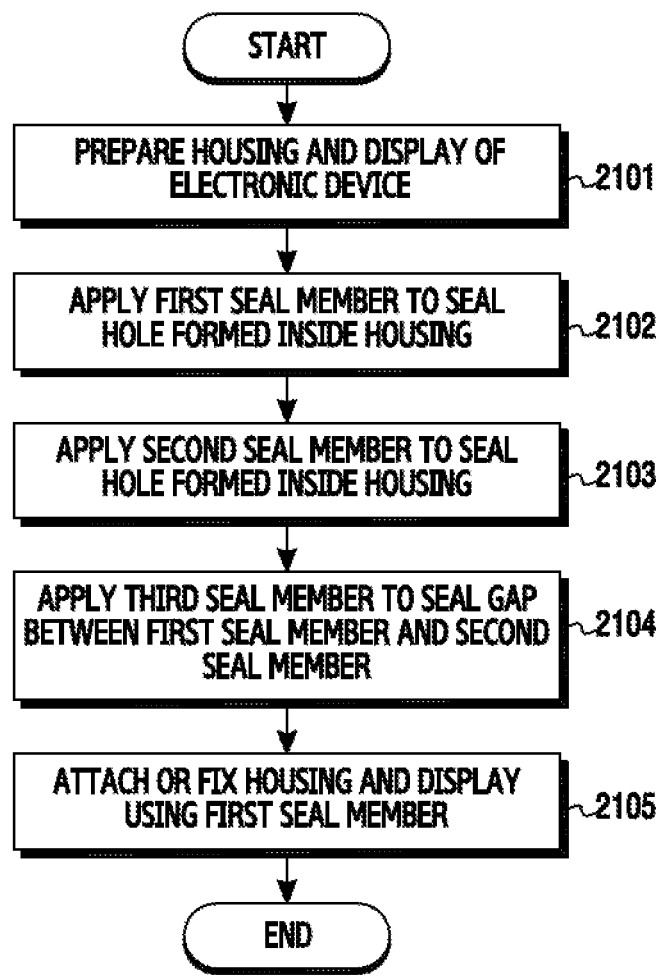
FIG. 21 is a flowchart illustrating a process in which at least one seal member is disposed in an electronic device according to various embodiments of the present disclosure.

FIG. 21 is a flowchart illustrating a process in which at least one seal member is disposed in an electronic device according to various embodiments of the present disclosure.

Referring to FIG. 20, in operation 2101, a housing of an electronic device and a display applied to the housing may be prepared. According to an embodiment, the housing may, but not exclusively, form a single component. According to an embodiment, the housing may be defined as a combination in which an external housing and at least one middle plate (e.g., a bracket) are combined with each other. According to an embodiment, a combination in which a synthetic resin material, a metallic material, and/or a hetero-material are combined with each other may be applied to the housing. According to an embodiment, the display may include a window made of a transparent material and a display module arranged on the rear face of the window. According to an embodiment, the display module may include a touch sensor, and, in such a case, the display may be used as a touch screen.

According to an embodiment, in operation 2102, the first seal member may be applied in order to seal a hole formed inside the housing. According to an embodiment, the first seal member may be attached to a region of the housing in which the display module is arranged. According to an embodiment, the first seal member may include one or more holes formed on the face of a substantially central portion of the housing, which is faced by the display module. According to an embodiment, the holes may include a through-hole for reducing the protrusion amount of a rear camera or a through-hole for battery swell.

According to an embodiment, in operation 2103, an operation of applying the second seal member to seal a hole formed inside the housing may be performed. According to an embodiment, the second seal member may be arranged in a region of the housing, which is directly in contact with the window, other than at least the region of the housing in which the display module is arranged. According to an embodiment, the second seal member may be arranged to seal a plurality of holes formed on a face that is directly in contact with the window of the housing. According to an embodiment, the holes may include a sensor through-hole or an indicator through-hole.

According to an embodiment, in operation 2104, an operation of applying the third seal member to seal a gap between the first seal member and the second seal member may be performed. According to an embodiment, the third seal member may be attached to include at least a region of the housing in which the display module is arranged. According to an embodiment, the third seal member may include one or more holes formed on the face of a substantially rim portion of the housing, which is faced by the display module. According to an embodiment, the holes may include a through-hole 1311 for an electric connection member (e.g., an FPCB) of the display module, a through-hole 1312 or 1313 for an electric connection member (e.g., an FPCB) of the home key module of the electronic device, and a through-hole 1316 for an electric connection member (e.g., an FPCB) of a camera module. According to an embodiment, the first seal member, the second seal member, and the third seal member may include at least one of tape, adhesive, waterproof dispensing, silicon, waterproof rubber, and urethane.

According to an embodiment, in operation 2105, an operation of attaching or fixing the housing and the display to each other may be performed by the first seal member.

According to various embodiments of the present disclosure, an electronic device formed as illustrated in FIGS. 13A, 13B, 13C, 14A, 14B, 14C, 15A, 15B, 16A, 16B, 16C, 17A, 17B, 17C, 18A, 18B, 19A, and 19B described above may be manufactured by using the manufacturing method of FIG. 21.

According to various embodiments of the present disclosure, because, in an electronic device, at least a partial region of a seal member used for waterproof is arranged between a rear face of a display module and a corresponding housing, it is possible to reduce or exclude a BM region of a display, which may allow a wider display screen to be implemented in an electronic device of the same size.

According to various embodiments of the present disclosure, there may be provided an electronic device including: a housing including a first face, a second face that faces in a direction opposite to the first face, and a side surface that at least partially encloses a space between the first face and the second face; a middle plate arranged between the first face and the second face inside the housing to be substantially parallel to the first face, extending from the side surface, and including at least one opening; a printed circuit board arranged between the middle plate and the second face; a display arranged between the middle plate and the first face, and including a face directed toward the second face; and a seal member configured to hermetically seal the opening of the middle plate, and arranged between the face of the display and the middle plate.

According to various embodiments of the present disclosure, the housing may include a glass plate that forms at least a portion of the first face.

According to various embodiments of the present disclosure, there may be provided an electronic device including: a housing including a first face, a second face that faces in a direction opposite to the first face, and a side surface that at least partially encloses a space between the first face and the second face; a middle plate arranged between the first face and the second face inside the housing to be substantially parallel to the first face, extending from the side surface, and including at least one opening; a printed circuit board arranged between the middle plate and the second face; a display arranged between the middle plate and the first face, and including a face directed toward the second face; and a seal member arranged between a peripheral portion of the face of the display and the middle plate, and extending along the peripheral portion of the face of the display when viewed from above the display.

According to various embodiments of the present disclosure, the seal member may be formed in a substantially annular shape.

According to various embodiments of the present disclosure, the housing may include a glass plate that forms at least a portion of the first face.

According to various embodiments of the present disclosure, the face of the display may have a rectangular shape having: a first side having a first length; a second side extending subsequently perpendicular to the first side, and having a second length that is shorter than the first length; a third side extending substantially parallel to the first side, and having a first length; and a fourth side extending substantially parallel to the second side, and having a second length, and the seal member may include a first seal member elongated along at least one of the first side, the second side, and the third side.

According to various embodiments of the present disclosure, the first seal member may extend along the first side, the second side, and the third side.

According to various embodiments of the present disclosure, the seal member may further include a second seal member spaced apart from the first seal member, and elongated along at least one of the fourth side.

According to various embodiments of the present disclosure, the first seal member may be in contact with the face of the display, and the second seal member may be in contact with the glass plate.

According to various embodiments of the present disclosure, the display includes a side face substantially perpendicular to the face, and the electronic device may further include a filler in at least a portion of a gap between the middle plate and the side face of the display and the glass plate.

According to various embodiments of the present disclosure, the middle plate may include at least one through-hole, and the electronic device may further include the filler in at least a portion of the through-hole.

According to various embodiments of the present disclosure, the face of the display may have a rectangular shape having: a first side having a first length; a second side extending subsequently perpendicular to the first side, and having a second length that is shorter than the first length; a third side extending substantially parallel to the first side, and having a first length; and a fourth side extending substantially parallel to the second side, and having a second length, and the gap may include a first gap formed at a side of the second side and a second gap formed at a side of the second side, and the filler may fill at least a portion of at least one of the first gap and the second gap.

According to various embodiments of the present disclosure, there may be provided an electronic device including: a housing including a first face and a second face that is opposite to the first face; a window disposed on the first face of the housing and configured to form a front face of the electronic device; a display module arranged in at least a partial region of a rear face of the window; and at least one first seal member arranged between a rear face of the display module and the first face of the housing.

According to various embodiments of the present disclosure, the first seal member may be arranged to have a closed loop shape along a rim in the rear face of the display module.

According to various embodiment of the present disclosure s, the housing may include a display module arrangement region configured to arrange the rear face of the display module therein and a Black Mask (BM) region configured to directly arrange the window therein.

According to various embodiments of the present disclosure, the first seal member may extend to the BM region on the rear face of the display module to be arranged in a closed loop shape.

According to various embodiments of the present disclosure, at least one second seal member may be arranged in a boundary portion between the display module arrangement region and the BM region.

According to various embodiments of the present disclosure, at least one third seal member may be arranged in the BM region along a rim of the window.

According to various embodiments of the present disclosure, at least one fourth seal member may be arranged in a boundary portion between the display module arrangement region and the BM region.

According to various embodiments of the present disclosure, the fourth seal member may include a semisolid or liquid material that is solidified by a natural or external condition.

According to various embodiments of the present disclosure, the fourth seal member may be arranged in a manner of being introduced into an introduction hole formed in a corresponding position through the second face of the housing after the window and the display module are attached to the first face of the housing by the first and third seal members.

According to various embodiments of the present disclosure, the electronic device may further include at least one member through-hole formed in order to electrically connect an electric connection member of an electronic component, which is arranged through the first face of the housing, to a PCB arranged on the second face of the housing.

According to various embodiments of the present disclosure, the electronic device may further include a fifth seal member arranged on the second face of the housing in a manner of surrounding the member through-hole, a sixth seal member arranged in a manner of being stacked on the top face of the fifth seal member so as to cover the electric connection member which is drawn out through the member through-hole, and a finish member fixed to the second face of the housing above the sixth seal member.

According to various embodiments of the present disclosure, the sixth seal member may be formed to have a size that is at least the same as the fifth seal member.

According to various embodiments of the present disclosure, the finish member may be fixed to press the sixth seal member toward the fifth seal member by being screw-fastened to the second face of the housing or its own snap-fit structure.

According to various embodiments of the present disclosure, the member through-hole may include a through-hole for reducing the protrusion amount of a rear camera, a through-hole for battery swell, a sensor penetration hole, an indicator through-hole, a through-hole for an electric connection member of a key input device, or a through-hole for an electric connection member of a camera module.

According to various embodiments of the present disclosure, the first seal member may include at least one of tape, adhesive, waterproof dispensing, silicon, waterproof rubber, and urethane.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   a housing including:
      a first region,
      a second region, and
      a step boundary area formed between the first region and second region;
   a cover;
   a display panel disposed between the first region and the cover;
   a first seal member disposed between the first region and the display panel;
   a second seal member disposed between the second region and the cover; and
   a third seal member disposed at least a portion of a space which is defined by the display panel, the cover, and the step boundary area,
   wherein the housing further includes a through hole through which a semisolid or liquid material is inserted in at least a portion of the space to form the third seal member, and
   wherein the first region and the second region are positioned at different distances relative to the cover.

2. The electronic device of claim 1, wherein the semisolid or liquid material is solidified by a natural or external condition.

3. The electronic device of claim 1, further comprising: an adhesive interposed between the housing and the display panel.

4. The electronic device of claim 1,
wherein the cover includes a window disposed on the housing,
wherein the window comprises a transparent glass, and
wherein the display panel is arranged in at least a partial region of the window.

5. The electronic device of claim 1, wherein the display panel comprises an electrical connection member electrically connected to a printed circuit board (PCB) disposed in an inner space of the electronic device.

6. The electronic device of claim 1, wherein the third seal member is disposed between the first seal member and the second seal member.

7. An electronic device comprising:
a housing including:
a first region,
a second region, and
a step boundary area formed between the first region and second region;
a display module including a cover and a display panel, the display panel disposed in the first region of the housing;
a first seal member disposed between the first region and the display panel;
a second seal member disposed between the second region and the cover; and
a third seal member disposed at least a portion of a space which is defined by the display module and the step boundary area, the third seal member being in contact with the first seal member and the second seal member, the third seal member forming a seal between the first region and the second region,
wherein the housing further includes a through hole through which a semisolid or liquid material is inserted in at least a portion of the space to form the third seal member, and
wherein the first region and the second region are positioned at different distances relative to the cover.

8. The electronic device of claim 7, further comprising:
an adhesive interposed between the housing and the display panel.

9. The electronic device of claim 7,
wherein the cover includes a window disposed on the housing,
wherein the window comprises a transparent glass, and
wherein the display panel is arranged in at least a partial region of the window.

10. A portable communication device comprising:
a housing including:
a first region,
a second region, and
a step boundary area formed between the first region and the second region;
a cover;
a display panel disposed between the first region and the cover;
a first seal member disposed between the first region and the display panel;
a second seal member disposed between the second region and the cover; and
a third seal member for sealing at least a portion of a space which is defined by the display panel, the cover and the step boundary area, the third seal member being in contact with the first seal member and the second seal member, the third seal member forming a seal between the first region and the second region,
wherein the first region and the second region are positioned at different distances relative to the cover.

11. The portable communication device of claim 10, wherein at least one of the first, second and third seal members comprises at least one of tape, adhesive, waterproof dispensing, silicon, waterproof rubber, and urethane.

12. The portable communication device of claim 10,
wherein the display panel includes a face directed toward the first face, a surface of the display panel comprising:
a first peripheral portion,
a second peripheral portion extending substantially parallel to the first peripheral portion,
a third peripheral portion extending from one end of the first peripheral portion to one end of the second peripheral portion, and
a fourth peripheral portion extending from the other end of the first peripheral portion to the other end of the second peripheral portion, and
wherein the first seal member is elongated along a third peripheral portion and a fourth peripheral portion.

13. The portable communication device of claim 10, wherein the third seal member is filled in at least a portion of the space.

14. The portable communication device of claim 10, wherein the third seal member comprises a semisolid or liquid material that is solidified by a natural or external condition.

15. The portable communication device of claim 10, wherein the housing further includes a through hole through which a semisolid or liquid material is inserted in at least a portion of the space to form the third seal member.

16. The portable communication device of claim 10, wherein the first seal member comprises an adhesive interposed between the housing and the display panel.

17. The portable communication device of claim 10, wherein the second seal member comprises an adhesive interposed between the housing and the cover.

18. The portable communication device of claim 10,
wherein the housing further includes at least one opening, and
wherein the at least a portion of the opening is sealed by the first seal member.

19. The portable communication device of claim 10, wherein the first seal member and/or the second seal member includes at least one of tape, adhesive, waterproof dispensing, silicon, waterproof rubber, and urethane.

20. The portable communication device of claim 12,
wherein the second seal member is spaced apart from the first seal member, and elongated parallel to the first peripheral portion, and
wherein the third seal member disposed between the first seal member and the second seal member.

* * * * *